US011515227B2

(12) United States Patent
Matsumura et al.

(10) Patent No.: US 11,515,227 B2
(45) Date of Patent: Nov. 29, 2022

(54) SEMICONDUCTOR DIE INCLUDING EDGE RING STRUCTURES AND METHODS FOR MAKING THE SAME

(71) Applicant: SANDISK TECHNOLOGIES LLC, Addison, TX (US)

(72) Inventors: Toshiaki Matsumura, Yokkaichi (JP); Nao Nagase, Yokkaichi (JP); Yoshihiko Saito, Yokkaichi (JP); Nobutoshi Sugawara, Yokkaichi (JP); Takahiro Tanamachi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 37 days.

(21) Appl. No.: 17/062,765

(22) Filed: Oct. 5, 2020

(65) Prior Publication Data

US 2021/0313246 A1 Oct. 7, 2021

Related U.S. Application Data

(63) Continuation-in-part of application No. 16/838,283, filed on Apr. 2, 2020, now Pat. No. 11,289,388.

(51) Int. Cl.
*H01L 23/522* (2006.01)
*H01L 23/31* (2006.01)
(Continued)

(52) U.S. Cl.
CPC .......... *H01L 23/3192* (2013.01); *H01L 21/56* (2013.01); *H01L 23/5226* (2013.01);
(Continued)

(58) Field of Classification Search
CPC ........... H01L 27/5226; H01L 27/11556; H01L 27/11565; H01L 27/11582;
(Continued)

(56) References Cited

U.S. PATENT DOCUMENTS 5,915,167 A 6/1999 Leedy
9,142,581 B2 9/2015 Qian et al.
(Continued)

OTHER PUBLICATIONS

USPTO Office Communication, Non-Final Office Action for U.S. Appl. No. 16/838,320, dated Jun. 25, 2021, 17 pages.
(Continued)

*Primary Examiner* — Galina G Yushina
(74) *Attorney, Agent, or Firm* — The Marbury Law Group PLLC

(57) ABSTRACT

Semiconductor devices laterally surrounded by at least one dielectric material portion are formed over a substrate. At least one edge seal ring structure is formed around the semiconductor devices and the at least one dielectric material portion. One or more of the at least one edge seal ring structure has a horizontal cross-sectional profile that includes laterally-extending regions that extend laterally with a uniform width between an inner sidewall and an outer sidewall, and notch regions connecting neighboring pairs of the laterally-extending regions and having a greater width than the uniform width. Cavities in the laterally-extending regions are connected to cavities in the notch regions to allow outgassing from the material of the at least one edge seal ring structure.

4 Claims, 68 Drawing Sheets

(51) Int. Cl.

*H01L 27/11556* (2017.01)
*H01L 27/11582* (2017.01)
*H01L 21/56* (2006.01)
*H01L 27/11565* (2017.01)
*H01L 27/11519* (2017.01)

(52) U.S. Cl.

CPC .. *H01L 27/11519* (2013.01); *H01L 27/11556* (2013.01); *H01L 27/11565* (2013.01); *H01L 27/11582* (2013.01)

(58) Field of Classification Search

CPC ......... H01L 27/11575; H01L 27/11526; H01L 27/11548; H01L 27/115873; H01L 23/3192; H01L 23/5226; H01L 23/564; H01L 23/02; H01L 23/28; H01L 21/56; H01L 2225/06541; H01L 25/04; H01L 25/0657; H01L 25/18; H01L 25/50

See application file for complete search history.

(56) References Cited

U.S. PATENT DOCUMENTS 10,115,681 B1* 10/2018 Ariyoshi ............ H01L 23/5226
10,319,635 B2 6/2019 Nosho et al.
10,381,373 B2 8/2019 Okizumi et al.
10,541,212 B2 1/2020 Bonart
2011/0151667 A1* 6/2011 Hwang ............ H01L 27/11556 257/E21.585
2013/0082314 A1 4/2013 Summerfelt et al.
2014/0264745 A1 9/2014 Yen et al.
2015/0008555 A1* 1/2015 Mizuta ............. H01L 27/14636 257/432
2017/0103995 A1* 4/2017 Hatano ............ H01L 27/11582
2017/0345769 A1 11/2017 Wang et al.
2018/0208461 A1 7/2018 Bretthauer et al.
2018/0342455 A1 11/2018 Nosho et al.
2018/0366487 A1 12/2018 Okizumi et al.
2019/0363079 A1 11/2019 Thei et al.

OTHER PUBLICATIONS

USPTO Office Communication, Non-Final Office Action for U.S. Appl. No. 16/838,283, dated Aug. 5, 2021, 27 pages.

Notification of Transmittal of the International Search Report and the Written Opinion of the International Searching Authority for International Patent Application No. PCTUS2020/067317, dated Mar. 7, 2021, 10 pages.

Endoh, T. et al., "Novel Ultra High Density Memory with a Stacked-Surrounding Gate Transistor (S-SGT) Structured Cell," IEDM Proc., (2001), 33-36.

U.S. Appl. No. 16/251,782, filed Jan. 18, 2019, SanDisk Technologies LLC.

U.S. Appl. No. 16/594,892, filed Oct. 7, 2019, SanDisk Technologies LLC.

U.S. Appl. No. 16/594,959, filed Oct. 7, 2019, SanDisk Technologies LLC.

U.S. Appl. No. 16/666,522, filed Oct. 29, 2019, SanDisk Technologies LLC.

U.S. Appl. No. 16/838,320, filed Apr. 2, 2020, SanDisk Technologies LLC.

* cited by examiner

SEMICONDUCTOR DIE INCLUDING EDGE RING STRUCTURES AND METHODS FOR MAKING THE SAME

RELATED APPLICATIONS

The present application is a continuation-in-part application of U.S. application Ser. No. 16/838,283 filed on Apr. 2, 2020, the entire contents of which is incorporated herein by reference.

FIELD

The present disclosure relates generally to the field of semiconductor devices, and particularly to a semiconductor die including edge ring structures and methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor die is provided, which comprises: semiconductor devices located over a substrate; at least one dielectric material portion that laterally surrounds the semiconductor devices; interconnect-level dielectric material layers that overlie the semiconductor devices and the at least one dielectric material portion and embedding metal interconnect structures; and at least one edge seal ring structure that laterally surrounds the semiconductor devices, the at least one dielectric material portion, the interconnect-level dielectric material layers, and the metal interconnect structures. The metallic material layer comprises an inner vertical sidewall segment that laterally surrounds and laterally encloses the semiconductor devices, and an outer vertical sidewall segment that laterally surrounds and laterally encloses a gap located between the inner and the outer sidewall segments, wherein the gap has an opening in its upper portion.

According to another aspect of the present disclosure, a method of forming a semiconductor die is provided, which comprises: forming semiconductor devices over a substrate; forming at least one dielectric material portion that laterally surrounds the semiconductor devices; and forming at least one edge seal ring structure around the semiconductor devices and the at least one dielectric material portion, wherein one of the at least one edge seal ring structure has a horizontal cross-sectional profile that comprises: laterally-extending regions that extend laterally with a uniform width between an inner sidewall and an outer sidewall; and notch regions connecting neighboring pairs of the laterally-extending regions and having a greater width than the uniform width.

According to an embodiment of the present disclosure, a semiconductor die is provided, which comprises: semiconductor devices located over a substrate; at least one dielectric material portion that laterally surrounds the semiconductor devices; interconnect-level dielectric material layers that overlie the semiconductor devices and the at least one dielectric material portion and embedding metal interconnect structures; and at least one edge seal ring structure continuously extending from a topmost surface of interconnect-level dielectric material layers to a top surface of the substrate. Each of the at least one edge seal ring structure comprises: a composite edge seal via structure including a metallic material layer and a dielectric fill material portion, wherein the metallic material layer includes an inner vertical sidewall segment that laterally surrounds, and laterally encloses, the semiconductor devices, an outer vertical sidewall segment that laterally surrounds, and laterally encloses, the dielectric fill material portion, and a planar bottom segment that connects bottom portions of the inner vertical sidewall segment of the metallic material layer and the outer vertical sidewall segment of the metallic material layer.

According to another embodiment of the present disclosure, a method of forming a semiconductor structure is provided, which comprises: forming semiconductor devices over a substrate; forming at least one dielectric material portion that laterally surrounds the semiconductor devices; forming at least one composite edge seal via structure including a metallic material layer and a dielectric fill material portion through the at least one dielectric material portion, wherein the metallic material layer includes an inner vertical sidewall segment that laterally surrounds, and laterally encloses, the semiconductor devices, an outer vertical sidewall segment that laterally surrounds, and laterally encloses, the dielectric fill material portion, and a planar bottom segment that connects bottom portions of the inner vertical sidewall segment of the metallic material layer and the outer vertical sidewall segment of the metallic material layer.

According to yet another aspect of the present disclosure, a semiconductor die is provided, which comprises: semiconductor devices located over a substrate; at least one dielectric material portion that laterally surrounds the semiconductor devices; interconnect-level dielectric material layers that overlie the semiconductor devices and the at least one dielectric material portion and embedding metal interconnect structures; a silicon nitride passivation layer overlying the metal interconnect structures; and at least one slit ring structure that laterally surrounds the semiconductor devices and the metal interconnect structures, wherein the at least one slit ring structure comprises at least one dielectric material and continuously extends from a top surface of the silicon nitride passivation layer through each of the interconnect-level dielectric material layers and into the at least one dielectric material portion.

According to still another aspect of the present disclosure, a method of forming a semiconductor die is provided, which comprises: forming semiconductor devices over a substrate; forming at least one dielectric material portion that laterally surrounds the semiconductor devices; forming interconnect-level dielectric material layers embedding metal interconnect structures over the semiconductor devices and the at least one dielectric material portion; forming at least one slit ring trench around the semiconductor devices and the metal interconnect structures; forming at least one slit ring structure by depositing at least one dielectric material into the at least one slit ring trench; and forming a silicon nitride passivation layer over the interconnect-level dielectric material layers and the at least one slit ring structure, wherein each of the at least one slit ring structure continuously extends from a top surface of the silicon nitride passivation layer through each of the interconnect-level dielectric material layers and into the at least one dielectric material portion.

DETAILED DESCRIPTION

Figure 1A:
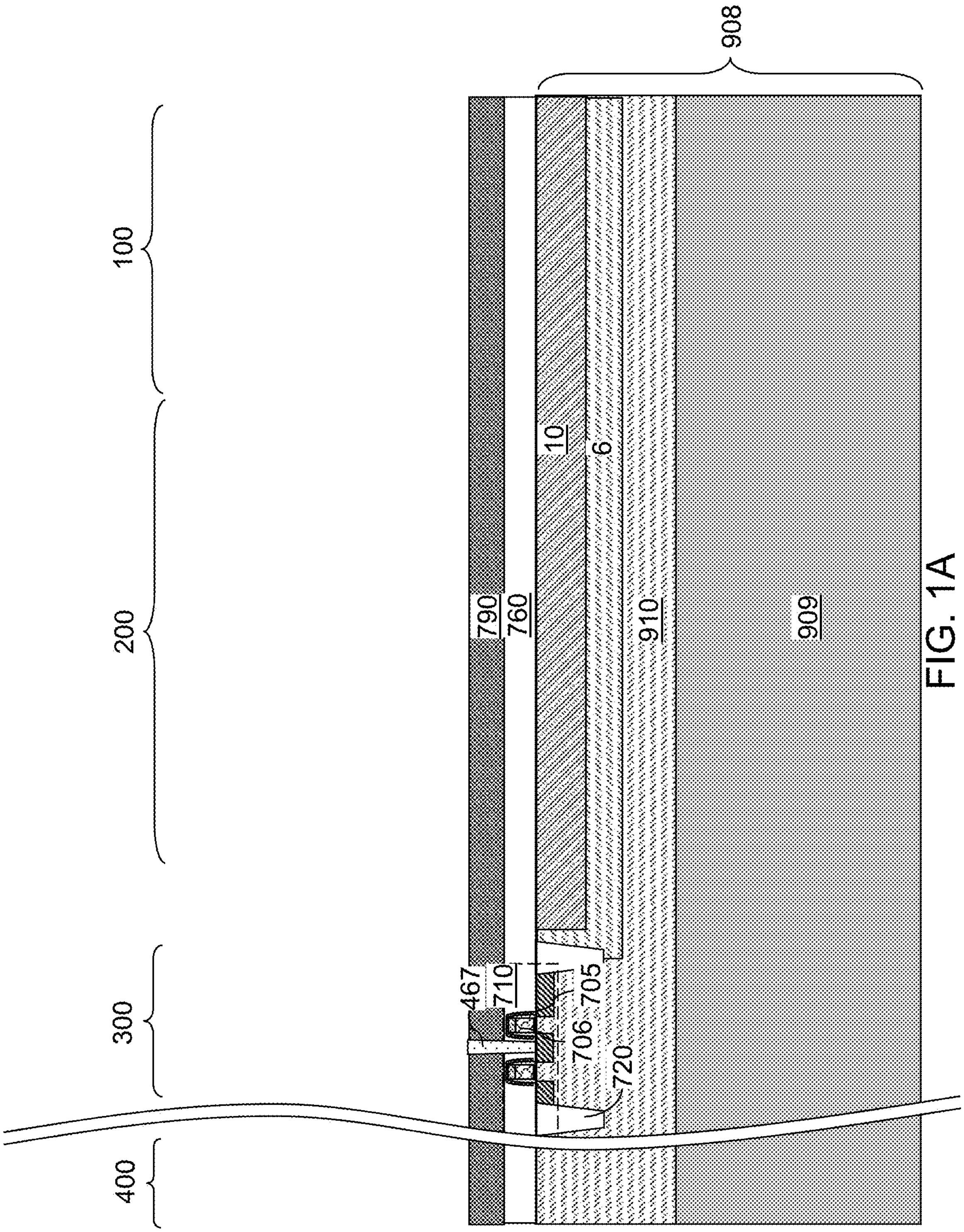
FIG. 1A is a vertical cross-sectional view of a region of an exemplary structure for forming a semiconductor die after formation of various doped semiconductor regions, field effect transistors, a planarization dielectric layer, a silicon nitride diffusion barrier layer, and sacrificial via fill structures according to a first embodiment of the present disclosure.

The present inventors realized that an open top seam within a tungsten wall of an edge seal ring structure can function as a conduit for outgassing fluorine used during chemical vapor deposition of the tungsten wall. This outgassing may cause peeling and delamination of one or more layers of the semiconductor device. Furthermore, moisture may diffuse from outside the semiconductor die into the semiconductor devices through the edge seal ring structure along horizontal boundaries between insulating layers. The moisture may also cause layer delamination and degrade semiconductor device performance. The embodiments of the present disclosure are directed to a semiconductor die including edge ring structures and methods for forming the same, the various aspects of which are described in detail. The various embodiments of the present disclosure can be employed to provide edge seal structures that enhance protection of the semiconductor die from fluorine outgassing and/or ingress of moisture and/or contaminants after manufacture of the semiconductor die and during subsequent handling or usage of the semiconductor die.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
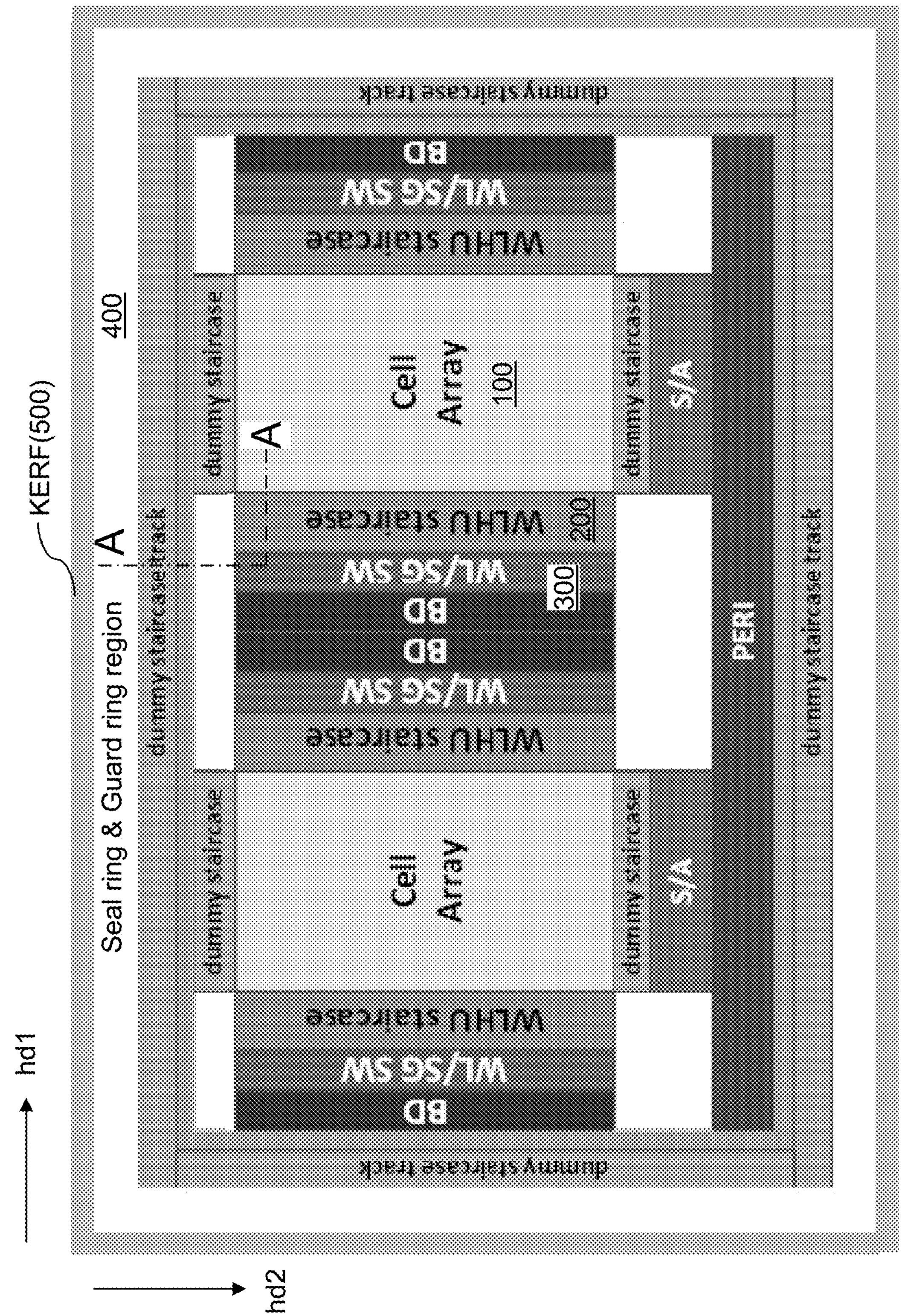
FIG. 1B is a top-down view of a unit die area of the exemplary structure of FIG. 1A.

Referring to FIGS. 1A and 1B, an exemplary structure for forming a semiconductor die is illustrated. FIG. 1B illustrates the layout of various regions within a unit die area of the exemplary structure, and FIG. 1A is a vertical cross-sectional view of the exemplary structure. In one embodiment, the exemplary structure can include a semiconductor substrate 908, which may be provided by forming various doped semiconductor regions (such as doped wells) in an upper portion of a semiconductor wafer (which may be, for example, a single crystal silicon wafer, such as a 300 mm silicon wafer or a 200 mm silicon wafer). For example, the semiconductor substrate 908 can include a substrate semiconductor layer 909, a semiconductor material layer 910, a first doped well 6 that is embedded in the semiconductor material layer 910, and a second doped well 10 that is embedded in the first doped well 6. In an illustrative example, the semiconductor material layer 910 and the second doped well 10 can have p-type doping, and the first doped well 6 can have n-type doping. The substrate semiconductor layer 909 may be a semiconductor substrate (e.g., silicon wafer), a semiconductor material layer (e.g., an epitaxial silicon layer on silicon wafer), or an insulating layer (as in the case of a semiconductor-on-insulator substrate). Additional doped wells may be formed as needed to provide various semiconductor devices thereupon. Each of the doped wells can be p-doped or n-doped, and can have an atomic concentration of electrical dopants in a range from $1.0\times10^{14}/cm^3$ to $1.0\times10^{18}/cm^3$, although lesser and greater atomic concentrations may also be used.

Various semiconductor devices 710 can be formed on the substrate. The various semiconductor devices 710 can include complementary metal-oxide-semiconductor (CMOS) devices, and can include various peripheral circuits (i.e., driver circuits) that can be used to operate a three-dimensional array of memory elements to be subsequently formed on the semiconductor substrate 908 within the cell array regions. As used herein, a "cell array region" refers to a region in which a three-dimensional array of memory elements is formed, such as a memory plane. A cell array region (e.g., a memory plane) is also referred to as a memory array region 100. The semiconductor devices 710 can include field effect transistors that are formed on the top surface of the semiconductor substrate 908.

Generally, the semiconductor devices 710 can include any circuit that can be used to control operation of at least one three-dimensional array of memory elements to be subsequently formed. For example, the semiconductor devices 710 can include peripheral devices that are used to control operation of a three-dimensional array of memory elements to be subsequently formed. The regions in which the peripheral devices are formed are collectively referred to as a peripheral device region 300. The peripheral device region 300 can include various regions configured to provide specific types of peripheral devices. In an illustrative example, sense amplifier circuits can be formed within sense amplifier regions, which are marked as "S/A" in FIG. 1B. Bit line driver circuits can be formed within bit line driver regions, which are marked as "BD" in FIG. 1B. Word line switches and select gate electrode switch can be formed in word line and select gate electrode switch regions, which are marked as "WL/SG SW" in FIG. 1B. Additional miscellaneous peripheral devices can be formed in a miscellaneous peripheral device region, which is marked as "PERI" in FIG. 1B. Each three-dimensional array of memory elements can be subsequently formed employing alternating stacks of insulating layers and electrically conductive layers (e.g., word lines). In this case, the layers within the alternating stacks can be patterned to provide stepped surfaces, and contact via structures contacting a respective one of the electrically conductive layers can be formed in such stepped surfaces. Such regions are referred to as word line hookup staircase regions, and are marked as "WLHU staircase" in FIG. 1B. The word line hookup staircase regions are also referred to as staircase regions 200. Dummy stepped surfaces that are not used to provide electrical contacts to the electrically conductive layers can be formed around each cell array region (i.e., memory array region 100). Regions including such dummy stepped surfaces are herein referred to as dummy staircase regions, and are marked as "dummy staircase" in FIG. 1B. Additional dummy staircase regions can be formed inside a periphery of a die area. The additional dummy staircase regions are herein referred to as "dummy staircase tracks". Seal ring structures and a guard ring structure are subsequently formed at the outer edge of the dummy staircase tracks, which define the outer boundary of a semiconductor chip.

The region in which the seal ring structures and the guard ring structure are subsequently formed is herein referred to as an seal ring and guard ring region, or more simply as an edge seal ring region 400. Kerf areas 500 are provided outside the areas of the seal ring structures. The area within an outer periphery of the seal ring and guard ring region defines the area of a semiconductor die to be subsequently formed. The area of the semiconductor die can have a generally rectangular shape.

The horizontal direction of a first pair of sidewalls of the semiconductor die is herein referred to as a first horizontal direction hd1 (e.g., word line direction), and the horizontal direction of a second pair of sidewalls of the semiconductor die is herein referred to as a second horizontal direction hd2 (e.g., bit line direction), which is perpendicular to the first horizontal direction hd1. The kerf areas can include various test structures and alignment structures that may, or may not, be destroyed during singulation of the semiconductor substrate 908 and semiconductor devices thereupon into a plurality of semiconductor dies. The unit die area includes half of the width of each kerf area.

In one embodiment, the semiconductor devices include field effect transistors. Shallow trench isolation structures 720 embedded in the semiconductor material layer 910 can provide electrical isolation between the semiconductor devices in the peripheral device region 300.

In one embodiment, dielectric material portions can be formed around the field effect transistors to provide a diffusion barrier structure that blocks diffusion of moisture and impurities therethrough. For example, a silicon nitride spacer 705 can laterally surround each gate stack 706 of the field effect transistors, and can vertically extend from a top surface of the semiconductor substrate 908 at least to a horizontal plane including top surface of the gate stacks 706. Generally, at least one silicon nitride spacer 705 can vertically extend between the semiconductor substrate 908 and a top surface of each gate stack 706.

A planarization dielectric layer 760 can be formed over the semiconductor devices 710. For example, the planarization dielectric layer 760 can be formed over gate structures and active regions (such as source regions and drain regions) of the field effect transistors. The planarization dielectric layer 760 can include a planarizable dielectric material such as a silicate glass. The top surface of the planarization dielectric layer 760 can be planarized, for example, by chemical mechanical planarization.

A silicon nitride diffusion barrier layer 790 can be formed over the planarization dielectric layer 760. The silicon nitride diffusion barrier layer 790 can be employed as an etch stop material during etching of an overlying dielectric material portion to be subsequently formed. The silicon nitride diffusion barrier layer 790 can continuously extend around each memory array region 100 along the periphery of each semiconductor die, and can cover the entire area of each kerf region 500. The thickness of the silicon nitride diffusion barrier layer 790 can be in a range from 20 nm to 200 nm, such as from 40 nm to 100 nm, although lesser and greater thicknesses can also be employed.

The combination of the silicon nitride spacers 705 around the gate stacks 706 and the silicon nitride diffusion barrier layer 790 forms a silicon nitride diffusion barrier structure (705, 790). The silicon nitride diffusion barrier layer 790 can overlie the semiconductor substrate 908 and continuously extends around a periphery of each semiconductor die located on the semiconductor substrate 908.

At least one silicon nitride spacer 705 vertically extends between a bottom surface of the silicon nitride diffusion barrier layer 790 and the semiconductor substrate 908. The silicon nitride diffusion barrier structure (705, 790) continuously extends along the periphery of each semiconductor die, and laterally encloses, and surrounds, the entirety of the memory array region 100 within each semiconductor die.

Sacrificial via fill structures 467 can be formed through the silicon nitride diffusion barrier layer 790 and the planarization dielectric layer 760 onto a top surface of a respective element of the semiconductor devices 710. For example, a photoresist layer (not shown) can be applied over the silicon nitride diffusion barrier layer 790, and can be lithographically patterned to form openings over components of the semiconductor devices 710. An anisotropic etch process can be performed to form via cavities through the silicon nitride diffusion barrier layer 790 and the planarization dielectric layer 760 underneath the openings in the photoresist layer.

The via cavities can extend to a top surface of a respective underlying component of the semiconductor devices 710. The photoresist layer may be removed, for example, by ashing, and a sacrificial fill material (such as amorphous silicon, a silicon-germanium alloy, a polymer material, borosilicate glass, or organosilicate glass) can be deposited in the via cavities to form the sacrificial via fill structures 467. Excess portions of the sacrificial fill material can be removed from above the horizontal plane including the top surface of the silicon nitride diffusion barrier layer 790.

Each of the sacrificial via fill structures 467 can contact a component of a respective one of the semiconductor devices 710. For example, a subset of the sacrificial via fill structures 467 can contact a respective gate electrode, and another subset of the sacrificial via fill structures can contact a respective active region (such as a source region or a drain region). Generally, electrically active nodes of the semiconductor devices 710 can be contacted by a respective sacrificial via fill structure 467. Top surfaces of the sacrificial via fill structures 467 can be coplanar with the top surface of the silicon nitride diffusion barrier layer 790.

Figure 2:
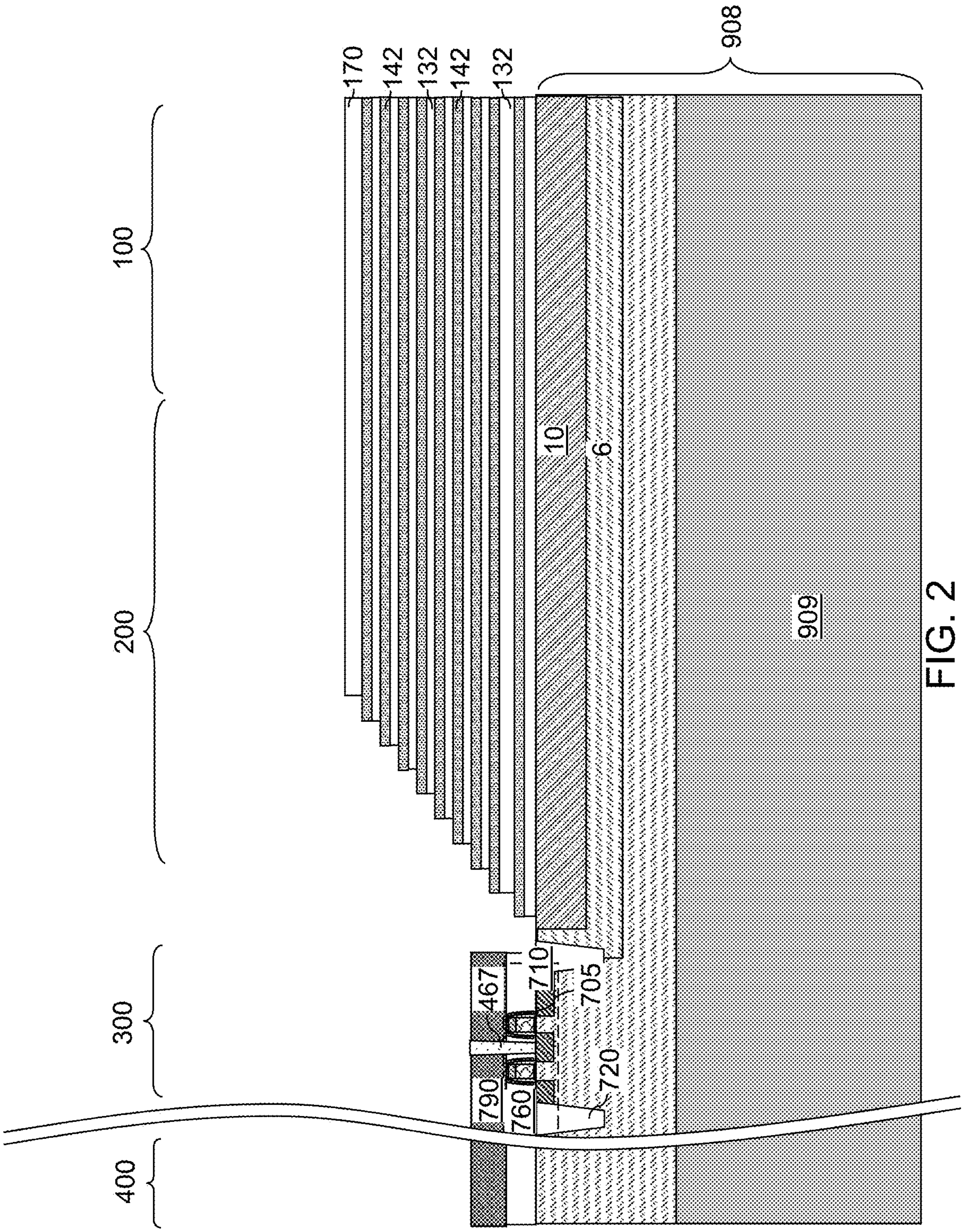
FIG. 2 is a vertical cross-sectional view of a region of the exemplary structure after formation of a first-tier alternating stack of first insulating layers and first spacer material layers and patterning a first-tier staircase region according to a first embodiment of the present disclosure.

Referring to FIG. 2, the silicon nitride diffusion barrier layer 790 and the planarization dielectric layer 760 can be removed from each memory array region 100 and from each staircase region 200. For example, a photoresist layer (not shown) can cover each area including the semiconductor devices 710, and portions of the silicon nitride diffusion barrier layer 790 and the planarization dielectric layer 760 that are not covered by the photoresist layer can be removed by at least one etch process, which may include an isotropic etch process (such as a wet etch process) and/or an anisotropic etch process (such as a reactive ion etch process). A top surface of the semiconductor substrate 908 (such as a top surface of a second doped well 10) can be physically exposed within a memory array region 100 and adjacent staircase regions 200. The silicon nitride diffusion barrier layer 790 and the planarization dielectric layer 760 can remain in the peripheral device region 300, and can be removed from the edge seal ring region 400.

An alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the semiconductor substrate 908. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

The first insulating cap layer 170 and the first-tier alternating stack (132, 142) may be patterned to form first stepped surfaces in the staircase region 200. Each layer of the first-tier alternating stack (132, 142) can be removed from above the silicon nitride diffusion barrier layer 790. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

The first insulating layers 132 and the first sacrificial material layers 142 continuously extend over an entire area of a memory array region 100, and thus, are also referred to as first continuous insulating layers and first continuous sacrificial material layers, respectively. A vertically alternating sequence of the first continuous insulating layers and the first continuous sacrificial material layers can be formed over the semiconductor substrate 908. The first stepped surfaces are formed at peripheral portions of the vertically alternating sequence. Each layer of the vertically alternating sequence is present within the memory array region 100. The lateral extent of the first continuous sacrificial material layers decreases with a vertical distance from the semiconductor substrate 908 in each staircase region 200. In one embodiment, all layers of the vertically alternating sequence are removed from above the silicon nitride diffusion barrier layer 790, and the stepped surfaces of the remaining portions of the vertically alternating sequence do not extend to areas in which the silicon nitride diffusion barrier layer 790 is present.

Figure 3:
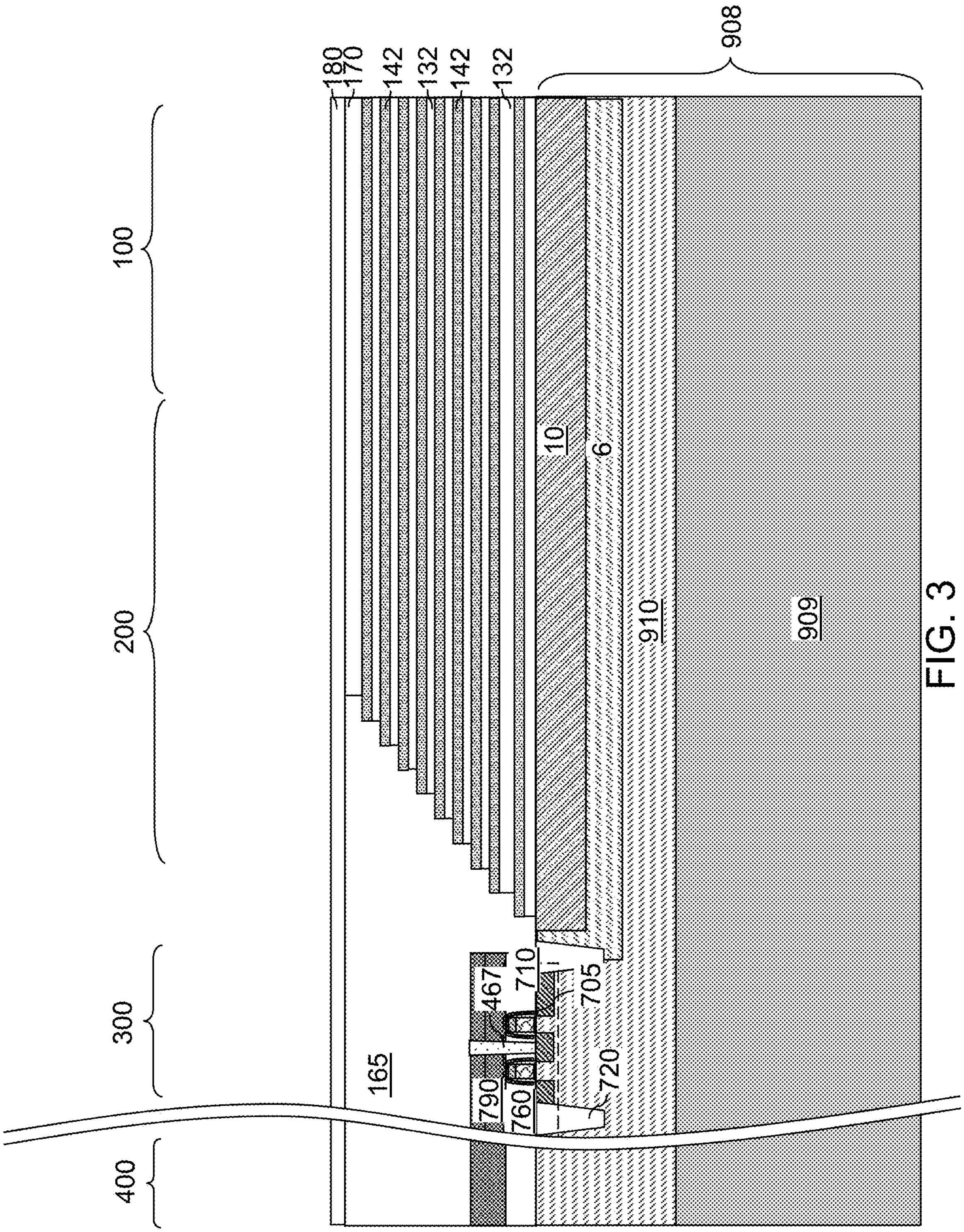
FIG. 3 is a vertical cross-sectional view of a region of the exemplary structure after formation of a first retro-stepped dielectric material portion and an inter-tier dielectric layer according to a first embodiment of the present disclosure.
Figure 4A:
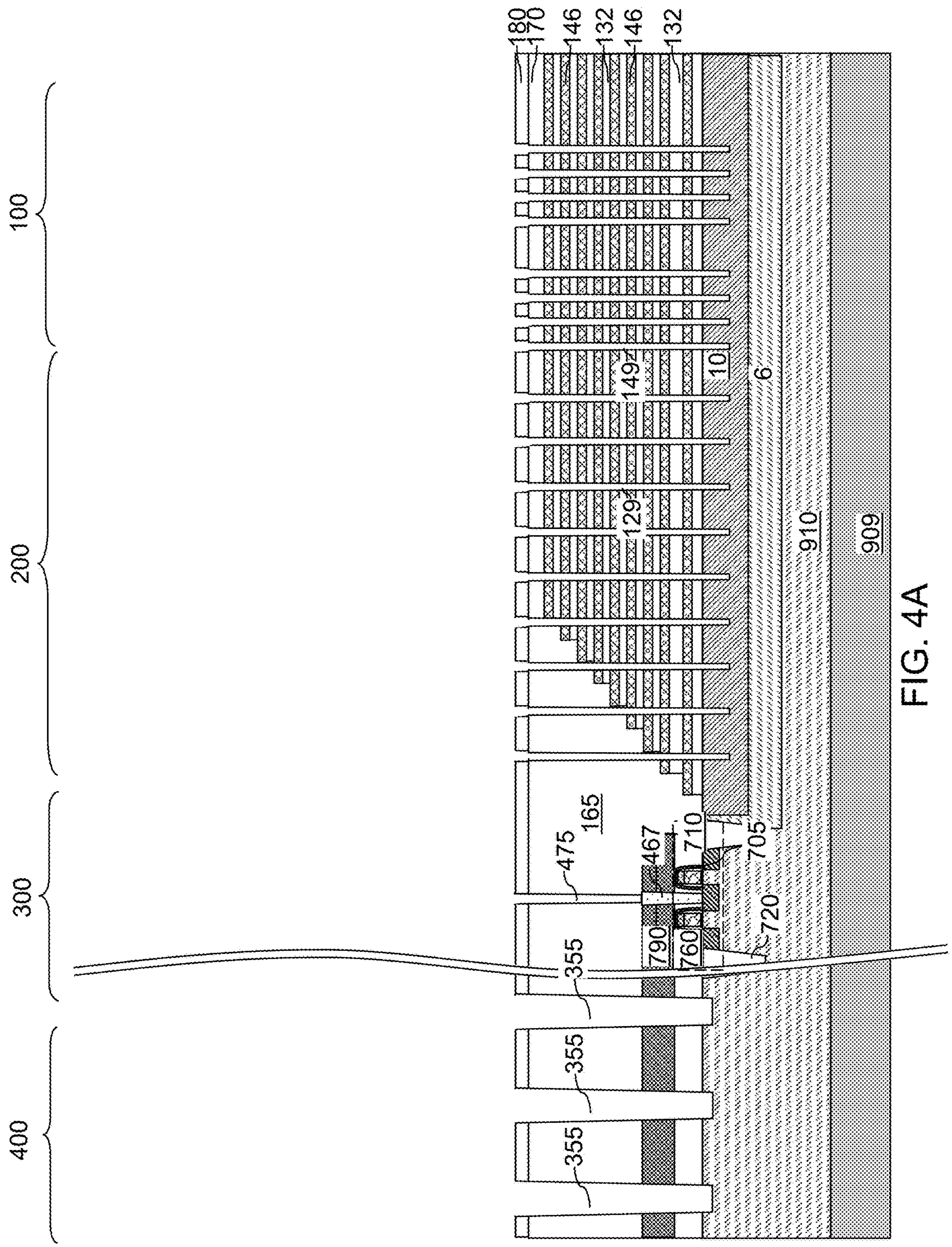
FIG. 4A is a vertical cross-sectional view of a region of the exemplary structure after formation of various first-tier openings and first-tier via cavities according to a first embodiment of the present disclosure.
Figure 4B:
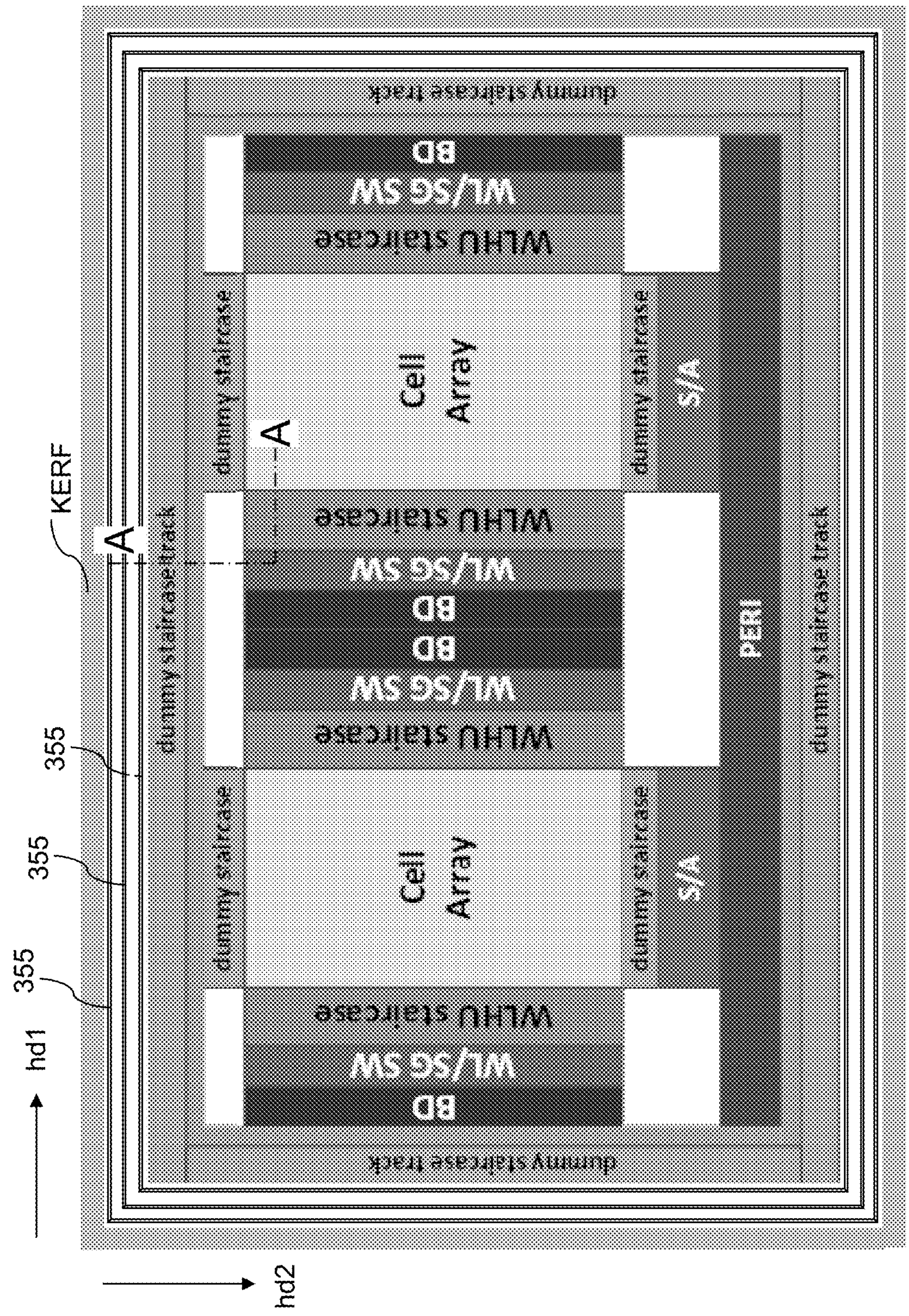
FIG. 4B is a horizontal cross-sectional view of a region of the exemplary structure of FIG. 4A. The hinged vertical plane A-A' corresponds to the plane of the vertical cross-sectional view of FIG. 4A.
Figure 4C:
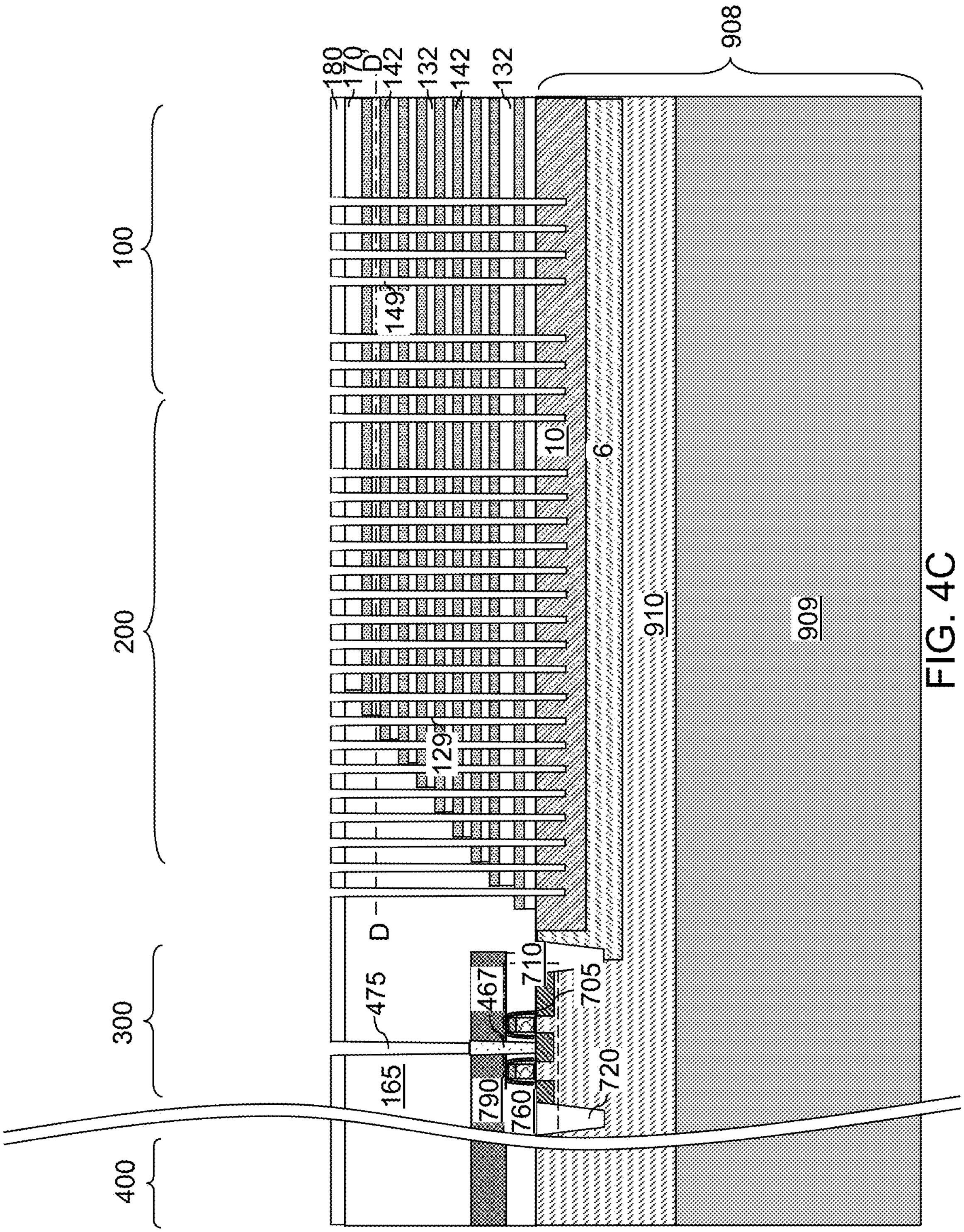
FIG. 4C is a vertical cross-sectional view of another region of the exemplary structure of FIGS. 4A and 4B.
Figure 4D:
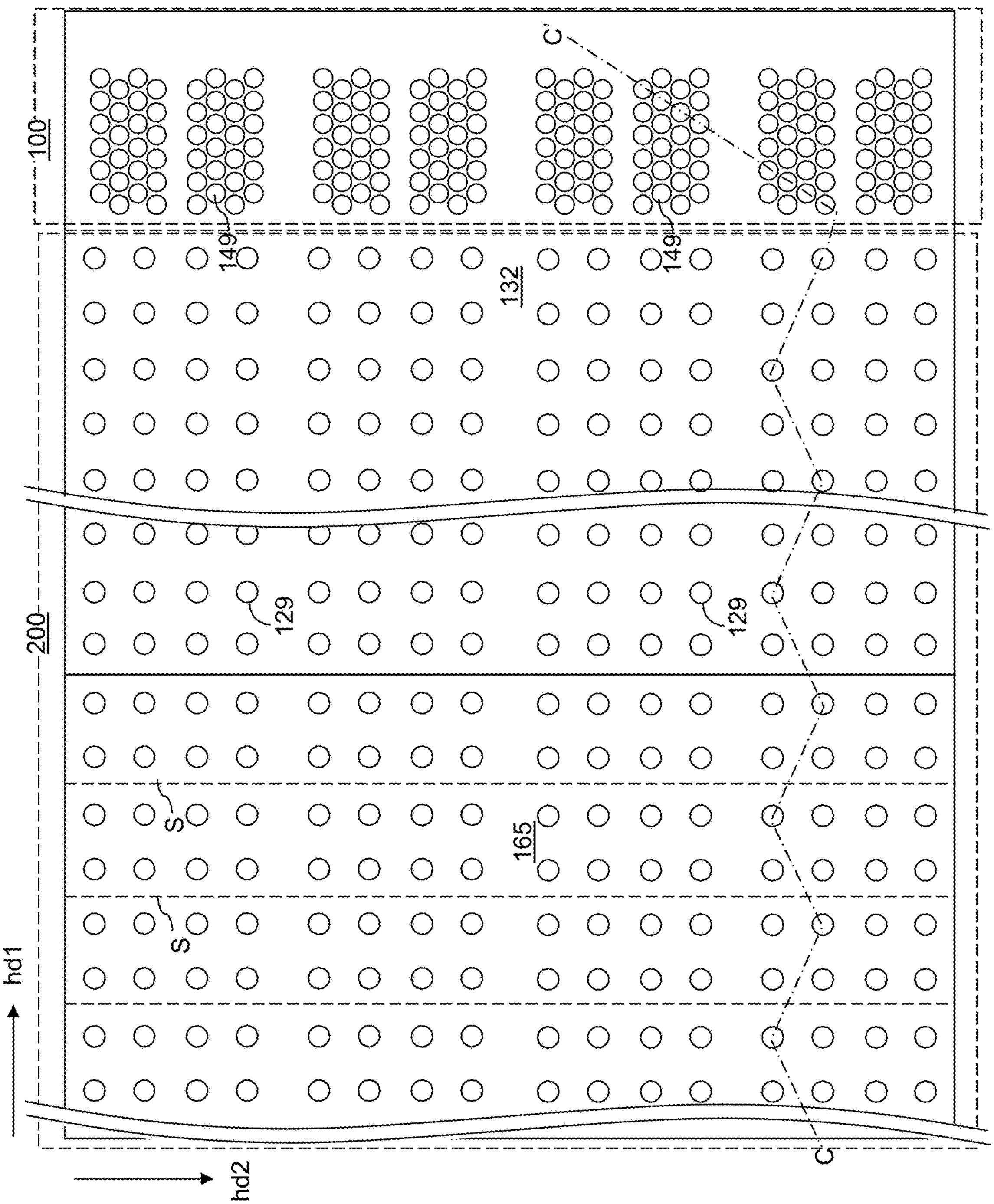
FIG. 4D is horizontal cross-sectional view of the exemplary structure along the horizontal plane D-D' of FIG. 4C.

Referring to FIG. 3, a dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first retro-stepped dielectric material portion 165 overlies, and contacts, the first stepped surfaces in the staircase region 200 and the silicon nitride diffusion barrier layer 790. The first-tier alternating stack (132, 142) and the first stepped dielectric material portion 165 collectively constitute a first-tier structure, which is an in-process structure that is subsequently modified. The first retro-stepped dielectric material portion 165 laterally surrounds the memory array region 100, and can continuously extend along the periphery of each semiconductor die and over each kerf region. Thus, each memory array region 100 can be laterally surrounded by the first retro-stepped dielectric material portion 165.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Referring to FIGS. 4A-4D, various first-tier openings (149, 129, 355, 475) may be formed through the inter-tier dielectric layer 180 and the first-tier structure (132, 142, 170, 165). A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the semiconductor substrate 908 by a first anisotropic etch process to form the various first-tier openings (149, 129, 355, 475) concurrently, i.e., during the first isotropic etch process. The various first-tier openings (149, 129, 355, 475) may include first-tier memory openings 149, first-tier support openings 129, first-tier peripheral via cavities 475, and first-tier edge seal trenches 355. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

The first-tier peripheral via cavities 475 can be formed through the retro-stepped dielectric material portion on a respective one of the sacrificial via fill structures 467. The first-tier peripheral via cavities 475 can be formed as discrete openings located within the area of a respective one of the sacrificial via fill structures 467. Top surfaces of the sacrificial via fill structures 467 can be employed as an etch stop structure.

The first-tier edge seal trenches 355 can be formed through the first retro-stepped dielectric material portion 165, the silicon nitride diffusion barrier layer 790, and the planarization dielectric layer 760. Each first-tier edges seal trench 355 can have a configuration of a moat trench, i.e., a trench having an annular horizontal cross-sectional shape and laterally surrounding an enclosed area. The first-tier edge seal trenches 355 can laterally extend along the periphery of a respective semiconductor die to laterally surround, and enclose, the entirety of all semiconductor devices formed up to this processing step within the respective semiconductor die, and to laterally surround the entire area of additional semiconductor devices to be subsequently formed within the respective semiconductor die. The bottom surfaces of the first-tier edge seal trenches 355 can be formed in an upper portion of the semiconductor material layer 910 in the semiconductor substrate 908. A plurality of first-tier edges seal trenches 355 can be formed as a set of nested first-tier edge seal trenches 355. Each first-tier edge seal trench 355 can be laterally surrounded by, or can laterally surround, each other first-tier edge seal trench 355.

According to an aspect of the present disclosure, the width of each first-tier edge seal trench 355 can be selected to be greater than twice the thickness of a metallic fill material to be subsequently deposited to form metallic edge seal fill material portions. For example, the width of each first-tier edge seal trench 355 can be in a range from 300 nm to 6,000 nm, such as from 600 nm to 3,000 nm, although lesser and greater widths may also be employed for each of the first-tier edge seal trenches 355. Sidewalls of the first-tier edge seal trenches 355 can have a taper angle in a range from 0.1 degree to 6 degrees, such as from 0.3 degrees to 3 degrees.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the second doped well 10. The photoresist layer may be subsequently removed, for example, by ashing.

The memory openings are formed in the memory array region 100, and can be arranged as clusters of first-tier memory openings 149. Each cluster of first-tier memory openings 149 can include a plurality of rows of first-tier memory openings 149 that are arranged along the first horizontal direction hd1 that is perpendicular to the vertical surfaces of the first stepped surfaces. The rows of first-tier memory openings 149 within each cluster of first-tier memory openings 149 can be arranged along a second horizontal direction hd2 that is perpendicular to the first horizontal direction hd1. In one embodiment, each cluster of first-tier memory openings 149 can be formed as a respective two-dimensional periodic array of memory openings 49. The first-tier support openings 129 can be formed in the staircase region 200 through the first retro-stepped dielectric material portion 165 and the first stepped surfaces of the first-tier alternating stack (132, 142).

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5A:
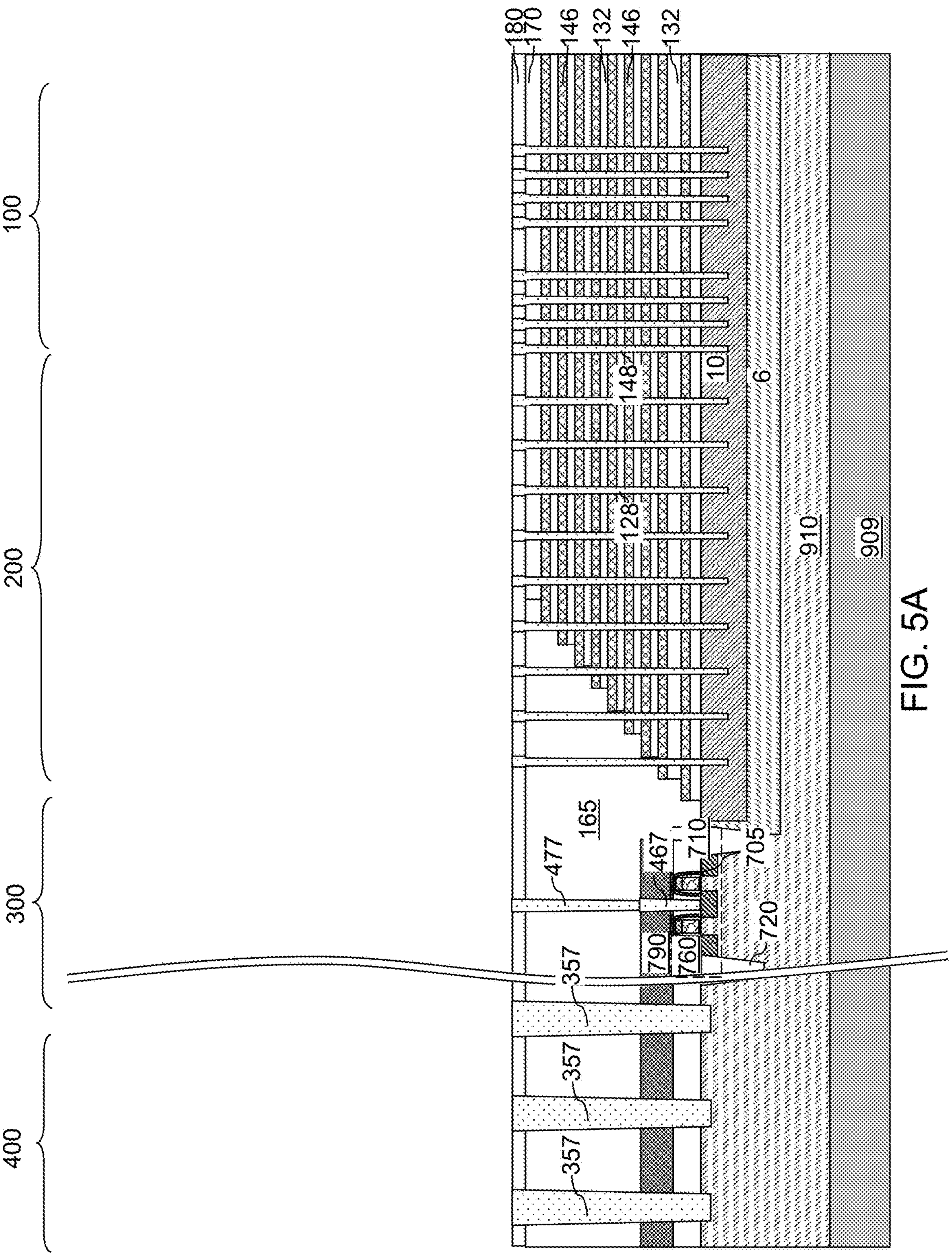
FIG. 5A is a vertical cross-sectional view of a region of the exemplary structure after formation of various sacrificial fill structures according to a first embodiment of the present disclosure.
Figure 5B:
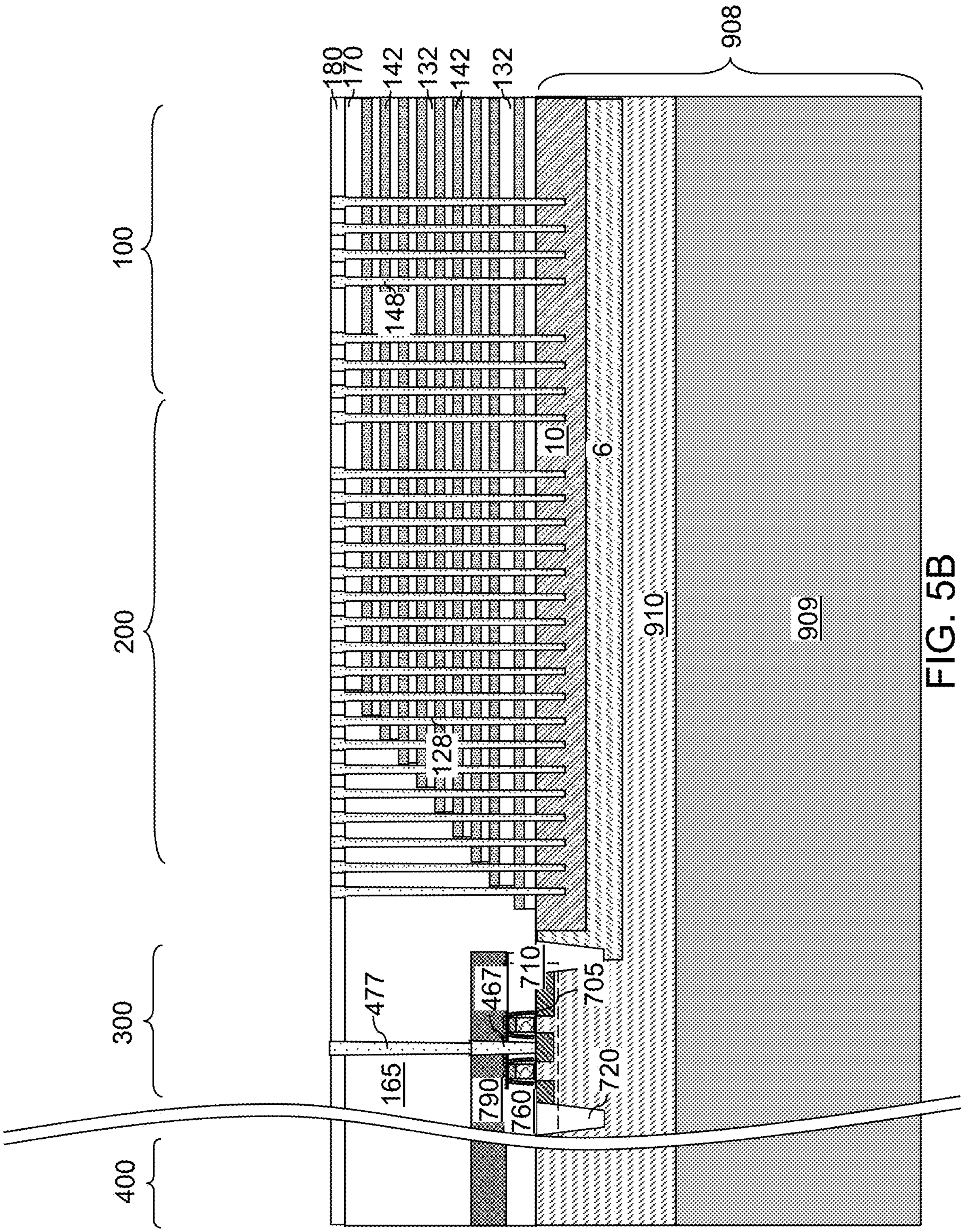
FIG. 5B is a vertical cross-sectional view of another region of the exemplary structure of FIG. 5A.

Referring to FIG. 5, sacrificial first-tier opening fill portions (148, 128, 477, 357) may be formed in the various first-tier openings (149, 129). For example, a sacrificial first-tier fill material is deposited concurrently deposited in each of the first-tier openings (149, 129, 475, 355). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include an amorphous carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128, 477, 357). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a first-tier peripheral via cavity 475 constitutes a first-tier peripheral via fill portion 477. Each remaining portion of the sacrificial material in a first-tier edge seal trench 355 constitutes a sacrificial edge-seal-trench fill structure 357.

The various sacrificial first-tier opening fill portions (148, 128, 477, 357) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
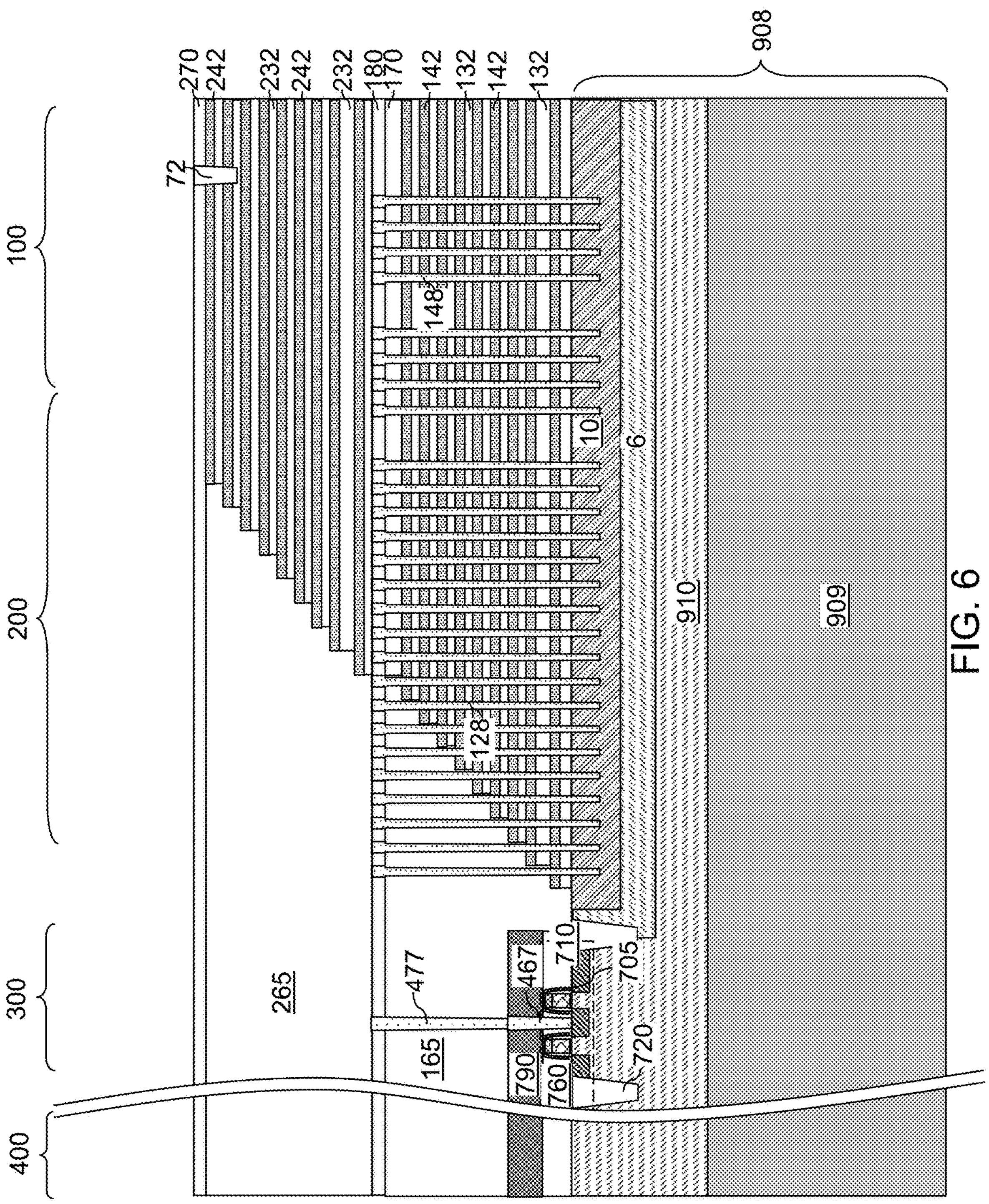
FIG. 6 is a vertical cross-sectional view of a region of the exemplary structure after formation of a second-tier alternating stack of second insulating layers and second spacer material layers, second stepped surfaces, and a second stepped dielectric material portion according to a first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200. The second retro-stepped dielectric material portion 265 laterally surrounds the memory array region 100, and can continuously extend along the periphery of each semiconductor die and over each kerf region. Thus, each memory array region 100 can be laterally surrounded by a vertical stack of the first retro-stepped dielectric material portion 165 and the second retro-stepped dielectric material portion 265.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

The second insulating layers 232 and the second sacrificial material layers 242 continuously extend over an entire area of a memory array region 100, and thus, are also referred to as second continuous insulating layers and second continuous sacrificial material layers, respectively. A vertically alternating sequence of the second continuous insulating layers and the second continuous sacrificial material layers can be formed over the semiconductor substrate 908. The second stepped surfaces are formed at peripheral portions of the vertically alternating sequence. Each layer of the vertically alternating sequence is present within the memory array region 100. The lateral extent of the second continuous sacrificial material layers 242 decreases with a vertical distance from the semiconductor substrate 908 in each staircase region 200. In one embodiment, all layers of the vertically alternating sequence are removed from above the silicon nitride diffusion barrier layer 790, and the stepped surfaces of the remaining portions of the vertically alternating sequence do not extend to areas in which the silicon nitride diffusion barrier layer 790 is present.

Generally speaking, at least one vertically alternating sequence of continuous insulating layers (132, 232) and continuous spacer material layers (such as continuous sacrificial material layers (142, 242)) may be formed over the semiconductor substrate 908, and at least one stepped dielectric material portion (165, 265) may be formed over the staircase regions on the at least one vertically alternating sequence (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along the first horizontal direction hd1, and may be laterally spaced apart along the second horizontal direction hd2 that is perpendicular to the first horizontal direction hd1. The second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
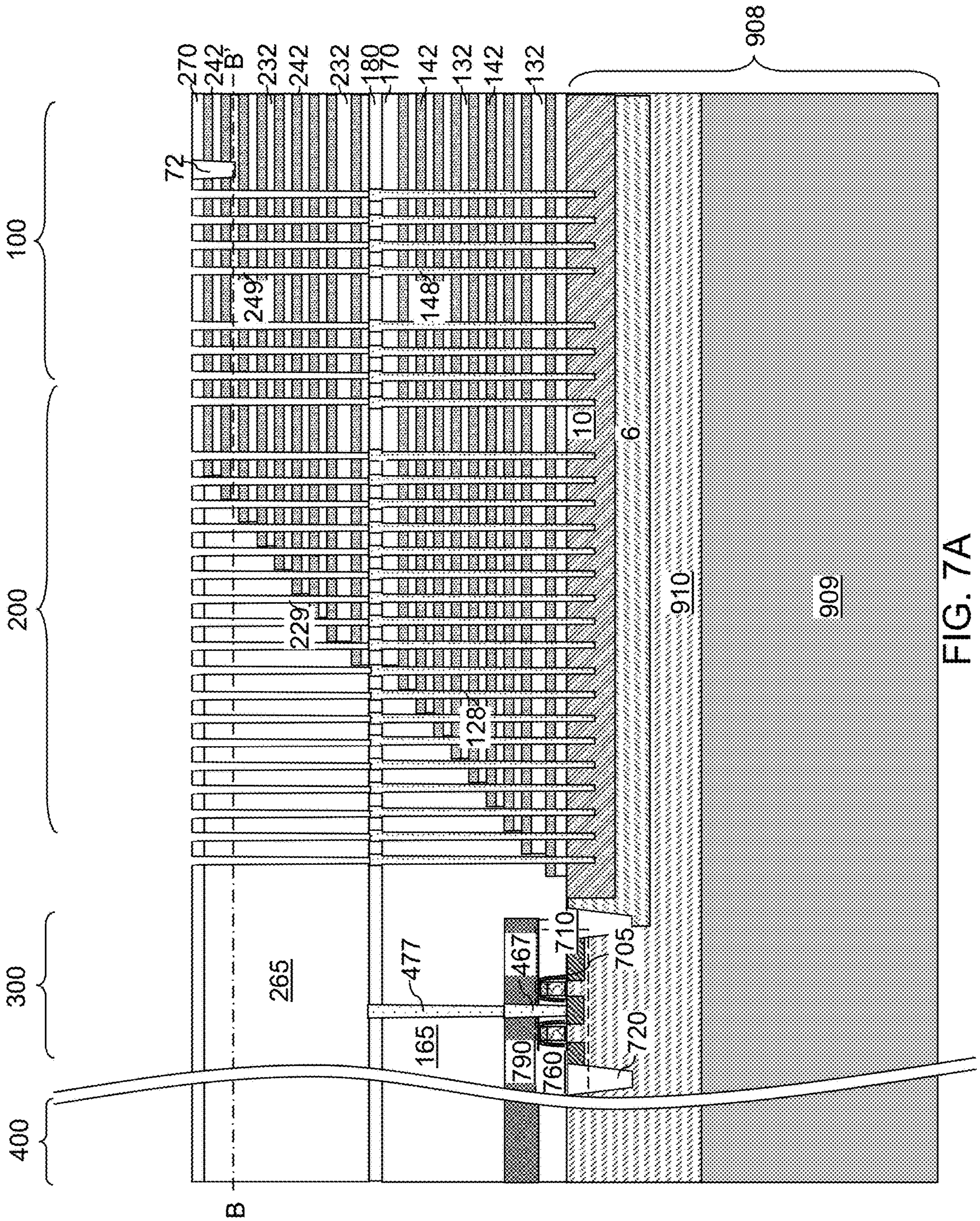
FIG. 7A is a vertical cross-sectional view of a region of the exemplary structure after formation of second-tier memory openings and second-tier support openings according to a first embodiment of the present disclosure.
Figure 7B:
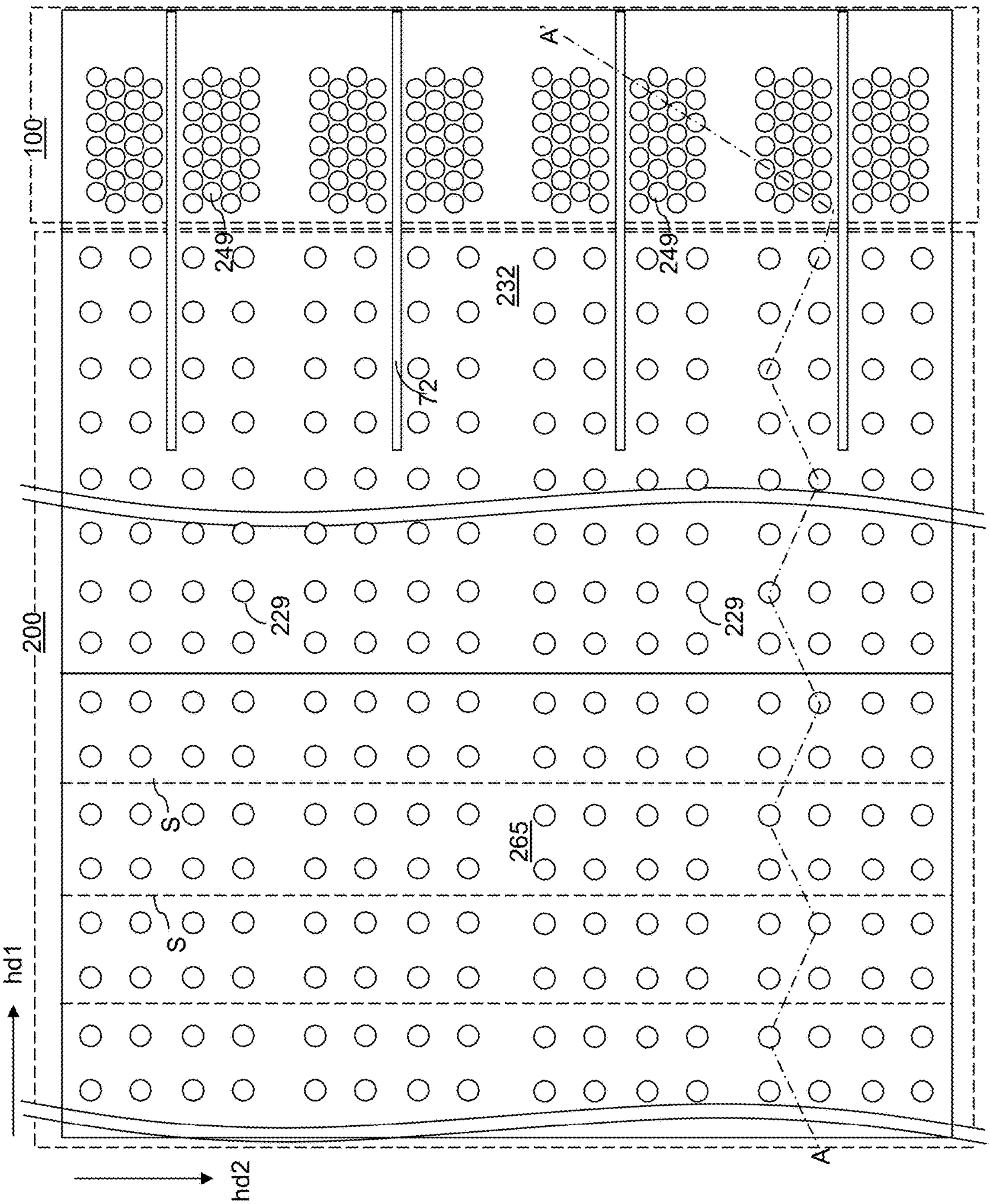
FIG. 7B is a horizontal cross-sectional of a region of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the second-tier memory openings 249 in the memory array region 100 may be the same as the pattern of the first-tier memory openings 149, which is the same as the pattern of the first-tier memory opening fill portion 148. The lateral extent of the pattern of the second-tier support openings 229 in the staircase region 200 can be limited within the areas of the stepped surfaces of the second-tier alternating stack (232, 242). In other words, the second-tier support openings 229 may be absent within an area in which the second retro-stepped dielectric material portion 265 contacts a top surface of the inter-stack dielectric layer 180. Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
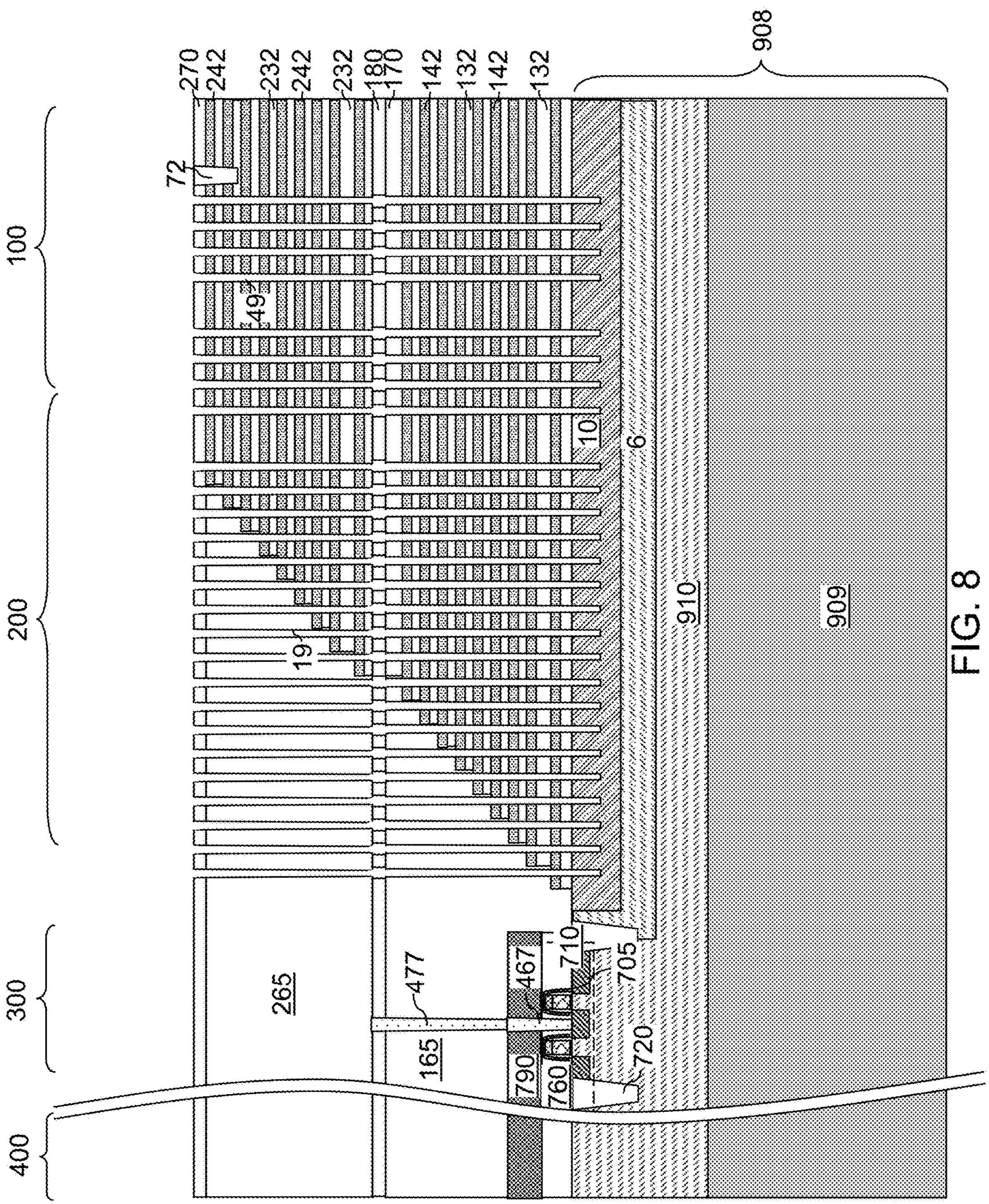
FIG. 8 is a vertical cross-sectional view of a region of the exemplary structure after formation of inter-tier memory openings and inter-tier support openings according to a first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figure 9B:
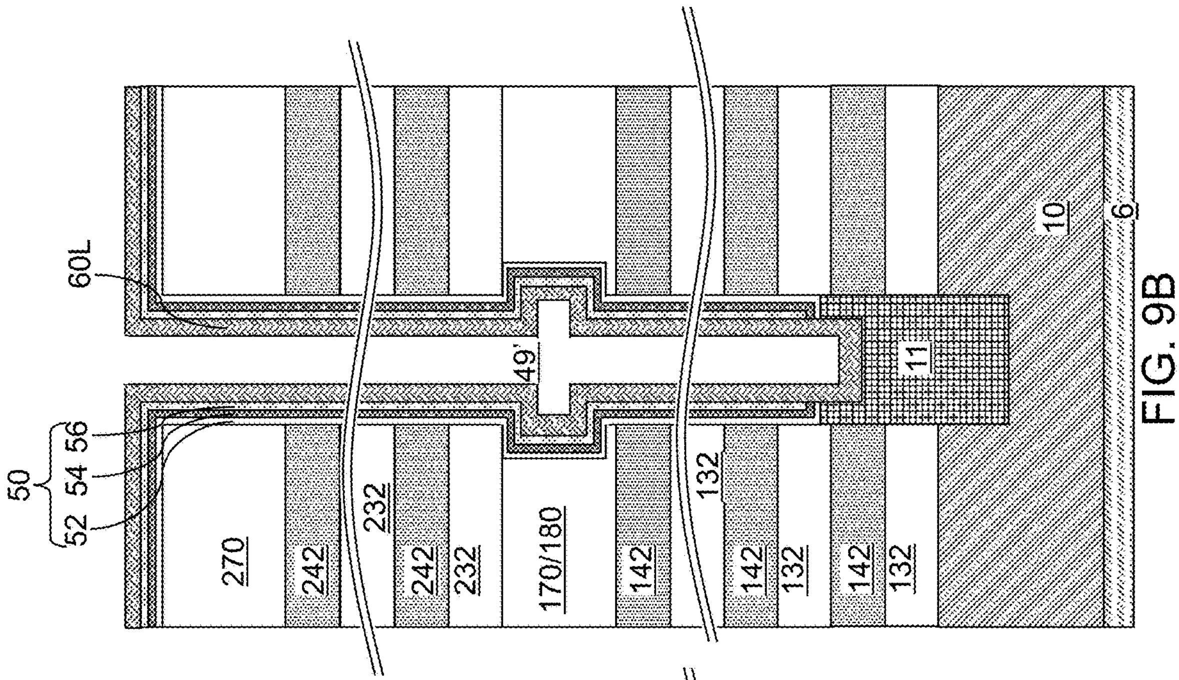
FIGS. 9A-9D illustrate sequential vertical cross-sectional views of a memory opening during formation of a memory opening fill structure according to a first embodiment of the present disclosure.
Figure 9A:
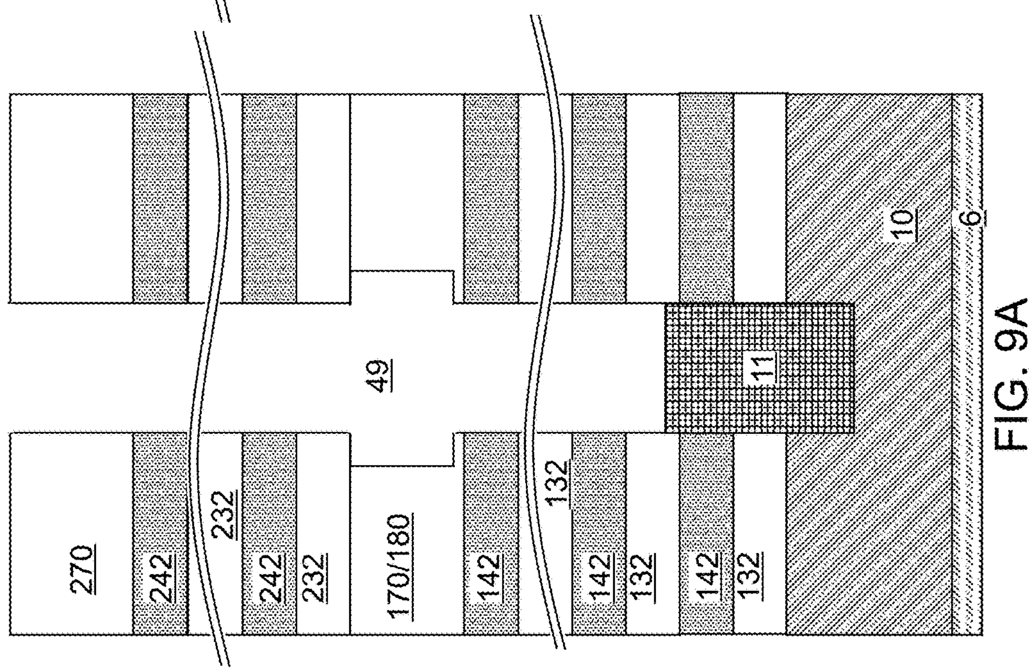

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the second doped well 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0\times10^{14}/cm^3$ to $1.0\times10^{18}/cm^3$, although lesser and greater dopant atomic concentrations may also be used. A p-n junction may be formed at each interface between the second doped well 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times$ $10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{15}/cm^3$ to $1.0\times10^{19}/cm^3$, such as from $1.0\times10^{16}/cm^3$ to $1.0\times10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 9D:
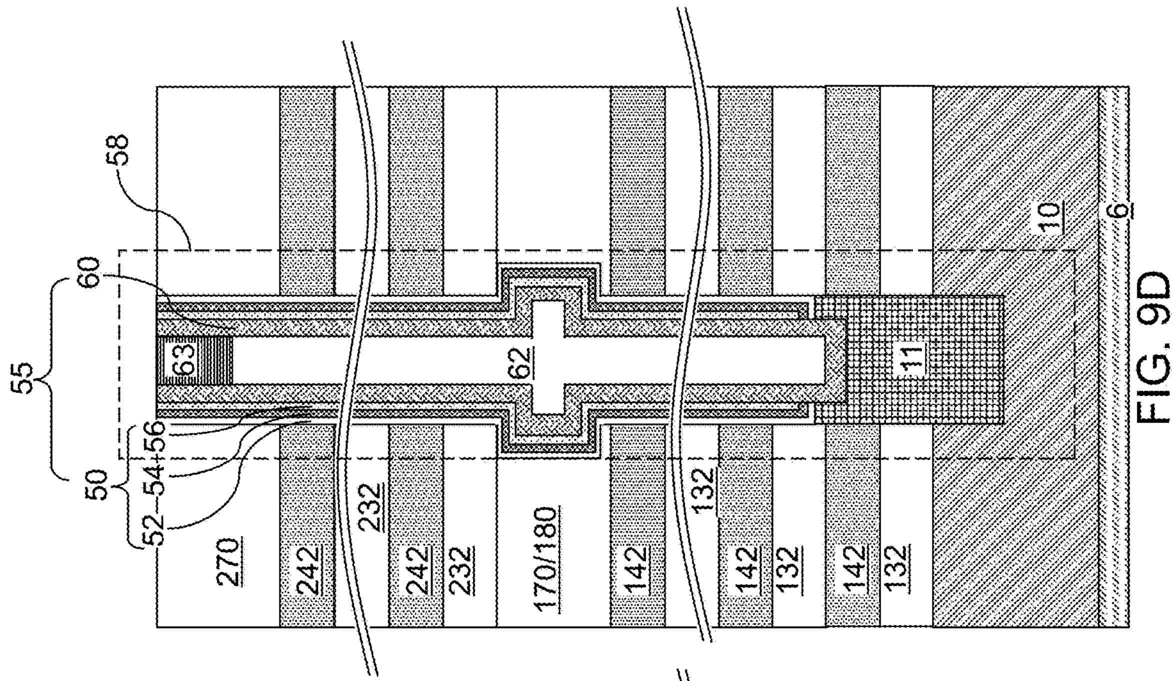
Figure 9C:
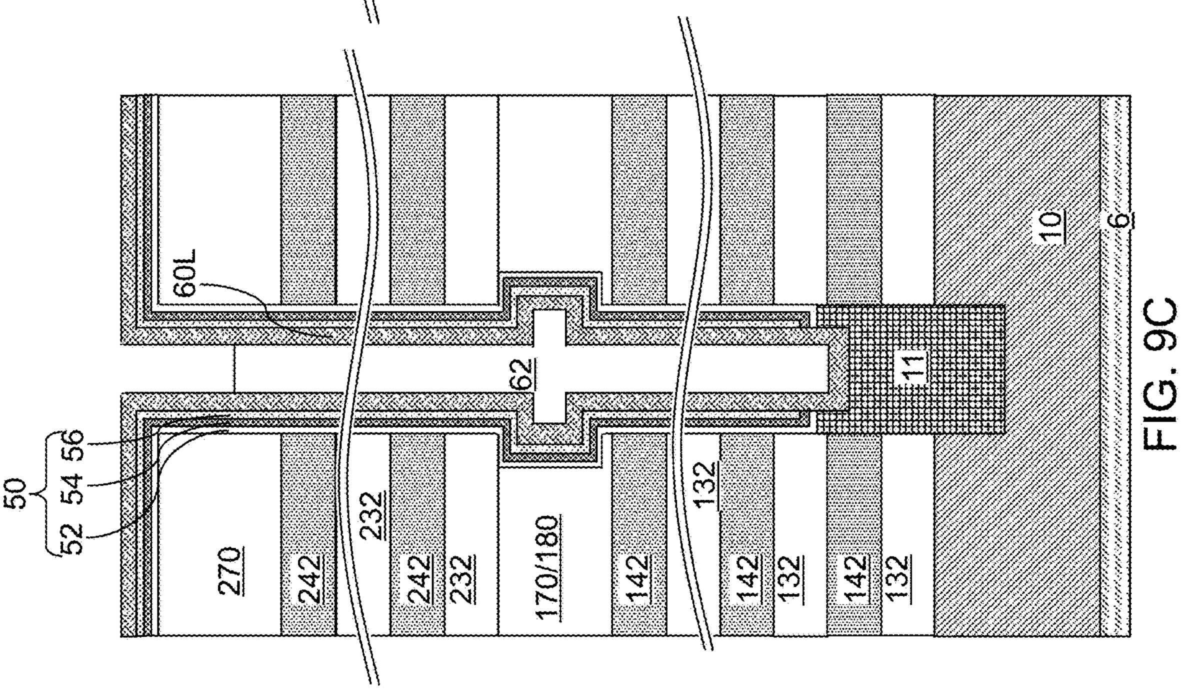

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The semiconductor material layer 910 and doped wells embedded therein, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
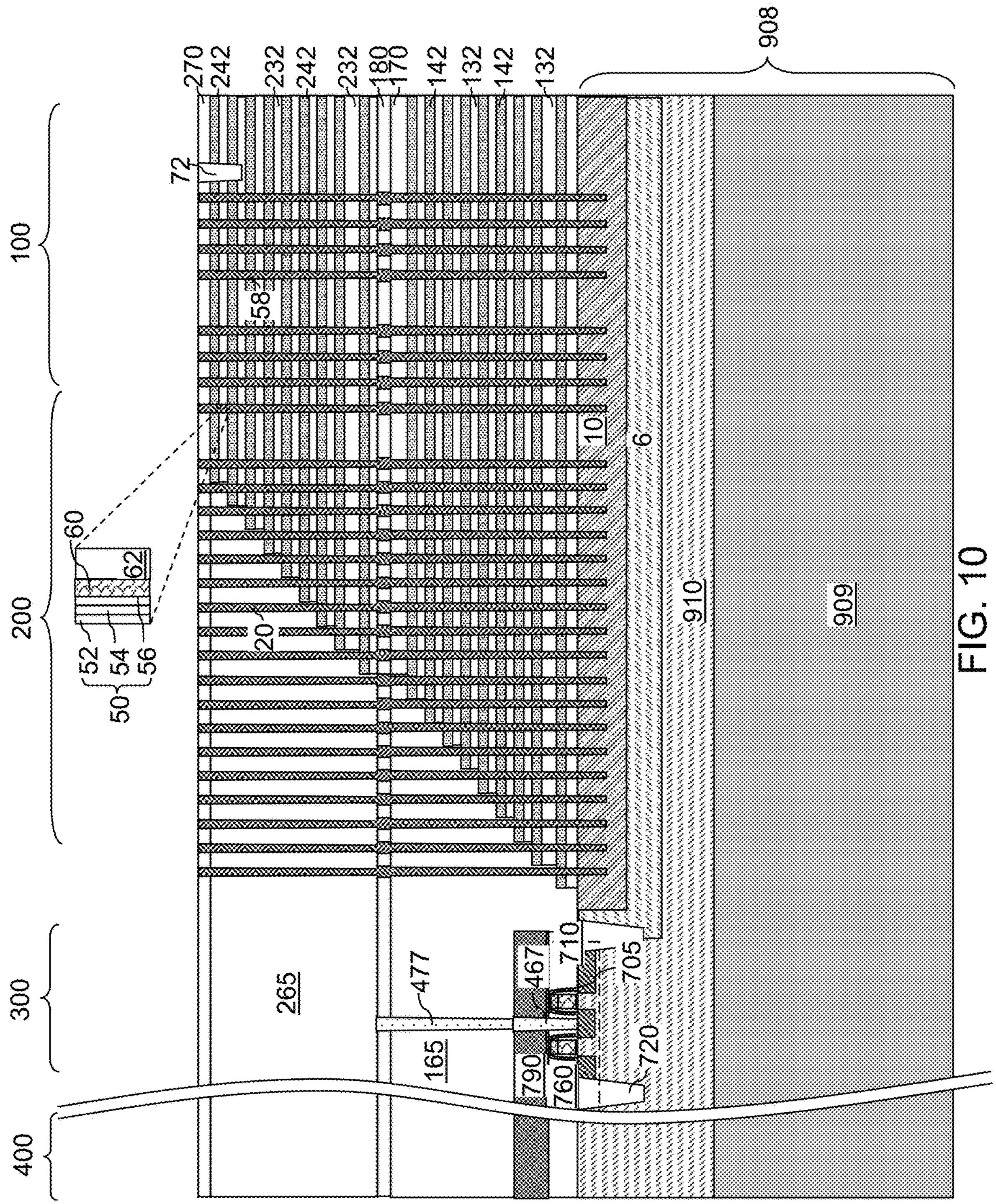
FIG. 10 is a vertical cross-sectional view of a region of the exemplary structure after formation of memory opening fill structures and support pillar structures according to a first embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. Generally, a plurality of sets of memory stack structures 55 can be formed through the vertically alternating sequence of the first continuous insulating layers 132 and the first continuous sacrificial material layers 142 and through the vertically alternating sequence of the second continuous insulating layers 232 and the second continuous sacrificial material layers 242. The first continuous insulating layers 132 and the second continuous insulating layers 232 can be considered as a set of continuous insulating layers (132, 232) and a set of continuous sacrificial material layers (142, 242). Thus, each set of memory stack structures 55 can vertically extend through the vertically alternating sequence of the continuous insulating layers (132, 232) and the continuous sacrificial material layers (142, 242). Each set of memory stack structures 55 vertically extends through a respective region of the vertically alternating sequence that are laterally spaced apart along the second horizontal direction hd2. Each of the memory stack structures 55 comprises a respective vertical semiconductor channel 60 and a respective memory film 60.

Figure 11A:
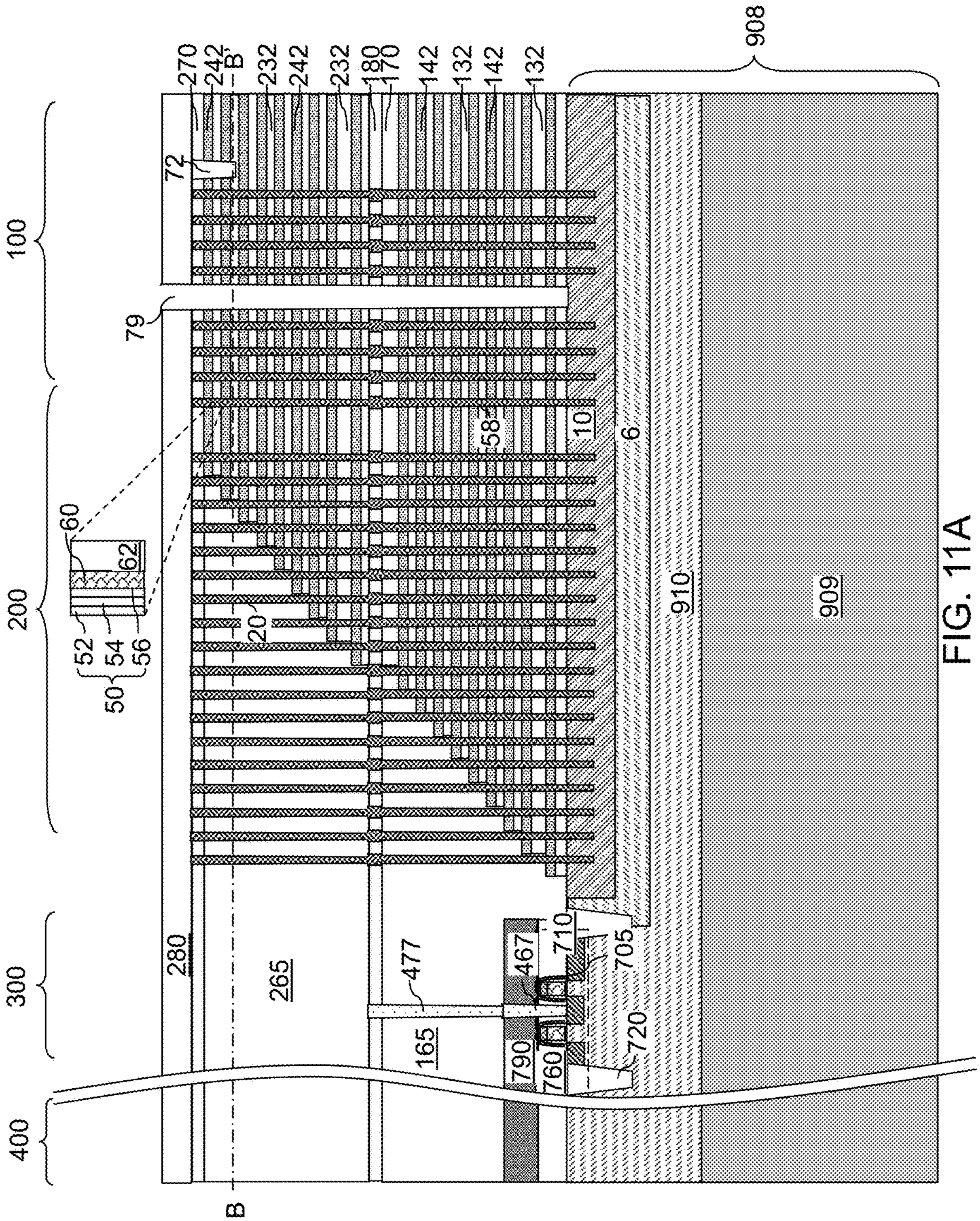
FIG. 11A is a vertical cross-sectional view of a region of the exemplary structure after formation of a first contact-level dielectric layer and backside trenches according to a first embodiment of the present disclosure.
Figure 11B:
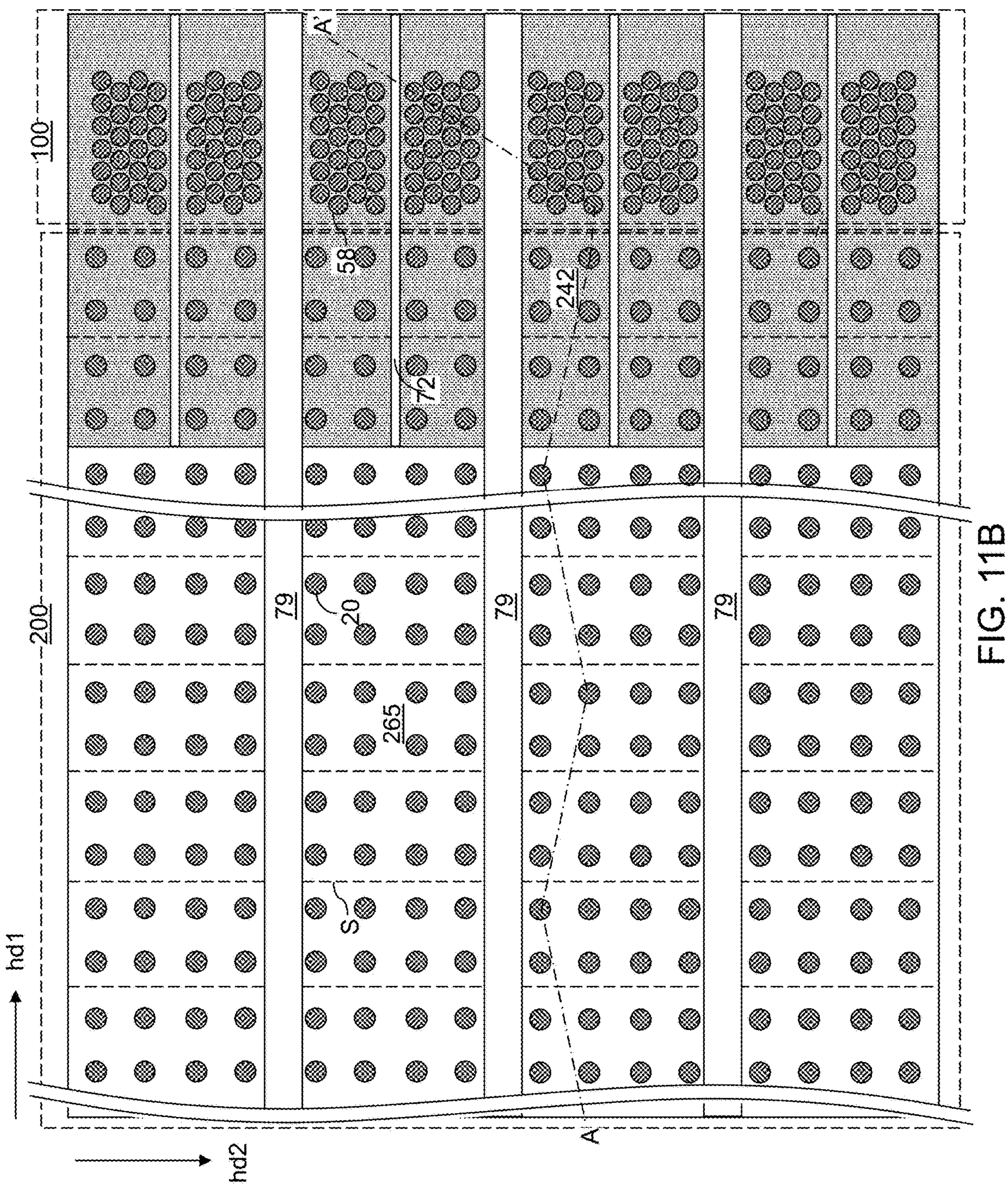
FIG. 11B is a horizontal cross-sectional of a region of the exemplary structure along the horizontal plane B-B' of FIG. 11A. The hinged vertical plane A-A' corresponds to the plane of the vertical cross-sectional view of FIG. 11A.
Figure 11C:
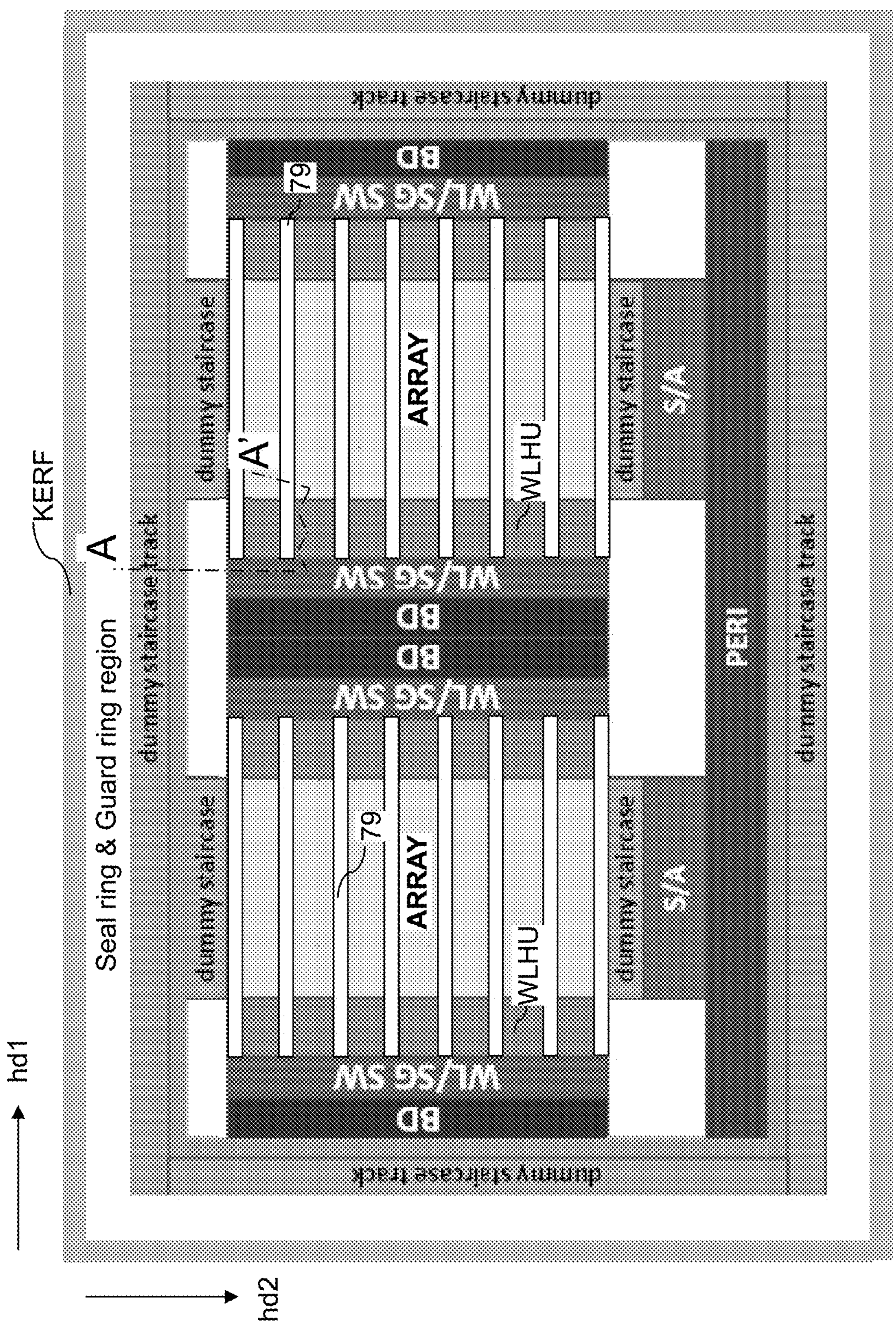
FIG. 11C is a top-down view of a unit die area of the exemplary structure of FIGS. 11A and 11B. The hinged vertical plane A-A' corresponds to the plane of the vertical cross-sectional view of FIG. 11A.

Referring to FIGS. 11A-11C, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. The backside trenches 79 may be formed by transferring the pattern in the photoresist layer through the first contact-level dielectric layer 280, the second-tier structure (232, 242, 270, 265, 72), and the first-tier structure (132, 142, 170, 165), and to a top surface of the semiconductor substrate 908. As used herein, a "backside trench" refers to a trench that laterally divides the vertically alternating sequence of the continuous insulating layers (132, 232) and the continuous sacrificial material layers (142, 242). Thus, portions of the first contact-level dielectric layer 280, the second-tier structure (232, 242, 270, 265, 72), the first-tier structure (132, 142, 170, 165), and the semiconductor substrate 908 that underlie the openings in the photoresist layer may be removed to form the backside trenches 79. Each of the backside trenches 79 can be formed entirely within a memory array region 100 and adjoining staircase regions 200.

In one embodiment, the backside trenches 79 may be formed between clusters of memory stack structures 55. According to an embodiment of the present disclosure, the backside trenches 79 can laterally extend along the first horizontal direction hd1, and divide the vertically alternating sequence into a plurality of alternating stacks of insulating layers (132, 232) and sacrificial material layers (142, 242). Each alternating stack of insulating layers (132, 232) and sacrificial material layers (142, 242) can include a first-tier alternating stack of first insulating layers 132 and first sacrificial material layers 142, and a second-tier alternating stack of second insulating layers 232 and second sacrificial material layers 242. The clusters of the memory stack structures 55 may be laterally spaced apart along the second horizontal direction hd2 by the backside trenches 79.

In one embodiment, each alternating stack {(132, 142), (232, 2342)} among the plurality of alternating stacks {(132, 142), (232, 2342)} comprises a respective staircase region 200 in which spacer material layers (132, 232) have lateral extents that decrease with an increase in a vertical distance from the semiconductor substrate 908. In one embodiment, each of the plurality of backside trenches 79 can be laterally bounded by sidewalls of at least one alternating stack {(132, 142), (232, 2342)}. A first subset of the diver trenches 79 may laterally extend along the first horizontal direction hd1 between a pair of alternating stacks {(132, 142), (232, 2342)}.

Figure 12:
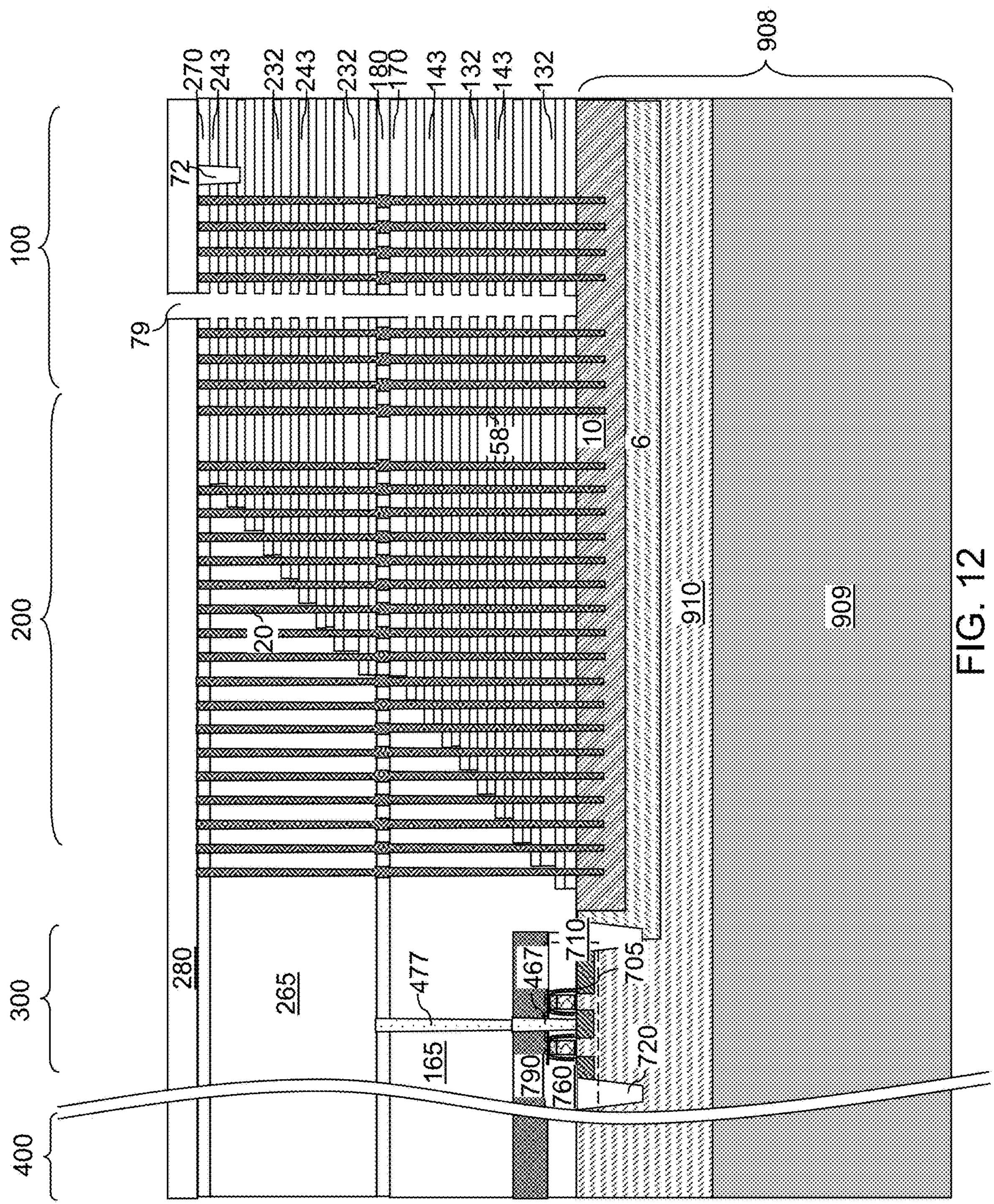
FIG. 12 is a vertical cross-sectional view of a region of the exemplary structure after formation of backside recesses according to a first embodiment of the present disclosure.

Referring to FIG. 12, the sacrificial material layers (142, 242) are may be removed selective to the insulating layers (132, 232), the first and second insulating cap layers (170, 270), the first contact-level dielectric layer 280, and the semiconductor substrate 908. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
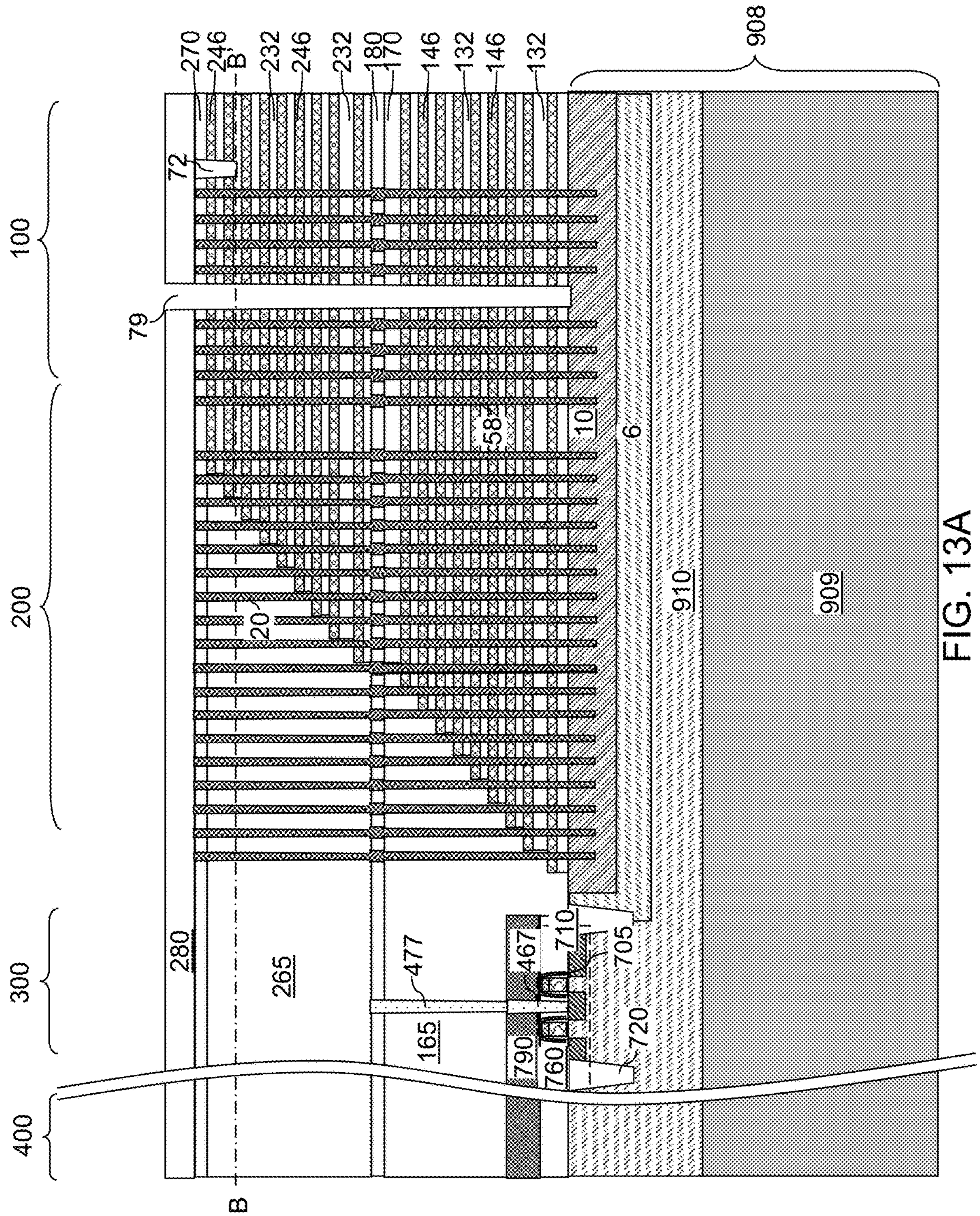
FIG. 13A is a vertical cross-sectional view of a region of the exemplary structure after formation of electrically conductive layers according to a first embodiment of the present disclosure.
Figure 13B:
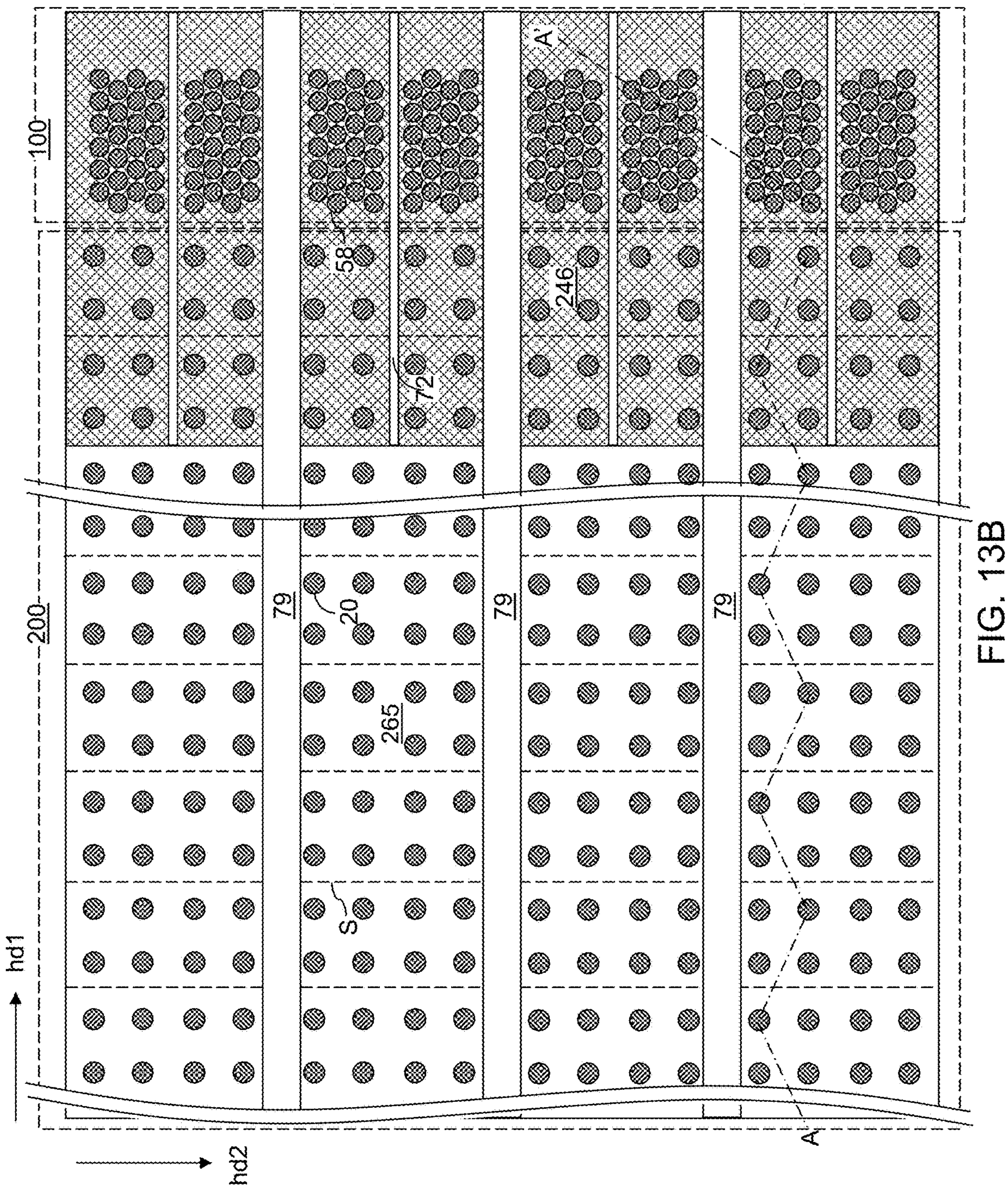
FIG. 13B is a horizontal cross-sectional of a region of the exemplary structure along the horizontal plane B-B' of FIG. 13A. The hinged vertical plane A-A' corresponds to the plane of the vertical cross-sectional view of FIG. 13A.
Figure 14A:
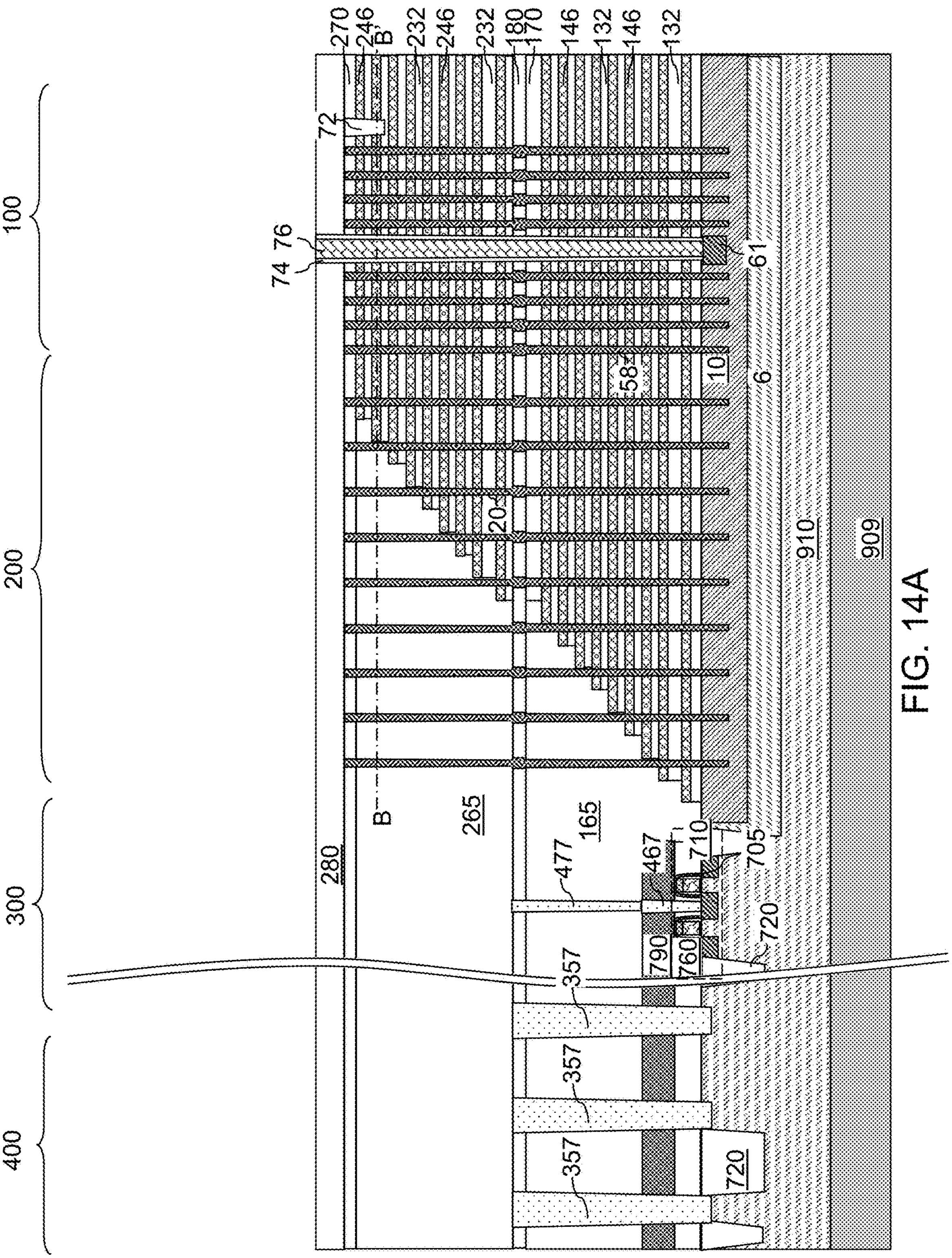
FIG. 14A is a vertical cross-sectional view of a region of the exemplary structure after formation of backside trench fill structures and slit trench fill structures according to a first embodiment of the present disclosure.
Figure 14B:
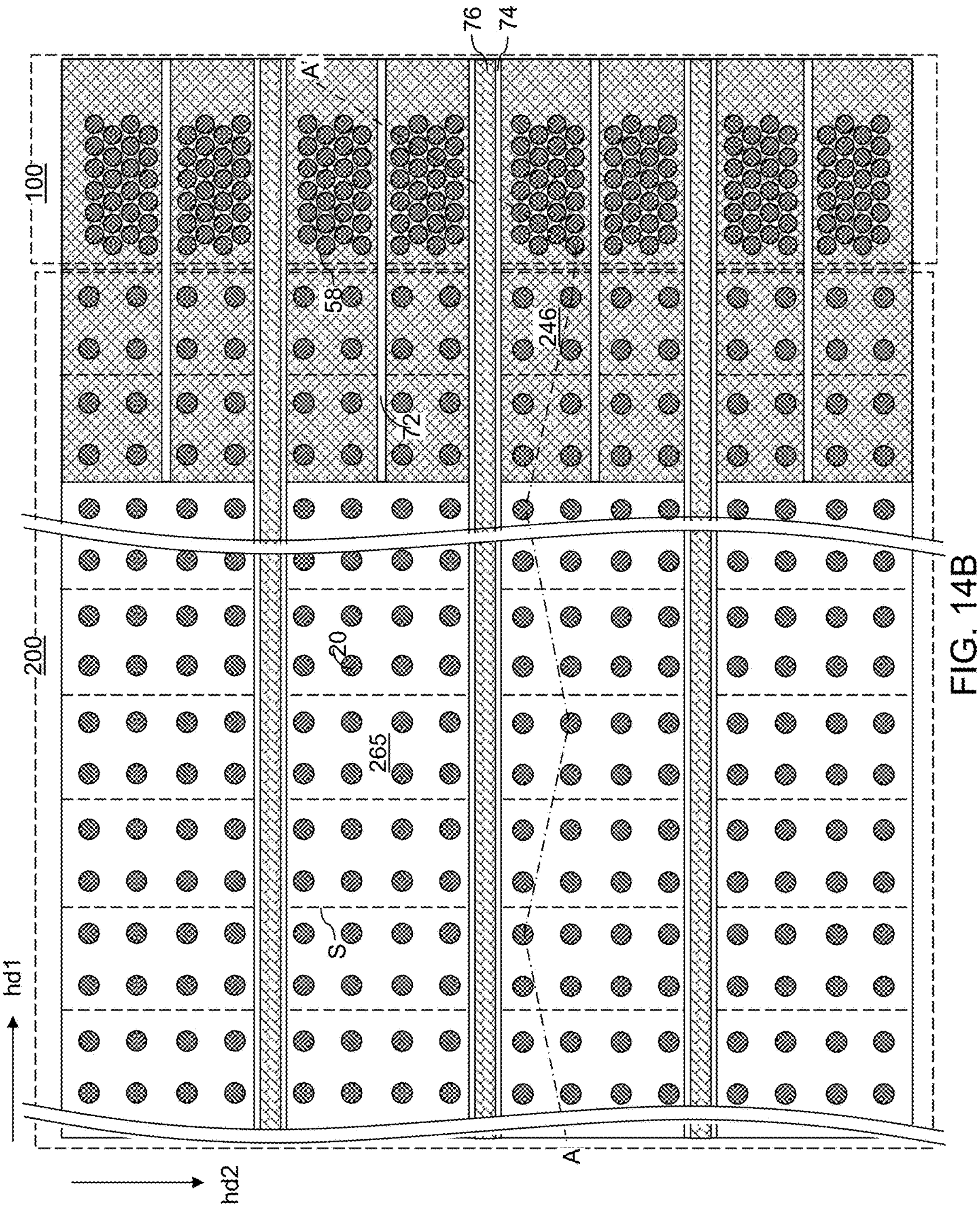
FIG. 14B is a horizontal cross-sectional of a region of the exemplary structure along the horizontal plane B-B' of FIG. 14A. The hinged vertical plane A-A' corresponds to the plane of the vertical cross-sectional view of FIG. 14A.
Figure 14C:
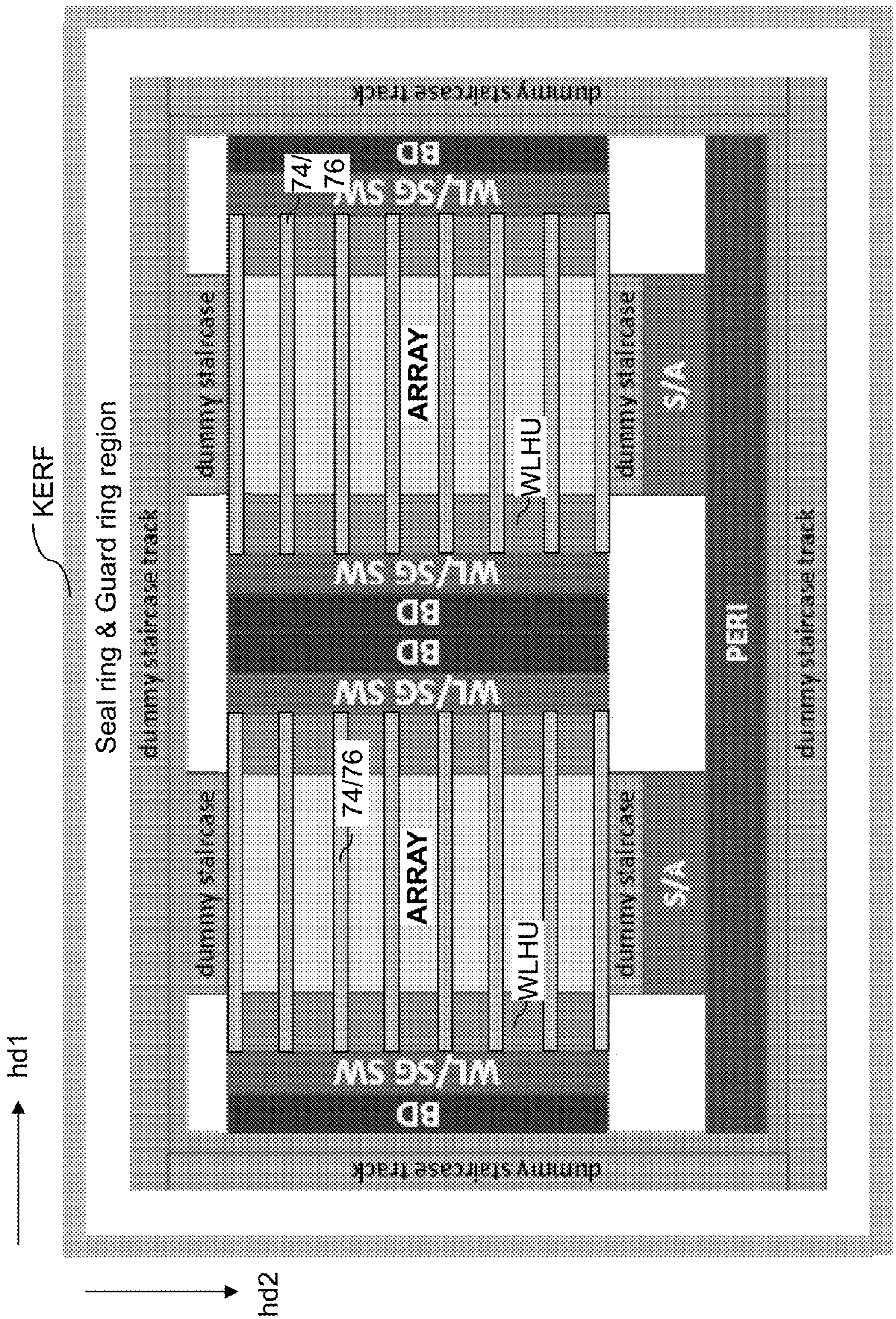
FIG. 14C is a top-down view of a unit die area of the exemplary structure of FIGS. 14A and 14B.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the substrate semiconductor layer 909. The memory-level assembly includes at least one alternating stack (132, 146, 232, 246) and memory stack structures 55 vertically extending through the at least one alternating stack (132, 146, 232, 246).

Generally, the sacrificial material layers (142, 242) in the plurality of alternating stacks {(132, 142), (232, 242)} can be replaced with the electrically conductive layers (1'46, 246) employing the backside trenches 79 as a conduit for an etchant that etches the sacrificial material layers (142, 242) and for a reactant that deposits at least one conductive material of the electrically conductive layers (146, 246). A plurality of alternating stacks of insulating layers (132, 232) and electrically conductive layers (146, 246) can be located on a semiconductor substrate 908, and can be laterally spaced apart by a plurality of backside trenches 79 that laterally extend along the first horizontal direction hd1.

Referring to FIGS. 14A-14D, a conformal dielectric material layer (such as a silicon oxide layer) can be deposited at peripheral portions of the backside trenches 79, and an anisotropic etch process can be performed to remove horizontal portions of the conformal dielectric material layer. Each remaining vertical portion of the conformal dielectric material layer in the backside trenches 79 constitutes a backside trench dielectric spacer 74.

Electrical dopants can be implanted into physically exposed portions of the second doped wells 10 to form source regions 61. In one embodiment, the second doped wells 10 and the vertical semiconductor channels 60 can have a doping of a first conductivity type, and the source regions 61 can have a doping of a second conductivity type that is the opposite of the first conductivity type. For example, the first conductivity type can be p-type and the second conductivity type can be n-type, or vice versa. In case the source regions 61 are formed, the source regions 61 can have an atomic concentration of electrical dopants of the second conductivity type in a range from $5.0\times10^{18}/cm^3$ to $2.0\times10^{21}/cm^3$.

At least one conductive fill material can be deposited in the remaining volumes of the backside trenches 79. For example, the at least one conductive fill material can include doped polysilicon, a conductive metallic nitride, and/or a metal fill material (such as tungsten). Excess portions of the at least one conductive fill material can be removed from above the horizontal plane including the top surface of the first contact-level dielectric layer 280. Each remaining portion of the at least one conductive fill material in the backside trenches 79 can constitute a source contact via structure 76. Each of the source contact via structures 76 is a conductive fill material portion. The set of all material portions filling a backside trench 79 constitutes a backside trench fill structure (74, 76). In one embodiment, a backside trench fill structure (74, 76) can include a backside trench dielectric spacer 74 and a source contact via structure 76.

A plurality of alternating stacks {(132, 146), (232, 246)} and a plurality of backside trench fill structures (74, 76) are alternately interlaced along the second horizontal direction hd2. In one embodiment, each of the plurality of backside trench fill structures (74, 76) contacts sidewalls of at least one alternating stack {(132, 146), (232, 246)} among the plurality of alternating stacks {(132, 146), (232, 246)} that laterally extend along the first horizontal direction hd1.

In an alternative embodiment, the at least one semiconductor device (e.g., peripheral or driver circuit device) 710 may be formed in or on the substrate in the memory array region 100 under the memory array (e.g., alternating stacks) in a CMOS under array configuration. In this embodiment, the vertical source contact via structure 76 is replaced with a horizontal source line (e.g., direct strap contact) which contacts a sidewall of the lower portion of the semiconductor channel 60. In this embodiment, the backside trenches 79 are completely filled with then backside trench dielectric spacer 74. In another alternative embodiment, the at least one semiconductor device (e.g., peripheral or driver circuit device) 710 may be formed in or on a separate substrate and then bonded to the memory array located on the substrate 908 in a CMOS bonded to array configuration.

Figure 15A:
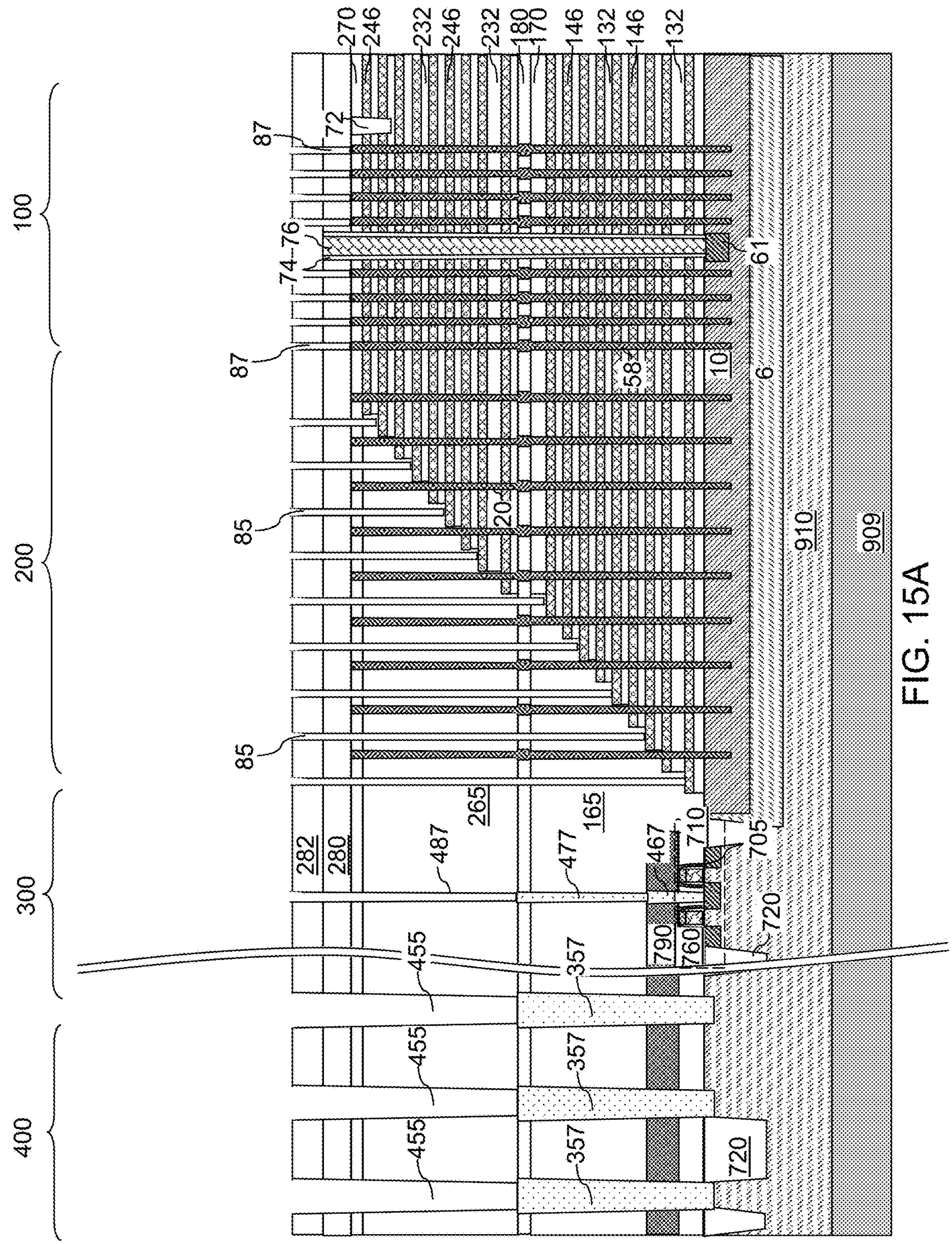
FIG. 15A is a vertical cross-sectional view of a region of the exemplary structure after formation of a second contact-level dielectric layer, contact via cavities, and second-tier via cavities according to a first embodiment of the present disclosure.
Figure 15B:
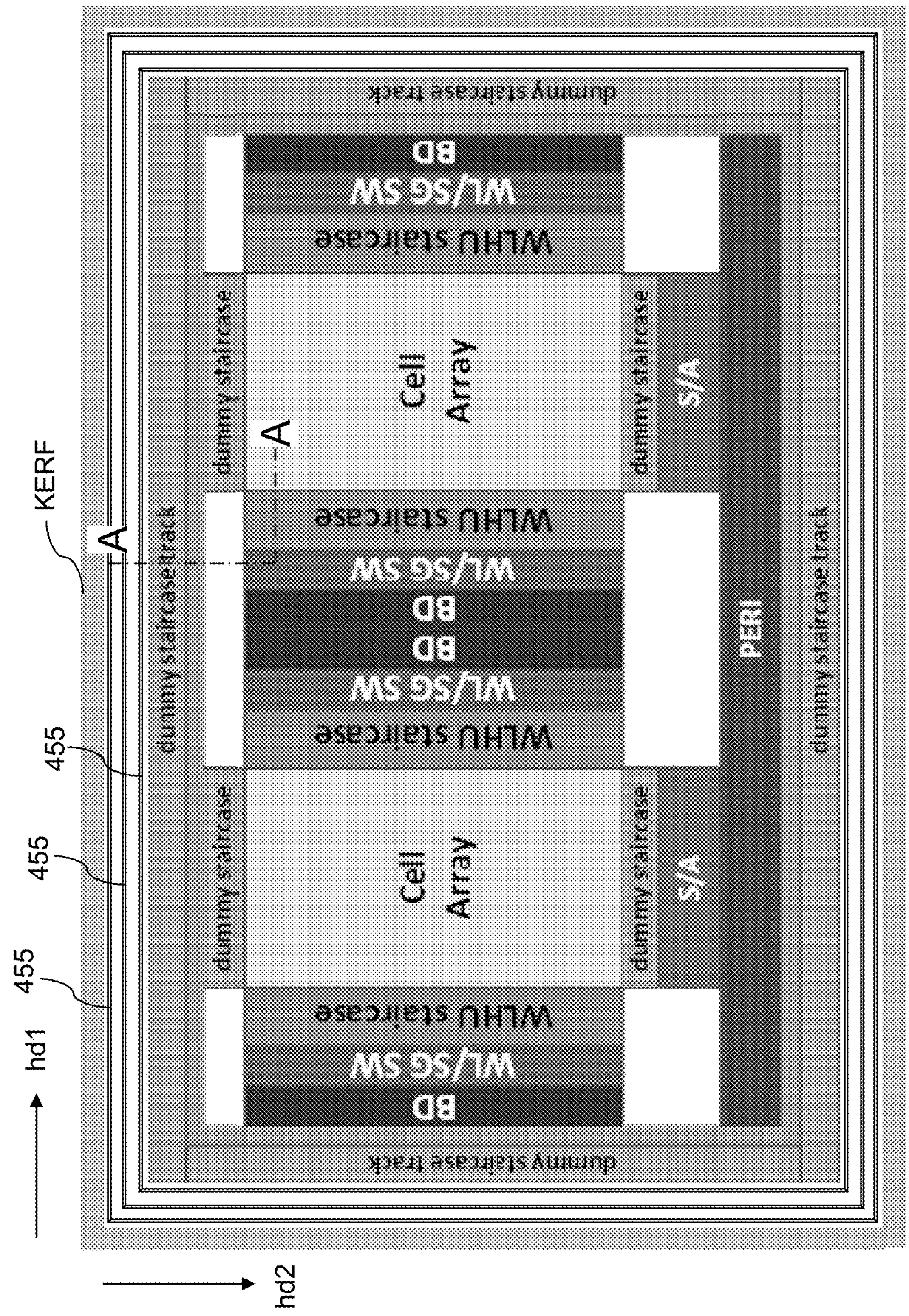
FIG. 15B is a top-down view of a unit die area of the exemplary structure of FIG. 15A.

Referring to FIGS. 15A and 15B, a second contact-level dielectric layer 282 can be optionally formed over the first contact-level dielectric layer 280. The second contact-level dielectric layer 282 includes a dielectric material such as silicon oxide. A photoresist layer (not shown) may be applied over the contact-level dielectric layers (280, 282), and may be lithographically patterned to form various contact via openings therethrough. For example, openings for forming drain contact via structures may be formed over the drain regions 63 in the memory array regions 100, and openings for forming staircase region contact via structures may be formed in the staircase regions 200. Openings for second-tier peripheral via cavities 475 can be formed in the areas of the first-tier peripheral via fill portions 477. Openings for second-tier edge seal trenches 355 can be formed in the areas of the sacrificial edge-seal-trench fill structures 357.

An anisotropic etch process is performed to transfer the pattern in the photoresist layer through the contact-level dielectric layers (280, 282) and underlying dielectric material portions. The drain regions 63, the electrically conductive layers (146, 246), the first-tier peripheral via fill portions 477, and the sacrificial edge-seal-trench fill structures 357 may be used as etch stop structures. Drain contact via cavities 87 may be formed over each drain region 63, and staircase-region contact via cavities 85 may be formed over each electrically conductive layer (146. 246) at the stepped surfaces underlying the first and second retro-stepped dielectric material portions (165, 265). Second-tier peripheral via cavities 487 can be formed over the first-tier peripheral via fill portions 477. Second-tier edge seal trenches 355 can be formed over the sacrificial edge-seal-trench fill structures 357. The photoresist layer may be subsequently removed, for example, by ashing.

The second-tier peripheral via cavities 487 may be formed through the contact-level dielectric layers (280, 282) and the second and first retro-stepped dielectric material portions (265, 165) onto a top surface of a respective one of the first-tier peripheral via fill portions 477.

The second-tier edge seal trenches 455 can be formed through the second retro-stepped dielectric material portion 265. Each second-tier edges seal trench 455 can have a configuration of a moat trench. The second-tier edge seal trenches 455 can laterally extend along the periphery of a respective semiconductor die to laterally surround, and enclose, the entirety of semiconductor devices located within the respective semiconductor die. The bottom surfaces of the second-tier edge seal trenches 455 can be formed directly on a respective one of the sacrificial edge-seal-trench fill structures 357. A bottom lateral dimension (such as the width) of each second-tier edge seal trench 455 can be less than a top lateral dimension (such as the width) of an underlying sacrificial edge-seal-trench fill structure 357. A plurality of second-tier edges seal trenches 455 can be formed as a set of nested second-tier edge seal trenches 455. Each second-tier edge seal trench 455 can be laterally surrounded by, or can laterally surround, each other second-tier edge seal trench 455.

According to an aspect of the present disclosure, the width of each second-tier edge seal trench 455 can be selected to be greater than twice the thickness of a metallic fill material to be subsequently deposited to form metallic edge seal fill material portions. For example, the width of each second-tier edge seal trench 455 can be in a range from 300 nm to 6,000 nm, such as from 600 nm to 3,000 nm, although lesser and greater widths may also be employed for each of the second-tier edge seal trenches 455. Sidewalls of the second-tier edge seal trenches 455 can have a taper angle in a range from 0.1 degree to 6 degrees, such as from 0.3 degrees to 3 degrees. In one embodiment, a bottom lateral dimension (i.e., the width of a bottom surface) of the second-tier edge seal trench 455 can be less than a top lateral dimension (i.e., the width of a top surface) of the sacrificial edge-seal-trench fill structure 357.

Figure 16:
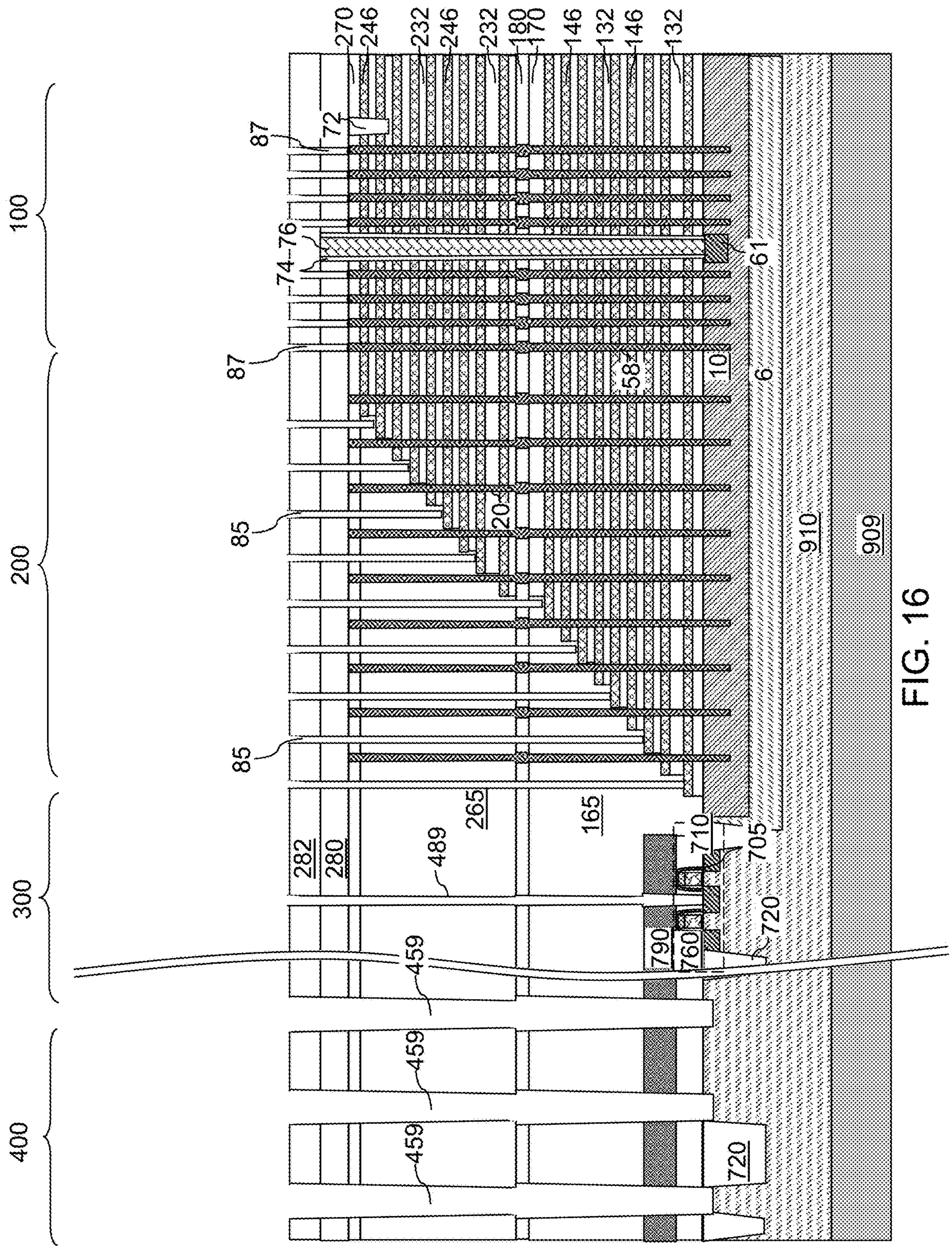
FIG. 16 is a vertical cross-sectional view of a region of the exemplary structure after formation of inter-tier via cavities including edge seal trenches according to a first embodiment of the present disclosure.

Referring to FIG. 16, an isotropic etch process can be performed to remove the sacrificial material of the first-tier peripheral via fill portion 477 and the sacrificial edge-seal-trench fill structure 357 and to remove the sacrificial material of the sacrificial via fill structures 467. A peripheral via cavity 489 (which is also referred to as inter-tier peripheral via cavity) can be formed in each contiguous set of volumes of the second-tier peripheral via cavities 487 and the voids formed by removal of the first-tier peripheral via fill portion 477 and the sacrificial material of the sacrificial via fill structures 467. Each peripheral via cavity 489 continuously extends from the topmost surface of the at least one contact-level dielectric layer (280, 282) to a top surface of a respective component of a semiconductor device in the peripheral device region 300. The peripheral via cavities 489 are contact via cavities that vertically extend through the at least one contact-level dielectric material layer (280, 282), the second retro-stepped dielectric material portion 265, the first retro-stepped dielectric material portion 165, and to the semiconductor devices in the peripheral device region 300.

An edge seal trench 459 (which is also referred to as an inter-tier edge seal trench) can be formed in each contiguous set of volumes of the second-tier edge seal trenches 455 and the voids formed by removal of the sacrificial edge-seal-trench fill structures 357. Each edge seal trench 459 can be formed by removing a sacrificial edge-seal-trench fill structure 457 from underneath a second-tier edge seal trench 455. The edge seal trenches 459 and the peripheral via cavities 489 are via cavities that vertically extend through the levels of the first-tier structure and the second-tier structure. As such, the edge seal trenches 459 and the peripheral via cavities 489 are herein referred to as inter-tier via cavities (459, 489). The edge seal trenches 459 can be formed through the second retro-stepped dielectric material portion 265, the first retro-stepped dielectric material portion 165, the silicon nitride diffusion barrier layer 790, and the planarization dielectric layer 760, and can extend to a top surface of the semiconductor material layer 910 in the semiconductor substrate 908. Each edges seal trench 459 can have a configuration of a moat trench. The edge seal trenches 459 can laterally extend along the periphery of a respective semiconductor die to laterally surround, and enclose, the entirety of semiconductor devices located within the respective semiconductor die. A plurality of edges seal trenches 459 can be formed as a set of nested edge seal trenches 459. Each edge seal trench 459 can be laterally surrounded by, or can laterally surround, each other edge seal trench 459.

Each edge seal trench 459 can comprise a first tapered sidewall segment that vertically extends through the first retro-stepped dielectric material portion 165, a second tapered sidewall segment 265 that vertically extends through the second retro-stepped dielectric material portion 265, and a horizontal surface segment connecting a top edge of the first tapered sidewall segment to a bottom edge of the second tapered sidewall segment. Each edge seal trench 459 can have a set of outer sidewalls that define an outer boundary of the respective edge seal trench 459, and a set of inner sidewalls that define an inner boundary of the respective edge seal trench 459. Each outer sidewall of the edge seal trenches 459 can have an upper outer sidewall segment that vertically extends through the at least one contact-level dielectric layer (280, 282) and the second retro-stepped dielectric material portion 265; a lower outer sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper outer sidewall segment and a top periphery of the lower outer sidewall segment. Each inner sidewall of the edge seal trenches 459 can have an upper inner sidewall segment that vertically extends through the at least one contact-level dielectric layer (280, 282) and the second retro-stepped dielectric material portion 265; a lower inner sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper inner sidewall segment and a top periphery of the lower inner sidewall segment.

Figure 17:
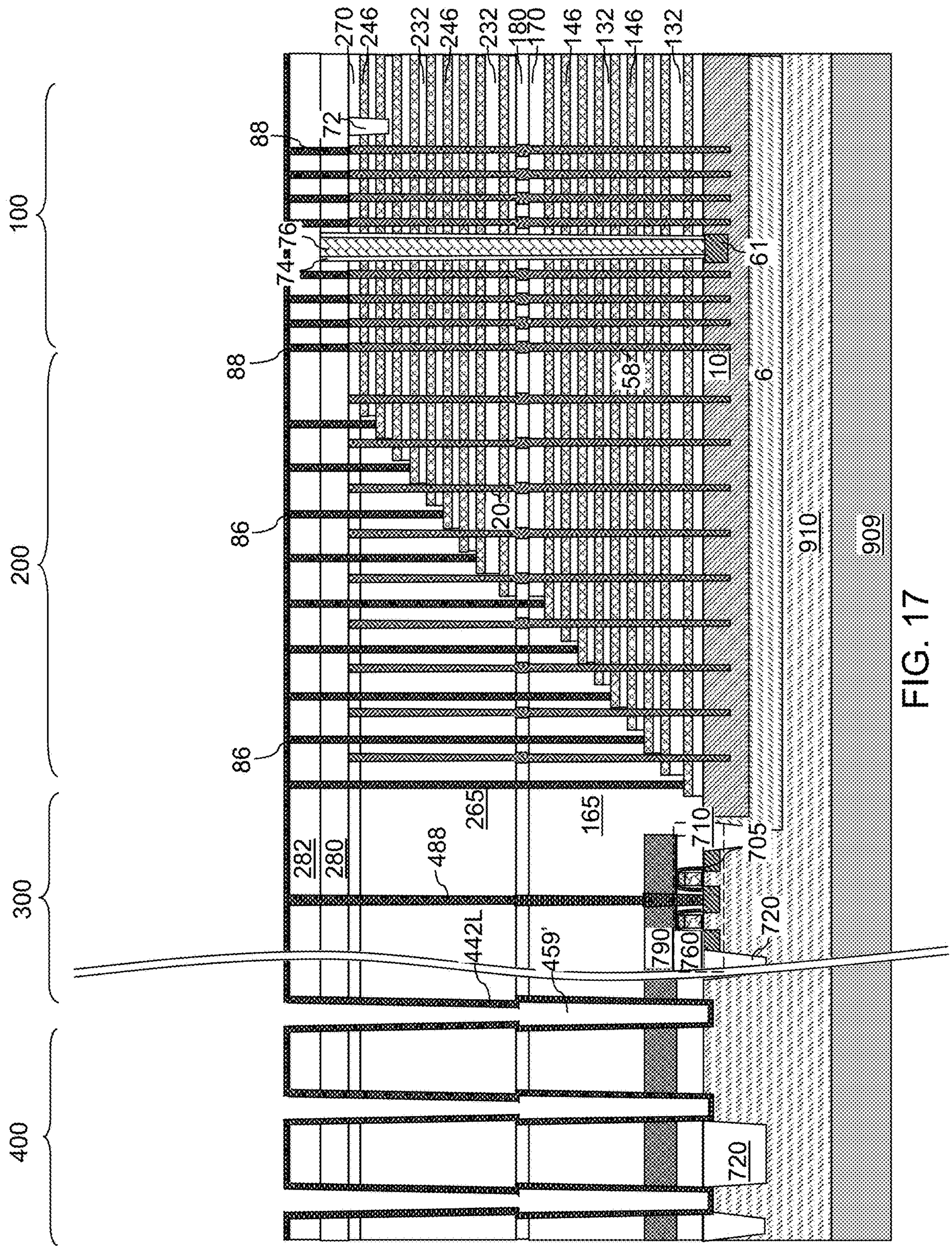
FIG. 17 is a vertical cross-sectional view of a region of the exemplary structure after formation of a metallic material layer according to a first embodiment of the present disclosure.

Referring to FIG. 17, a continuous metallic material layer 442L can be deposited in the various cavities in the exemplary structure. Specifically, the continuous metallic material layer 442L can be deposited in the drain contact via cavities 87, the staircase-region contact via cavities 85, the peripheral via cavities 489, and the edge seal trenches 459 employing a conformal deposition process. In one embodiment, the continuous metallic material layer 442 can include a layer stack of an optional metallic nitride barrier layer and a metallic fill material layer. The metallic nitride barrier layer can include a metallic nitride material such as TiN, TaN, and/or WN, which can be deposited by chemical mechanical vapor (CVD). The metallic nitride barrier layer can be deposited generally conformally, but may have a lesser thickness at the bottom of narrow via cavities such as at the bottom of the peripheral via cavities 489 relative to the upper portions of the various via cavities (87, 85, 489, 459). The thickness of the metallic nitride barrier layer at the horizontal bottom surface of each of the via cavities (87, 85, 489, 459) can be in a range from 5 nm to 200 nm, such as from 10 nm to 100 nm, although lesser and greater thicknesses can also be employed.

The metallic fill material layer can include at least one refractory metal selected from tungsten, molybdenum, niobium, rhenium, tantalum, chromium, hafnium, iridium, osmium, rhodium, ruthenium, titanium, vanadium and/or zirconium. The thickness of the metallic fill material layer can be selected such that each of the drain contact via cavities 87, the staircase-region contact via cavities 85, and the peripheral via cavities 489 is filled with the metallic fill material layer. In one embodiment, the thickness of the metallic fill material layer may be selected such that the each of the edge seal trenches 459 is only partially sealed with the metallic fill material layer. In an illustrative example, the maximum width of each edge seal trench 459 can be in a range from 300 nm to 6,000 nm, such as from 600 nm to 3,000 nm, and the thickness of the metallic fill material layer can be in a range from 120 nm to 2,000 nm, such as from 200 nm to 1,000 nm. Generally, the thickness of the metallic fill material layer can be in a range from 10% to 45% of the maximum width of each edge seal trench 459. Each sublayer within the continuous metallic material layer 442L can be concurrently deposited in each of the via cavities in the exemplary structure (including the edge seal trenches 459 and the peripheral via cavities 489).

The drain contact via cavities 87, the staircase-region contact via cavities 85, and the peripheral via cavities 489 can be completely filled by the continuous metallic material layer 442L. Each portion of the continuous metallic material layer 442L that fills drain contact via cavities 87 constitutes a drain contact via structure 88. Each drain contact via structure 88 can be formed on a top surface of a respective one of the drain regions 63. Each portion of the continuous metallic material layer 442L that fills the staircase-region contact via cavities 85 constitutes a staircase-region contact via structure 86. Each staircase-region contact via structures 86 can be formed on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. Each portion of the continuous metallic material layer 442L that fills the peripheral via cavities 489 constitutes a peripheral contact via structure 488, which contacts a component of a respective one of the semiconductor devices 710 in the peripheral device region 300.

The edge seal trenches 459 are only partially filled with the continuous metallic material layer 442L. The continuous metallic material layer 442L is deposited in peripheral portions of each edge seal trench 459 and over the dielectric material portions (i.e., over the physically exposed sidewall surfaces of) of the first retro-stepped dielectric material portion 165 and the second retro-stepped dielectric material portion 265. An edge seal cavity 459' that vertically extend through the first retro-stepped dielectric material portion 165 and the second retro-stepped dielectric material portion 265 can continuously laterally surround the memory devices located in the memory array region 100.

Figure 18:
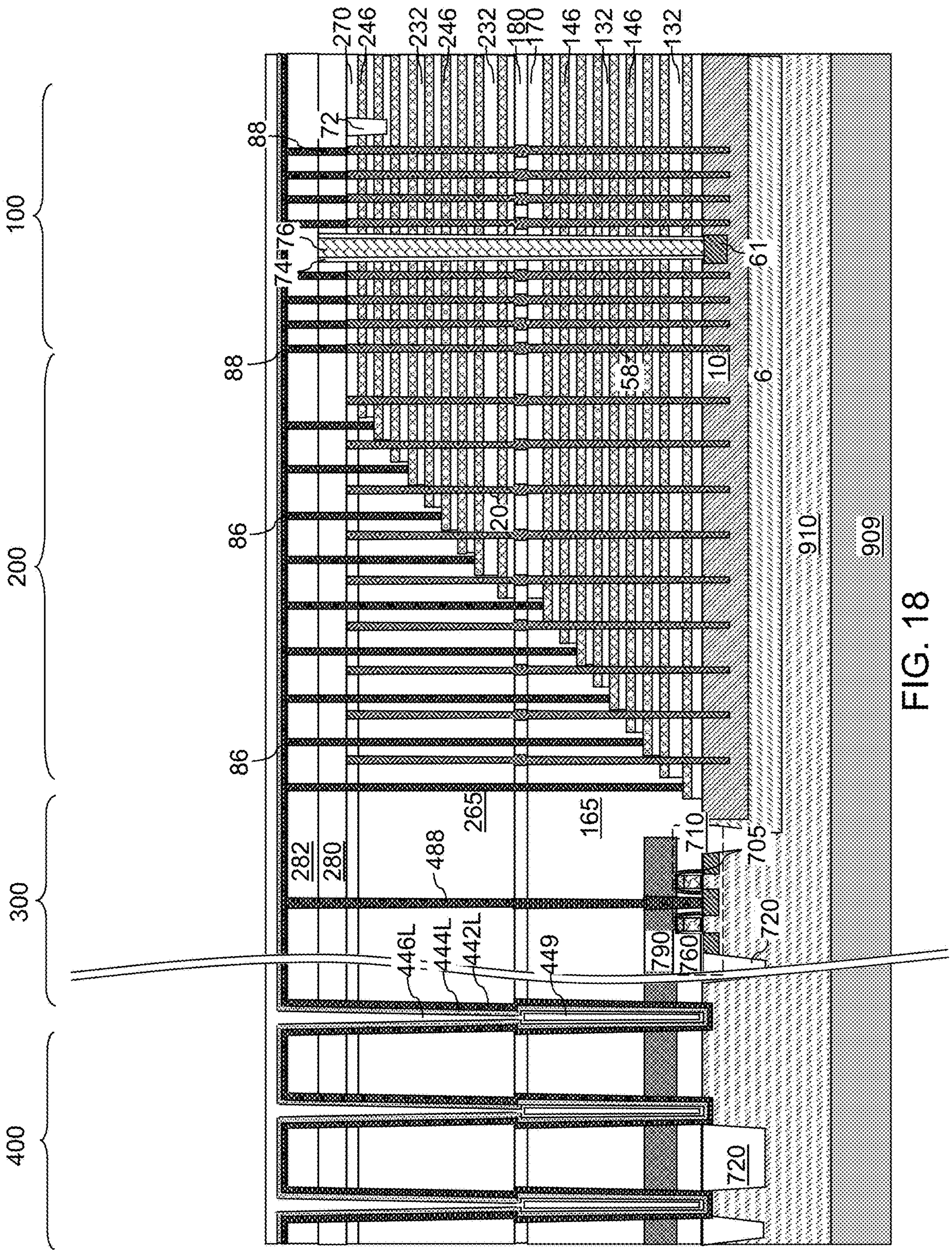
FIG. 18 is a vertical cross-sectional view of a region of the exemplary structure after deposition of a dielectric fill material layer according to a first embodiment of the present disclosure.

Referring to FIG. 18, at least one dielectric fill material layer (444L, 446L) can be deposited in the edge seal cavities 459' and over the physically exposed surfaces of the continuous metallic material layer 442L. The at least one dielectric fill material layer (444L, 446L) may include a single dielectric fill material layer or a plurality of dielectric fill material layers. Each of the at least one dielectric fill material layer (444L, 446L) includes a dielectric fill material such as silicon nitride, silicon oxide, and a dielectric metal oxide. In one embodiment, the at least one dielectric fill material layer (444L, 446L) can include a first dielectric fill material layer 444L and a second dielectric fill material layer 446L. In an illustrative example, the first dielectric fill material layer 444L can include silicon nitride having a thickness in a range from 10 nm to 200 nm, and the second dielectric fill material layer 446L can include silicon oxide. Alternatively, the at least one dielectric fill material layer (444L, 446L) can include a single dielectric fill material layer that includes silicon nitride or silicon oxide.

The total thickness of the at least one dielectric fill material layer (444L, 446L) can be selected such that the at least one dielectric fill material layer (444L, 446L) fills each of the edge seal cavities 459' such that a void is not present at an upper portion of each edge seal trench 459. In one embodiment, an optional ring-shaped void (i.e., air gap) 449 can be present at the level of the first retro-stepped dielectric material portion 165 in one or more of the edge seal trenches 459. In one embodiment, a ring-shaped void 449 can continuously surround all of the semiconductor devices on a semiconductor die. Alternatively, the ring-shaped void 449 may be omitted.

Figure 19A:
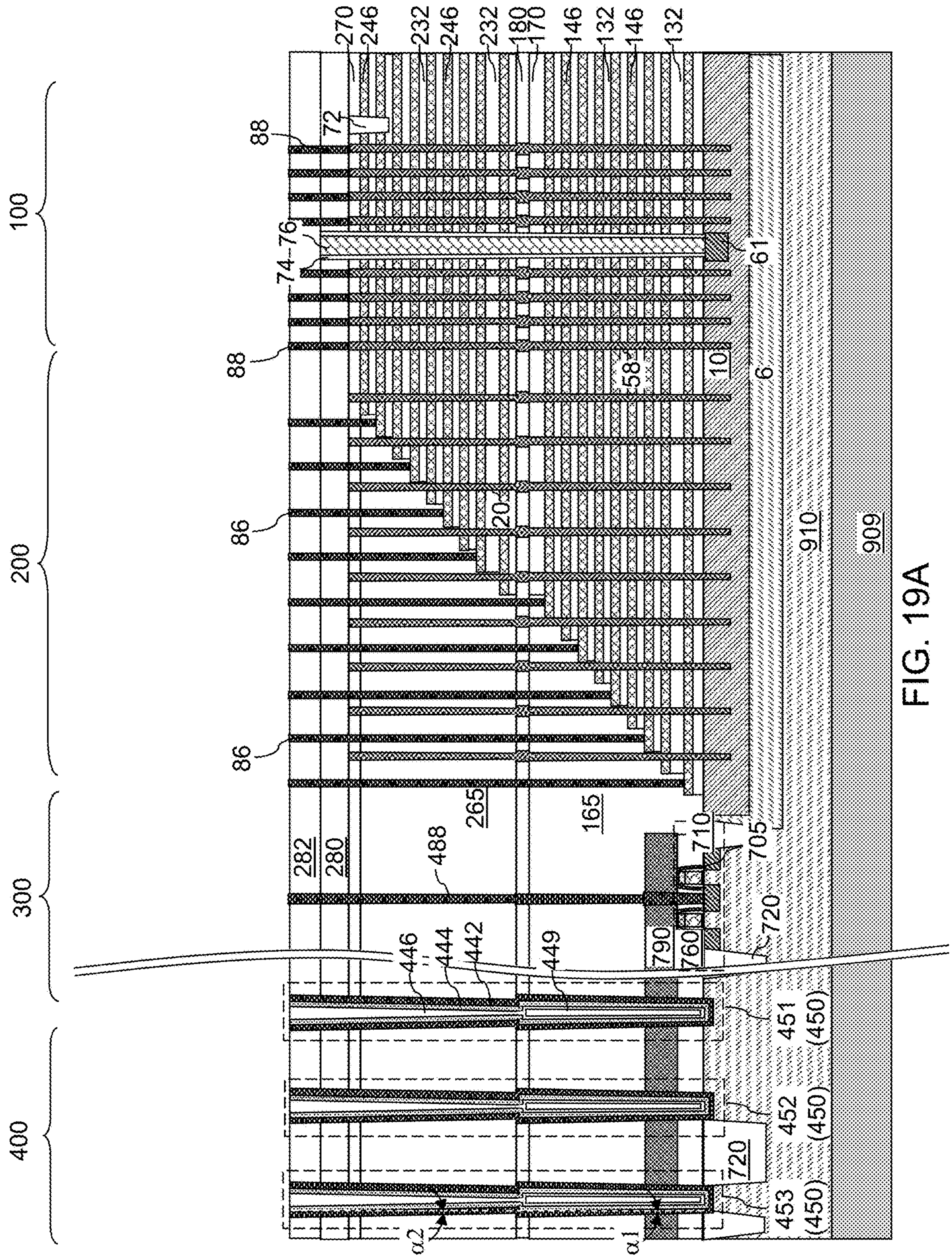
FIG. 19A is a vertical cross-sectional view of a region of the exemplary structure after formation of composite edge seal via structures and contact via structures according to a first embodiment of the present disclosure.
Figure 19B:
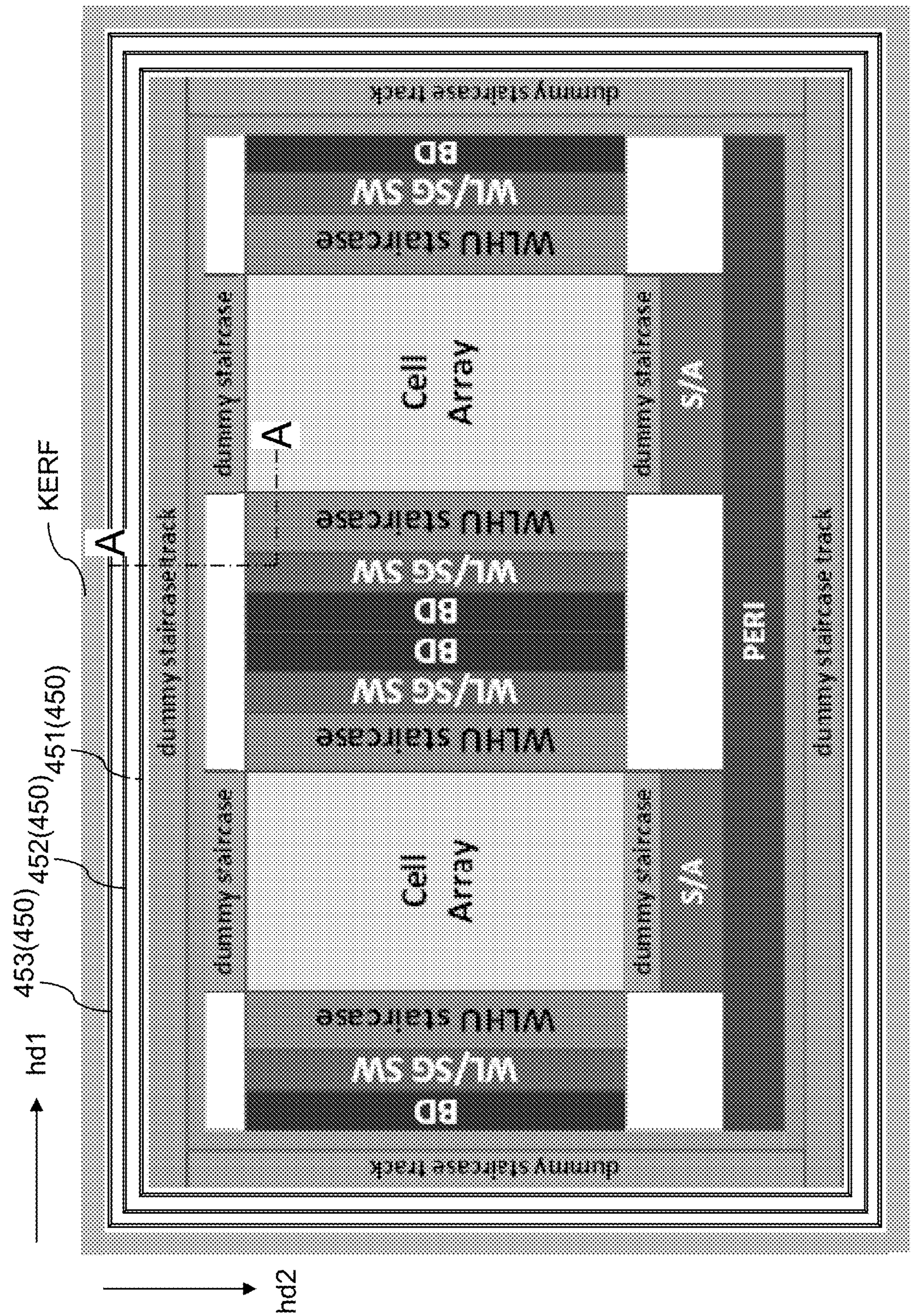
FIG. 19B is a top-down view of a unit die area of the exemplary structure of FIG. 19A.

Referring to FIGS. 19A and 19B, portions of the at least one dielectric fill material layer (444L, 446L) and the continuous metallic material layer 442L located above the edge seal trenches 459 can be removed by a planarization process. For example, the portions of the at least one dielectric fill material layer (444L, 446L) and the continuous metallic material layer 442L located above the horizontal plane including the top surface of the at least one contact-level dielectric layer (280, 282) can be removed by a chemical mechanical planarization process or a recess etch process.

Each drain contact via cavity 87 is filled with a drain contact via structure 88. Each staircase-region contact via cavity 85 is filled with a staircase-region contact via structures 86. Each peripheral via cavities 489 is filled with a peripheral contact via structure 488. Generally, remaining portions of the continuous metallic material layer 442L in the various contact via cavities (87, 85, 489) after removal of the portions of the at least one dielectric fill material layer (444L, 446L) and the metallic material layer 442L from above the contact via cavities (87, 85, 489) comprise contact via structures (88, 86, 488).

Each edge seal trench 459 is filled with a combination of a remaining portion of the continuous metallic material layer 442L, a remaining portion of the at least one dielectric fill material layer (444L, 446L), and a ring-shaped void 449, if present. Each remaining portion of the continuous metallic material layer 442L comprises a metallic material layer 442. Each remaining portion of the at least one dielectric fill material layer (444L, 446L) comprises at least one dielectric fill material portion (444, 446). In one embodiment, the at least one dielectric fill material portion (444, 446) may include a combination of a first dielectric fill material portion 444 which is a remaining portion of a first dielectric fill material layer 444L, and a second dielectric fill material portion 446 which is a remaining portion of a second dielectric fill material layer 446L.

Each contiguous combination of metallic material layer 442, at least one dielectric fill material portion (444, 446), and a ring-shaped void 449, if present, constitutes a composite edge seal via structure 450. A plurality of composite edge seal structures 450 may be formed. For example, the composite edge seal structures 450 may include an inner composite edge seal structure 451, an intermediate composite edge seal structure 452 that laterally surrounds the inner composite edge seal structure 451, and an outer composite edge seal structure 453 that laterally surrounds the intermediate composite edge seal structure 452. Each composite edge seal via structure 450 includes a metallic material layer 442 and at least one dielectric fill material portion (444. 446) that extend through at least one dielectric material portion (such as a combination of the first retro-stepped dielectric material portion 165 and the second retro-stepped dielectric material portion 265). Each metallic material layer 442 is a double wall structure that includes an inner vertical sidewall segment that laterally surrounds, and laterally encloses, the semiconductor devices; an outer vertical sidewall segment that laterally surrounds, and laterally encloses, the at least one dielectric fill material portion (444, 446); and a planar bottom segment that connects bottom portions of the inner vertical sidewall segment of the metallic material layer 442 and the outer vertical sidewall segment of the metallic material layer 442.

In one embodiment, the at least one dielectric material portion (444, 446) in each composite edge seal via structure 450 comprises a plurality of dielectric material portions (444, 446) that are stacked. In one embodiment, the metallic material layer 442 in each composite edge seal via structure 450 has a plurality of tapered sidewalls extending through different dielectric material portions of a plurality of dielectric material portions (such as a first retro-stepped dielectric material portion 165 and a second retro-stepped dielectric material portion 265). The plurality of tapered sidewalls can be adjoined by at least one horizontal stepped surface such as an annular stepped surface located within a horizontal plane including the bottom surface of the second retro-stepped dielectric material portion 265. Each of the at least one horizontal stepped surface is located in a horizontal plane including a bottom surface of a respective dielectric material portion of the plurality of dielectric material portions (such as the first retro-stepped dielectric material portion 165 or the second retro-stepped dielectric material portion 265). While the present disclosure is described employing an embodiment in which two alternating stacks of insulating layers (132, 232) and electrically conductive layers (146, 246) and two retro-stepped dielectric material portions (165, 265) are employed, embodiments are expressly contemplated herein in which one alternating stack and one retro-stepped dielectric material portion are employed, or in which three or more alternating stacks and three or more retro-stepped dielectric material portions are employed.

In one embodiment, the at least one dielectric fill material portion (444, 446) (such as the first dielectric fill material portion 444) has a vertical cross-sectional profile including a pair of stepped tapered outer sidewalls in contact with the metallic material layer 442. Each of the pair of stepped tapered outer sidewalls comprises a first tapered outer sidewall segment having a first taper angle $\alpha 1$ (and located at the level of the first retro-stepped dielectric material portion), a horizontal surface segment adjoined to an upper end of the first tapered outer sidewall, and a second tapered outer sidewall segment having a second taper angle $\alpha 2$ and adjoined to an inner end of the horizontal surface segment (and located at the level of the second retro-stepped dielectric material portion). In one embodiment, the at least one dielectric fill material portion (444, 446) can comprise a ring-shaped void 449 that is free of any solid material and located between a horizontal plane including the horizontal surface segment and the semiconductor substrate 908.

Each composite edge seal via structure 450 can comprise a first tapered sidewall segment that vertically extends through the first retro-stepped dielectric material portion 165, a second tapered sidewall segment 265 that vertically extends through the second retro-stepped dielectric material portion 265, and a horizontal surface segment connecting a top edge of the first tapered sidewall segment to a bottom edge of the second tapered sidewall segment. Each composite edge seal via structure 450 can have a set of outer sidewalls that define an outer boundary of the respective edge seal trench 459, and a set of inner sidewalls that define an inner boundary of the respective edge seal trench 459. Each outer sidewall of the composite edge seal via structure 450 can have an upper outer sidewall segment that vertically extends through the at least one contact-level dielectric layer (280, 282) and the second retro-stepped dielectric material portion 265; a lower outer sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper outer sidewall segment and a top periphery of the lower outer sidewall segment. Each inner sidewall of the composite edge seal via structure 450 can have an upper inner sidewall segment that vertically extends through the at least one contact-level dielectric layer (280, 282) and the second retro-stepped dielectric material portion 265; a lower inner sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper inner sidewall segment and a top periphery of the lower inner sidewall segment.

Figure 20:
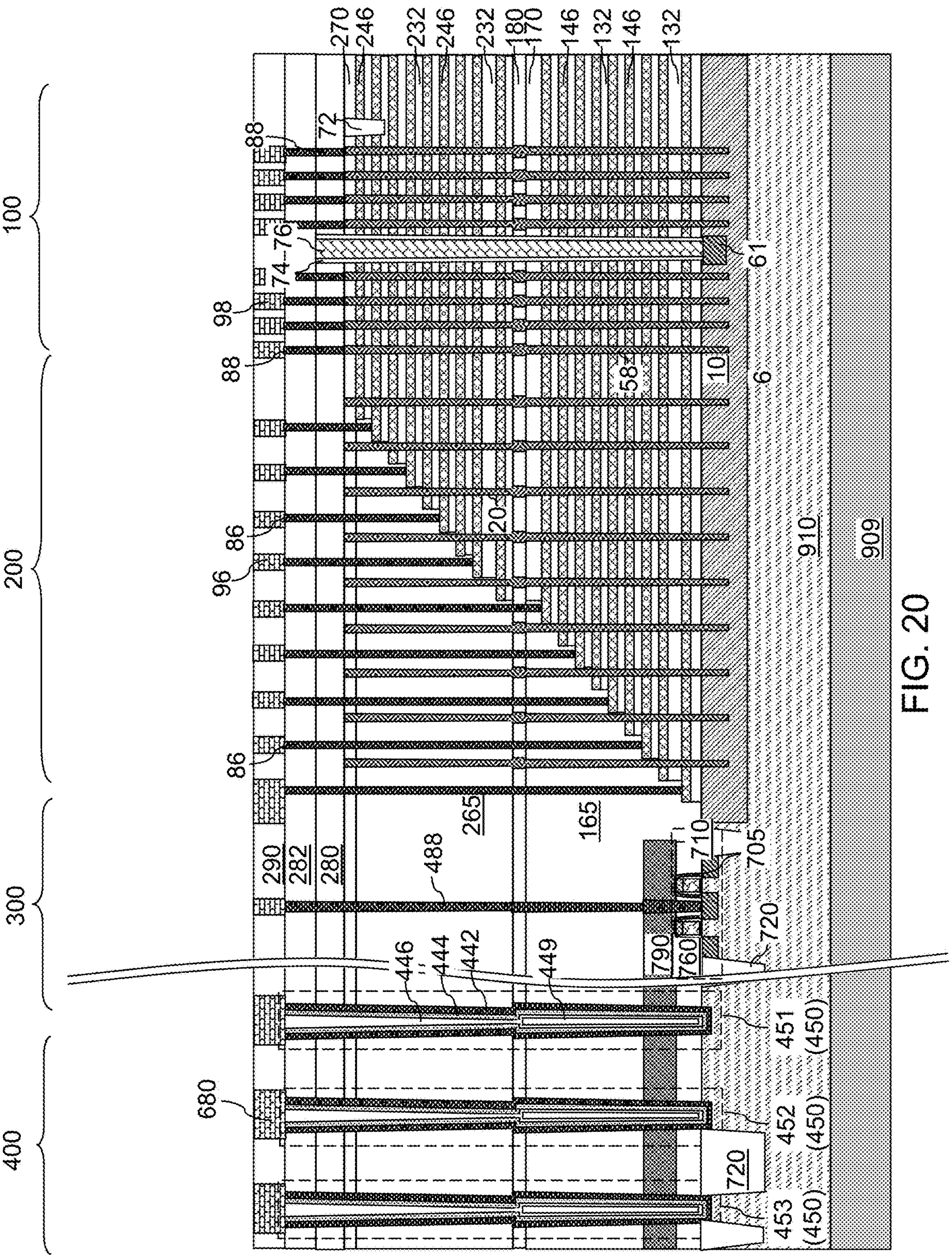
FIG. 20 is a vertical cross-sectional view of a region of the exemplary structure after formation of a first line-level dielectric layer and first metal lines according to a first embodiment of the present disclosure.

Referring to FIG. 20, a bit-line-level dielectric layer 290 can be formed over the contact-level dielectric layers (280, 282). Bit-line-level metal interconnect structures (98, 96) can be formed in the bit-line-level dielectric layer 290. The bit-line-level metal interconnect structures (98. 96) may include bit lines 98 contacting a respective one of the drain contact via structures 88, and interconnection line structures 96 contacting, and/or electrically connected to, at least one of the staircase-region contact via structures 86 and/or the peripheral contact via structures 488. Metal barrier structures 680 can be formed on a top surface of a respective one of the composite edge seal via structures 450.

Figure 21A:
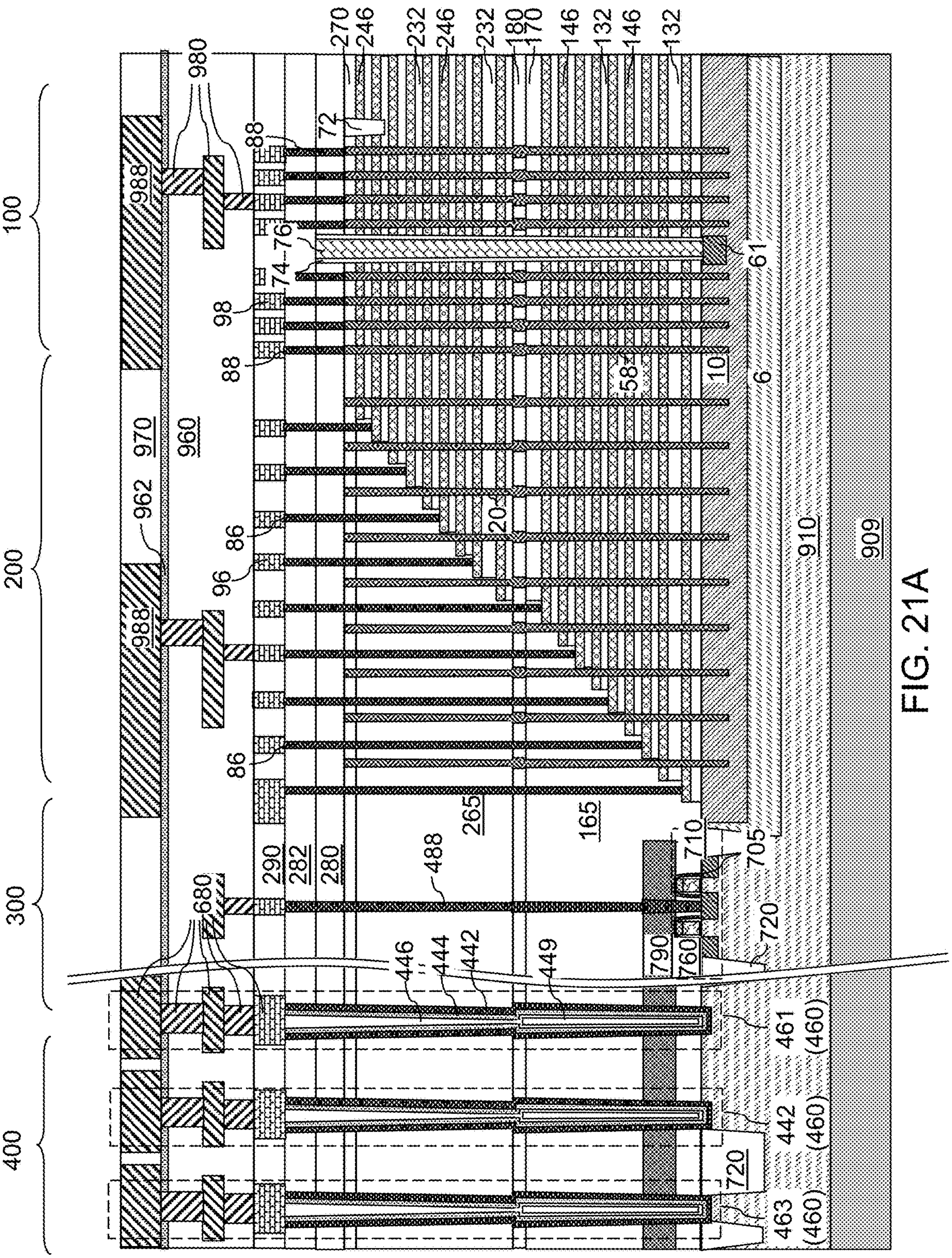
FIG. 21A is a vertical cross-sectional view of a region of the exemplary structure after formation of additional metal interconnect structures embedded in additional interconnect-level dielectric material layers according to a first embodiment of the present disclosure.
Figure 21B:
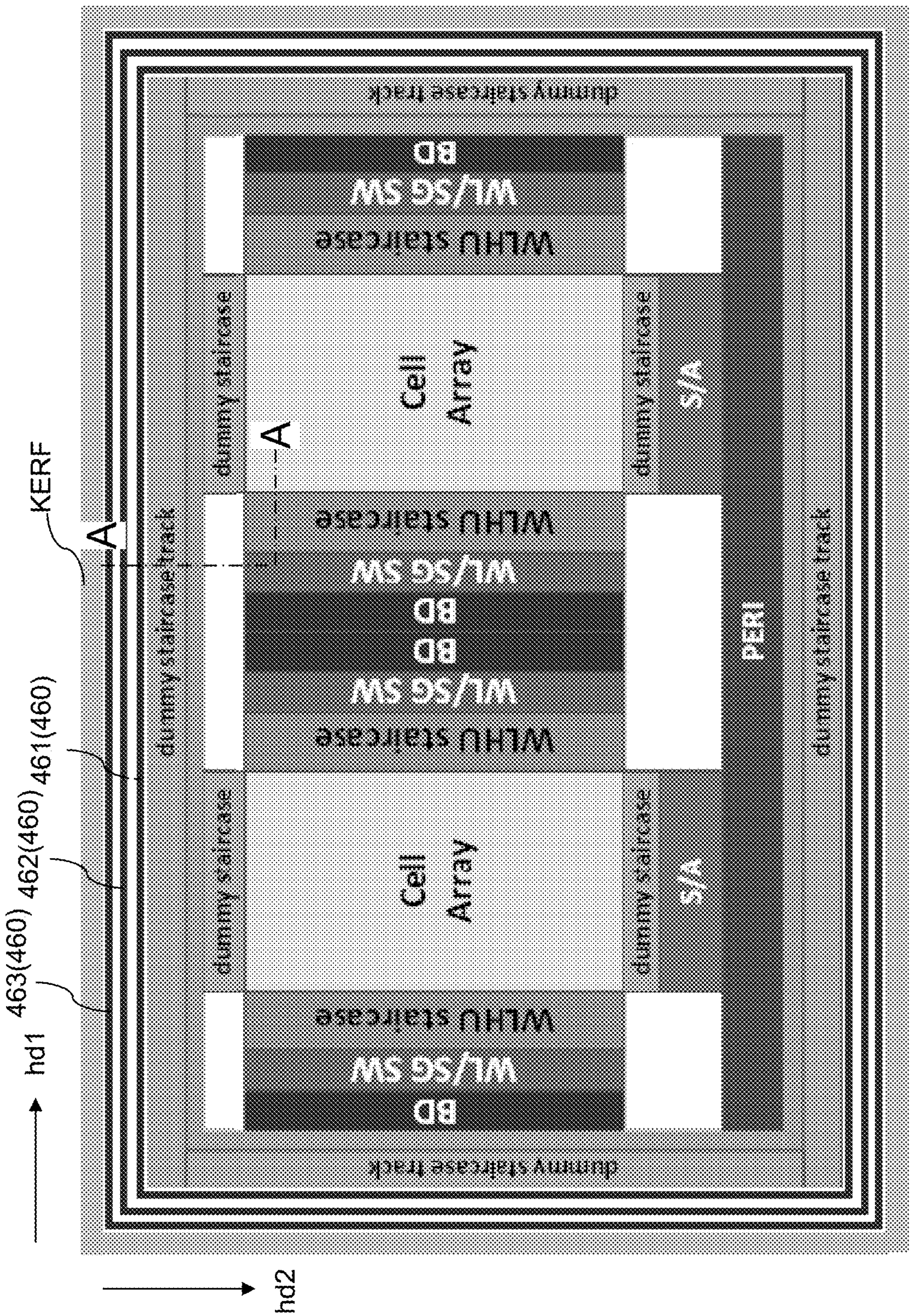
FIG. 21B is a top-down view of a unit die area of the exemplary structure of FIG. 21A.

Referring to FIGS. 21A and 21B, interconnect-level dielectric material layers 960 can be formed above the bit-line-level dielectric layer 290. Each of the interconnect-level dielectric material layers 960 can include an interconnect-level dielectric material such as undoped silicate glass, a doped silicate glass, or porous or nonporous organosilicate glass. A diffusion barrier dielectric material layer 962 can be optionally formed above the interconnect-level dielectric material layer 960. For example, the diffusion barrier dielectric material layer 962 can include a dielectric diffusion barrier material such as silicon nitride or silicon carbide nitride. A pad-level dielectric layer 970 can be formed over the diffusion barrier dielectric material layer 962. The pad-level dielectric layer 970 can include silicon oxide, and can have a thickness in a range from 500 nm to 5,000 nm, although lesser and greater thicknesses can also be employed.

The interconnect-level dielectric material layers 960 can embed metal interconnect structures 980 that are electrically connected to the bit-line-level metal interconnect structures (98, 96). The pad-level dielectric layer 970 can embed bonding pads 988, which can be metallic bonding pads that can be subsequently employed for C4 bonding, wire bonding, or metal-to-metal bonding. The interconnect-level dielectric material layers 960 and the pad-level dielectric layer 970 can embed metal barrier structures 680. Each of the metal barrier structures 680 can be a line-level structure or a via-level structure having an annular shape and contacting an underlying composite edge seal via structure 450 or contacting an underlying metal barrier structure 680.

Each contiguous set of an edge seal via structure 450 and metal barrier structure 680 constitutes an edge seal ring structure 460. Each of the at least one edge seal ring structure 460 continuously extends from a topmost surface of interconnect-level dielectric material layers 960 to a top surface of the semiconductor substrate 908, and may continuously extend from a top surface of the pad-level dielectric layer 970 to the top surface of the semiconductor substrate 908. Each of the at least one edge seal ring structure 460 comprises a respective one of the at least one composite edge seal via structure 450 and a respective set of metal barrier structures 680 that is adjoined to the respective one of the at least one composite edge seal via structure 460. Each edge seal ring structure 460 can laterally surround the entirety of the semiconductor devices of a respective semiconductor die as a continuous wall structure without any lateral opening between the horizontal plane including the top surface of the semiconductor substrate 908 and the topmost surface of the interconnect-level dielectric material layer 960. The edge seal ring structure 460 can comprise a plurality of edge seal ring structures 460. For example, the plurality of edge seal ring structures 460 may include an inner edge seal ring structure 461, an intermediate edge seal ring structure 462 that laterally surrounds the inner edge seal ring structure 461, and an outer edge seal ring structure 463 that laterally surrounds the intermediate edge seal ring structure 462. The plurality of edge seal ring structures 460 can include multiple nested edge seal ring structures in which each edge seal ring structure 460 laterally surrounds, or is laterally surrounded by, any other of the multiple nested edge seal ring structures 460.

Figure 22:
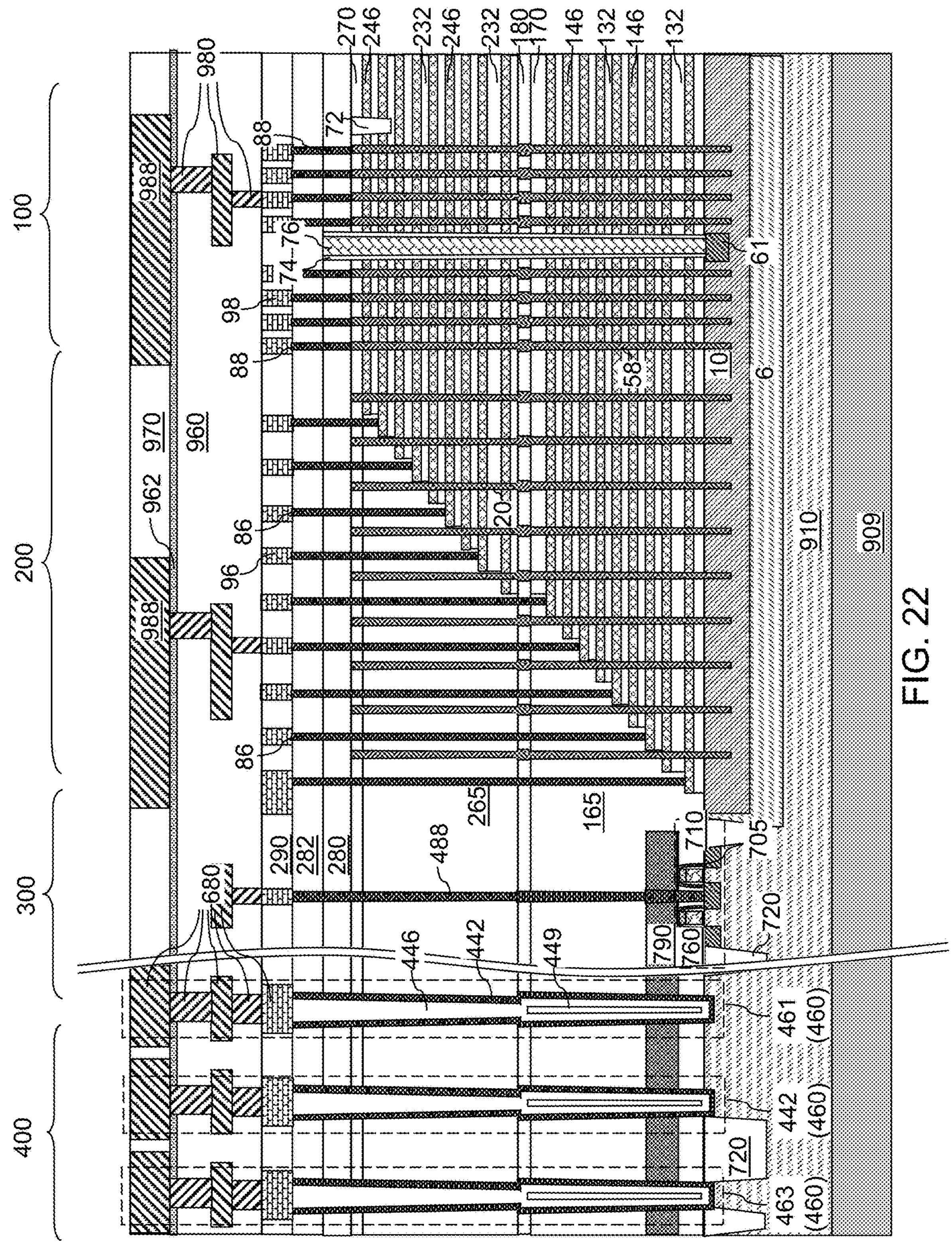
FIG. 22 is a vertical cross-sectional view of a region of an alternative embodiment of the exemplary structure according to a first embodiment of the present disclosure.

Referring to FIG. 22, an alternative embodiment of the exemplary structure according to an embodiment of the present disclosure can be derived from the exemplary structure of FIGS. 21A and 21B by employing a single dielectric fill material portion 446 in lieu of a stack of a first dielectric fill material portion 444 and a second dielectric fill material portion 446. The dielectric fill material portion 446 can include a dielectric material such as silicon oxide or silicon nitride.

In the first embodiment, the double walled structure of the metallic material layer 442 and the dielectric fill material portion (446 and optionally 444) reduce or prevent outgassing of fluorine used to deposit the metallic material layer (e.g., tungsten layer) 442, because the dielectric fill material portion fills any open top seam in the metallic material layer 442. This reduces or prevents layer delamination due to fluorine outgassing. Additional layers may be formed in the exemplary structure of the first embodiment, as shown in FIG. 29F and as will be described in more detail below.

Referring to FIGS. 1-22 and 29F, a semiconductor die is provided, which comprises: semiconductor devices located over a substrate 908; at least one dielectric material portion (165, 265) that laterally surrounds the semiconductor devices; interconnect-level dielectric material layers 960 that overlie the semiconductor devices and the at least one dielectric material portion (165, 265) and embedding metal interconnect structures 980; and at least one edge seal ring structure 460. Each of the at least one edge seal ring structure 460 continuously extends from a topmost surface of interconnect-level dielectric material layers 960 to a top surface of the substrate 908.

Each edge seal ring structure 460 contains a composite edge seal via structure (442, 444, 446, 449) which includes a metallic material layer 442 and a dielectric fill material portion (444, 446). The metallic material layer 442 includes an inner vertical sidewall segment that laterally surrounds, and laterally encloses, the semiconductor devices (e.g., the memory devices including the alternating stacks and memory opening fill structures); an outer vertical sidewall segment that laterally surrounds, and laterally encloses, the dielectric fill material portion (444, 446); and a planar bottom segment that connects bottom portions of the inner vertical sidewall segment of the metallic material layer and the outer vertical sidewall segment of the metallic material layer.

A set of metal barrier structures 680 is adjoined to a respective composite edge seal via structure (442, 444, 446, 449), and contiguously extends from a top surface of the composite edge seal via structure (442, 444, 446, 449) at least to a horizontal plane including the topmost surface of the interconnect-level dielectric material layers 960, and may extend to a top surface of the pad-level dielectric layer 970.

In one embodiment, the set of metal barrier structures 680 can comprise a vertical stack of at least two line-level metal rings and at least one via-level metal ring. Each line-level metal ring is a metal ring formed at a line level, and each via-level metal ring is a metal ring formed at a via level. A bottommost one of the at least two line-level metal rings contacts an entirety of a top surface of the composite edge seal structure. In one embodiment, a bottom surface of the bottommost one of the at least two line-level metal rings directly contacts an entirety of a top surface of the at least one dielectric fill material portion (444, 446) and an entirety of a top surface of the metallic material layer 442.

In one embodiment, the at least one dielectric material portion (165, 265) comprises a plurality of dielectric material portions (165, 265) that are stacked; and the metallic material layer 442 has a plurality of tapered sidewalls adjoined by at least one horizontal stepped surface and extending through different dielectric material portions (165, 265) of the plurality of dielectric material portions (165, 265).

In one embodiment, each of the at least one horizontal stepped surface is located in a horizontal plane including a bottom surface of a respective dielectric material portion (such as a bottom surface of the second retro-stepped dielectric material portion 265) of the plurality of dielectric material portions 265.

In one embodiment, the semiconductor devices comprise: a first alternating stack of first insulating layers 132 and first electrically conductive layers 146 and laterally contacting a first one of the plurality of dielectric material portions (such as the first retro-stepped dielectric material portion 165); a second alternating stack of second insulating layers 232 and second electrically conductive layers 246 and laterally contacting a second one of the plurality of dielectric material portions (such as the second retro-stepped dielectric material portion 265); and memory stack structures 55 vertically extending through the first alternating stack (132, 146) and the second alternating stack (232, 246) and including a respective vertical semiconductor channel 60 and a respective vertical stack of memory elements. In one embodiment, the plurality of dielectric material portions comprises: a first retro-stepped dielectric material portion 165 contacting first stepped surfaces of the first alternating stack (132, 146); and a second retro-stepped dielectric material portion 265 contacting second stepped surfaces of the second alternating stack (242. 246).

In one embodiment, the metallic material layer 442 comprises at least one refractory metal selected from molybdenum, niobium, rhenium, tantalum, tungsten, chromium, hafnium, iridium, osmium, rhodium, ruthenium, titanium, vanadium and/or zirconium. In one embodiment, the dielectric fill material portion (444, 446) comprises a material selected from silicon nitride, silicon oxide, and/or a dielectric metal oxide.

In one embodiment, the dielectric fill material portion (444, 446) has a vertical cross-sectional profile including a pair of stepped tapered outer sidewalls in contact with the metallic material layer 442; and each of the pair of stepped tapered outer sidewalls comprises a first tapered outer sidewall segment having a first taper angle $\alpha\mathbf{1}$, a horizontal surface segment adjoined to an upper end of the first tapered outer sidewall, and a second tapered outer sidewall segment having a second taper angle $\alpha\mathbf{2}$ and adjoined to an inner end of the horizontal surface segment. In one embodiment, the dielectric fill material portion (444, 446) encapsulates a ring-shaped void 449 that is free of any solid material and located between a horizontal plane including the horizontal surface segment and the substrate 908.

A silicon nitride diffusion barrier structure (705, 790) can be provided, which comprises: a silicon nitride diffusion barrier layer 790 underlying the at least one dielectric material portion (165, 265) and overlying the substrate 908 and continuously extending around a periphery of the semiconductor die; and at least one silicon nitride spacer 705 vertically extending between a bottom surface of the silicon nitride diffusion barrier layer 790 and the substrate 908. The at least one edge seal ring structure 460 vertically extends through the silicon nitride diffusion barrier layer 790 and divides the silicon nitride diffusion barrier layer 790 into multiple physically disjoined portions.

In one embodiment, the at least one edge seal ring structure 460 comprises multiple nested edge seal ring structures 460 in which each edge seal ring structure 460 laterally surrounds, or is laterally surrounded by, any other of the multiple nested edge seal ring structures 460.

In one embodiment, the set of metal barrier structures 680 comprises a vertical stack of at least two line-level metal rings and at least one via-level metal ring; and a bottommost one of the at least two line-level metal rings contacts an entirety of a top surface of the composite edge seal structure 450. In one embodiment, a bottom surface of the bottommost one of the at least two line-level metal rings directly contacts an entirety of a top surface of the dielectric fill material portion (444, 446) and an entirety of a top surface of the metallic material layer 442.

Figure 27:
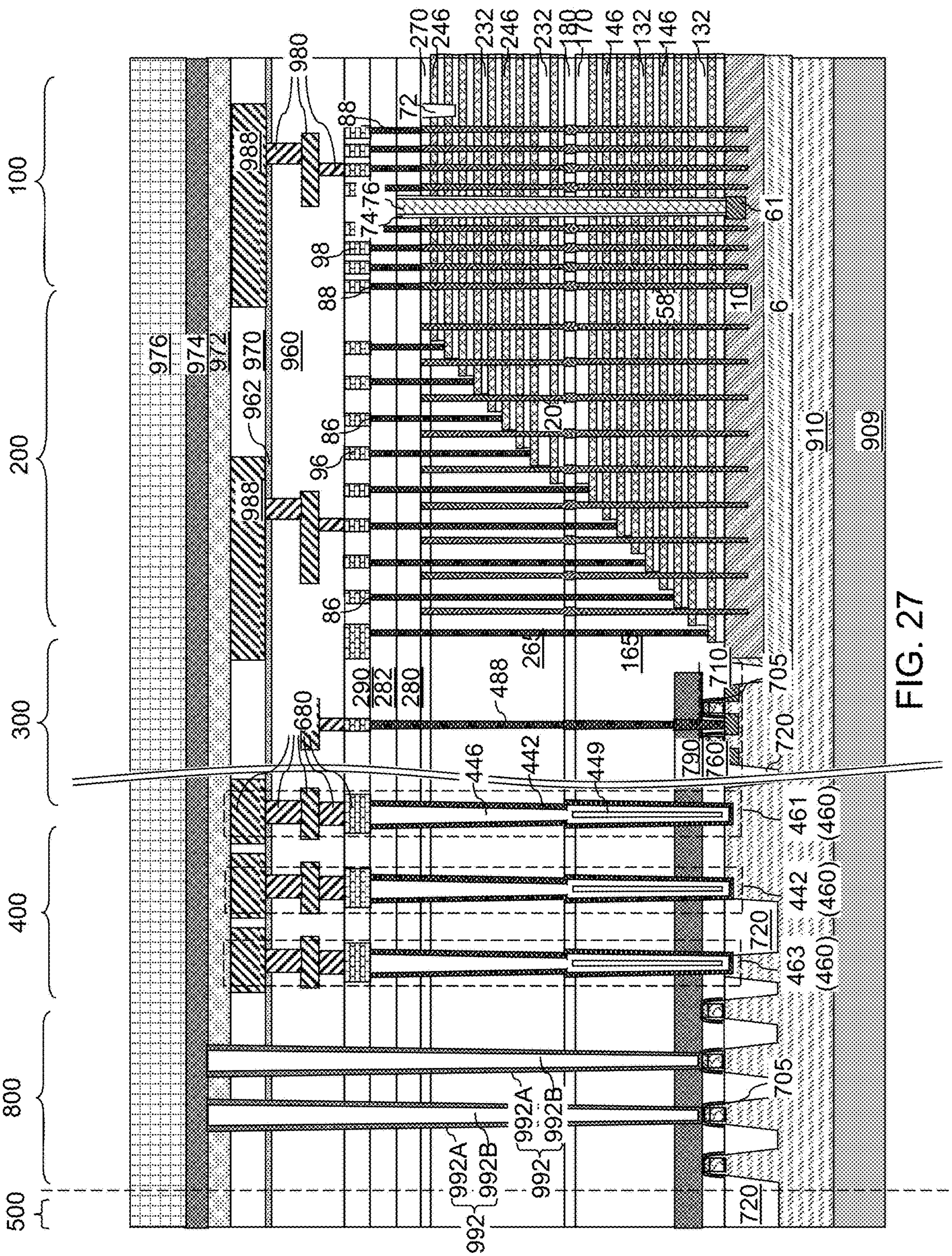
FIG. 27 is a vertical cross-sectional view of a region of the exemplary structure after formation of an optional silicon nitride cap layer and a polyimide layer according to a second embodiment of the present disclosure.
Figure 28:
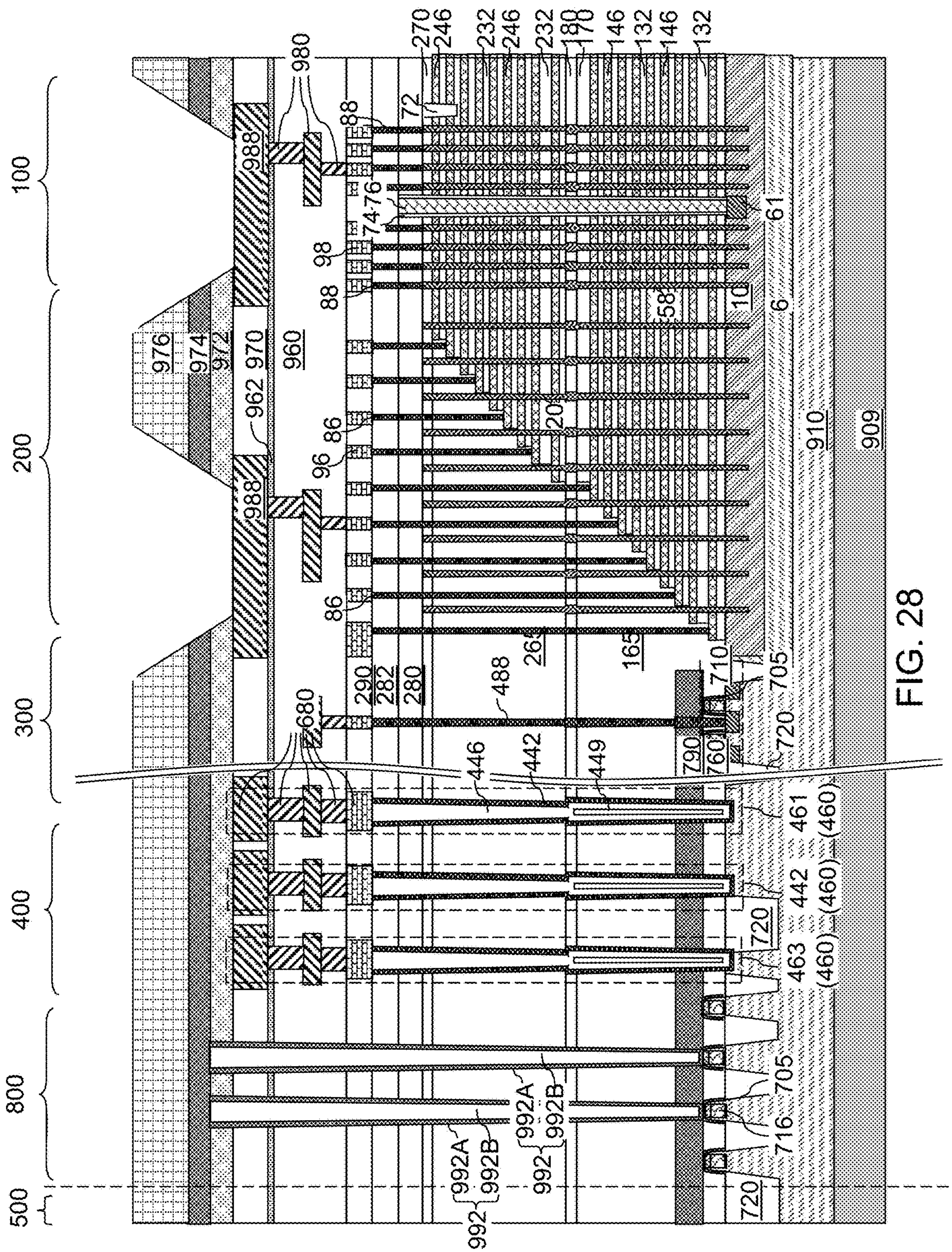
FIG. 28 is a vertical cross-sectional view of a region of the exemplary structure after formation of openings through the polyimide layer and the silicon nitride cap layer according to a second embodiment of the present disclosure.
Figure 29A:
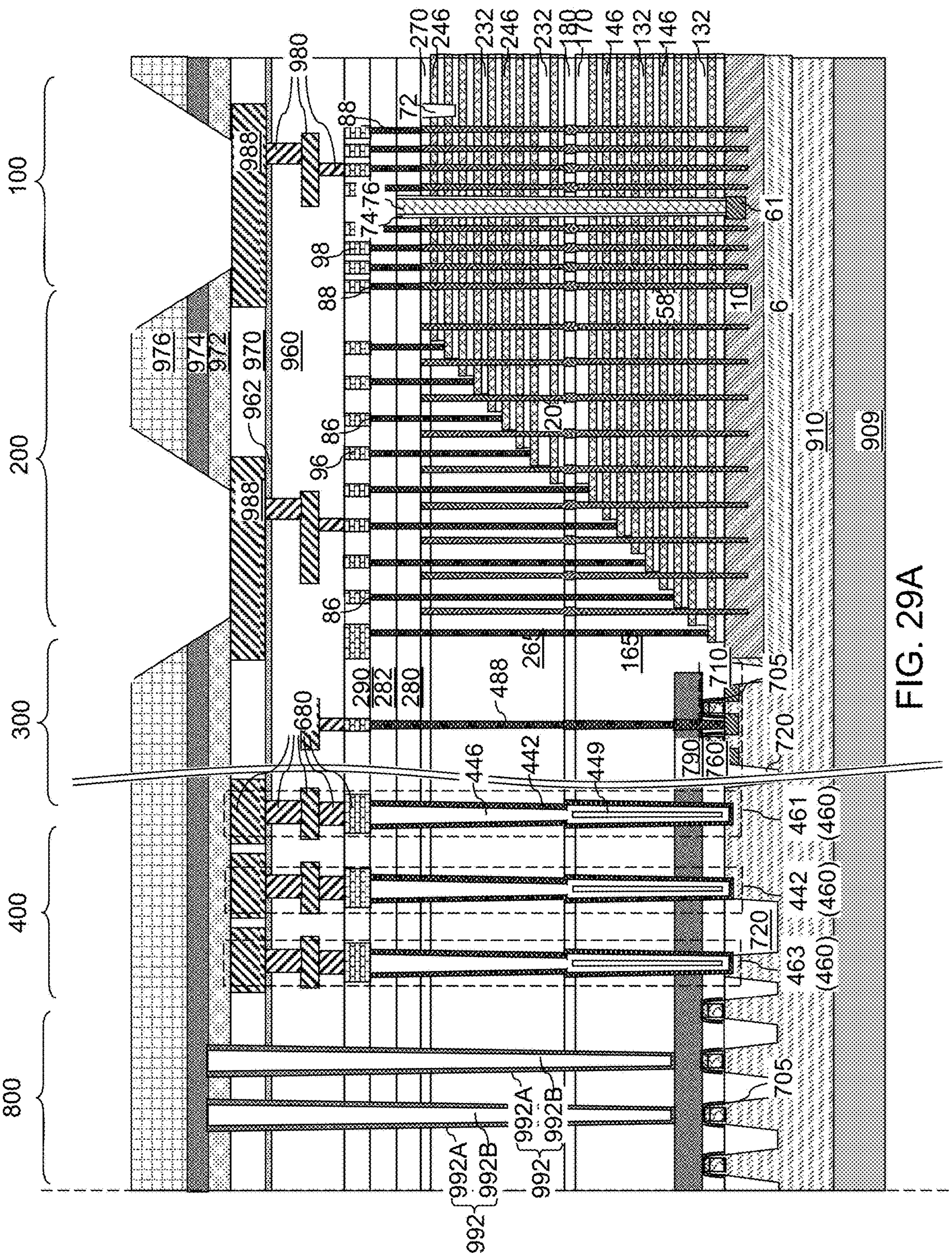
FIG. 29A is a vertical cross-sectional view of a region of a first configuration of a semiconductor die after dicing according to a second embodiment of the present disclosure.
Figure 29B:
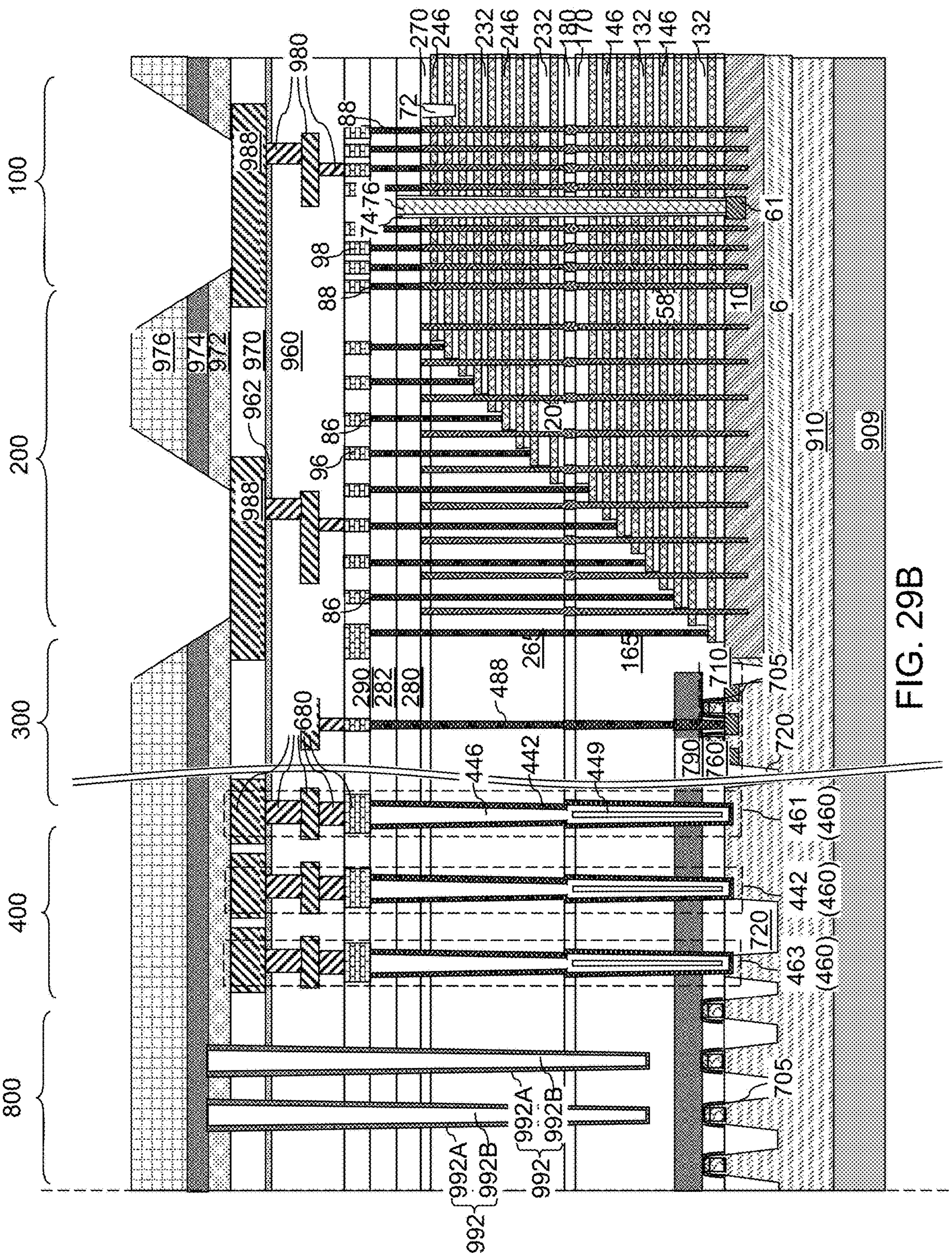
FIG. 29B is a vertical cross-sectional view of a region of a second configuration of a semiconductor die after dicing according to a second embodiment of the present disclosure.
Figure 29C:
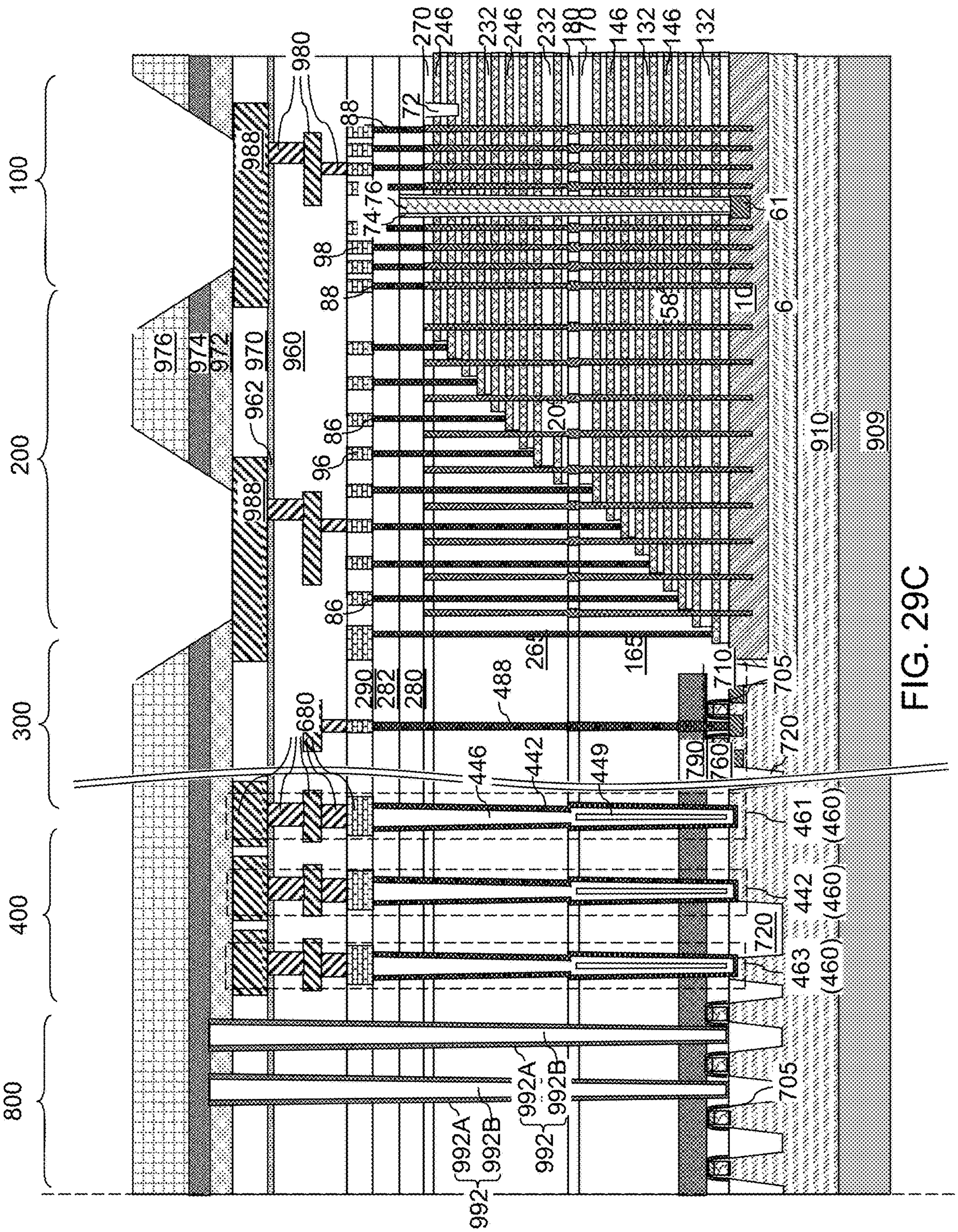
FIG. 29C is a vertical cross-sectional view of a region of a third configuration of a semiconductor die after dicing according to a second embodiment of the present disclosure.
Figure 29D:
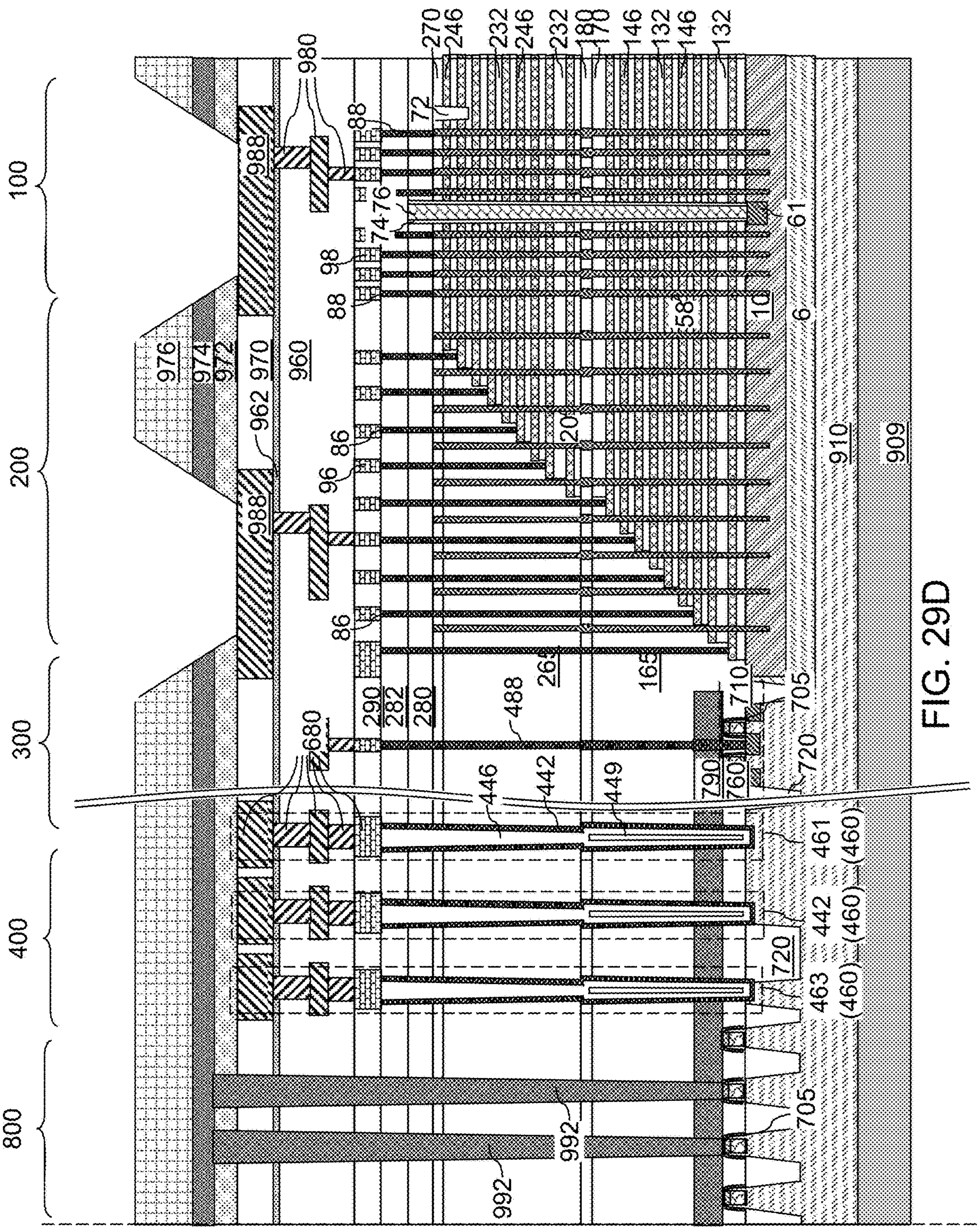
FIG. 29D is a vertical cross-sectional view of a region of a fourth configuration of a semiconductor die after dicing according to a second embodiment of the present disclosure.
Figure 29E:
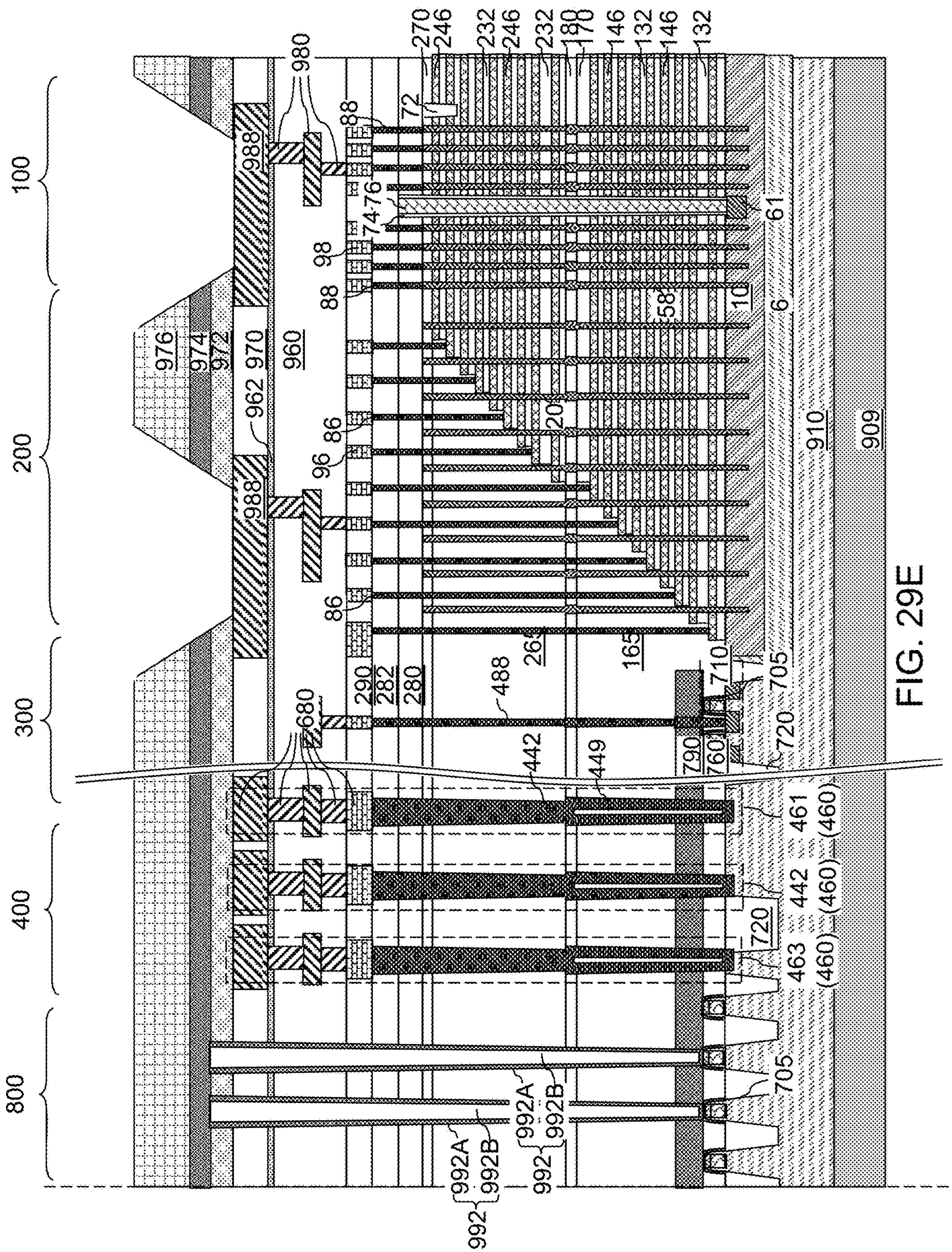
FIG. 29E is a vertical cross-sectional view of a region of a fifth configuration of a semiconductor die after dicing according to a second embodiment of the present disclosure.
Figure 29F:
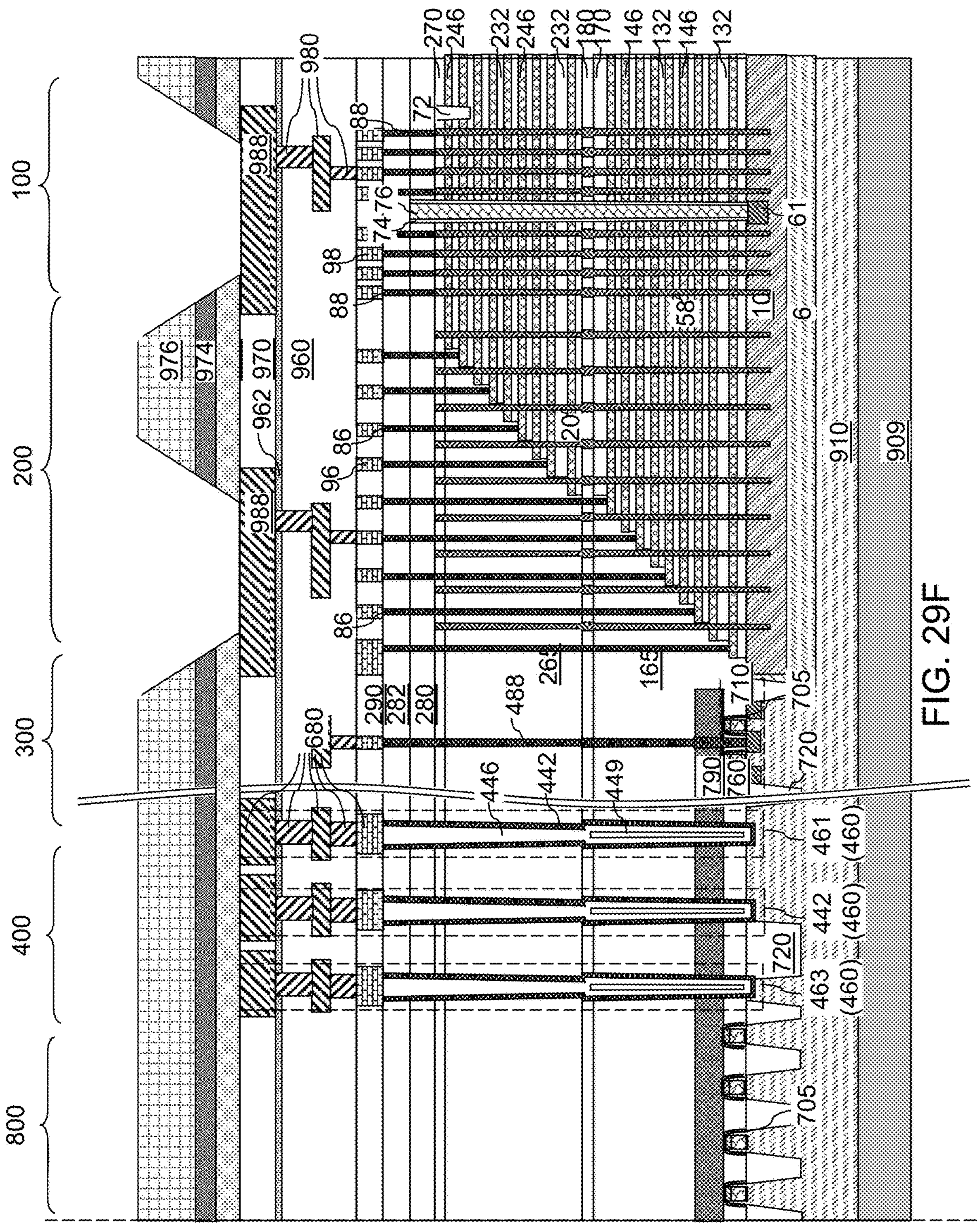
FIG. 29F is a vertical cross-sectional view of a region of a sixth configuration of a semiconductor die after dicing according to the first embodiment of the present disclosure.

FIGS. 23-29E illustrate a second exemplary structure containing a slit ring structure 992 according to a second embodiment of the present disclosure. The second exemplary structure may include the double wall edge seal ring structure 460 of the first embodiment, as shown in FIG. 29A, or a single wall edge seal ring structure, as shown in FIG. 29E. The at least one slit ring structure 992 may laterally surround the semiconductor devices and the at least one edge seal ring structure 460. The at least one slit ring structure 992 comprises at least one dielectric material and continuously extends through the interconnect-level dielectric material layers into the at least one dielectric material portion 165.

Figure 23:
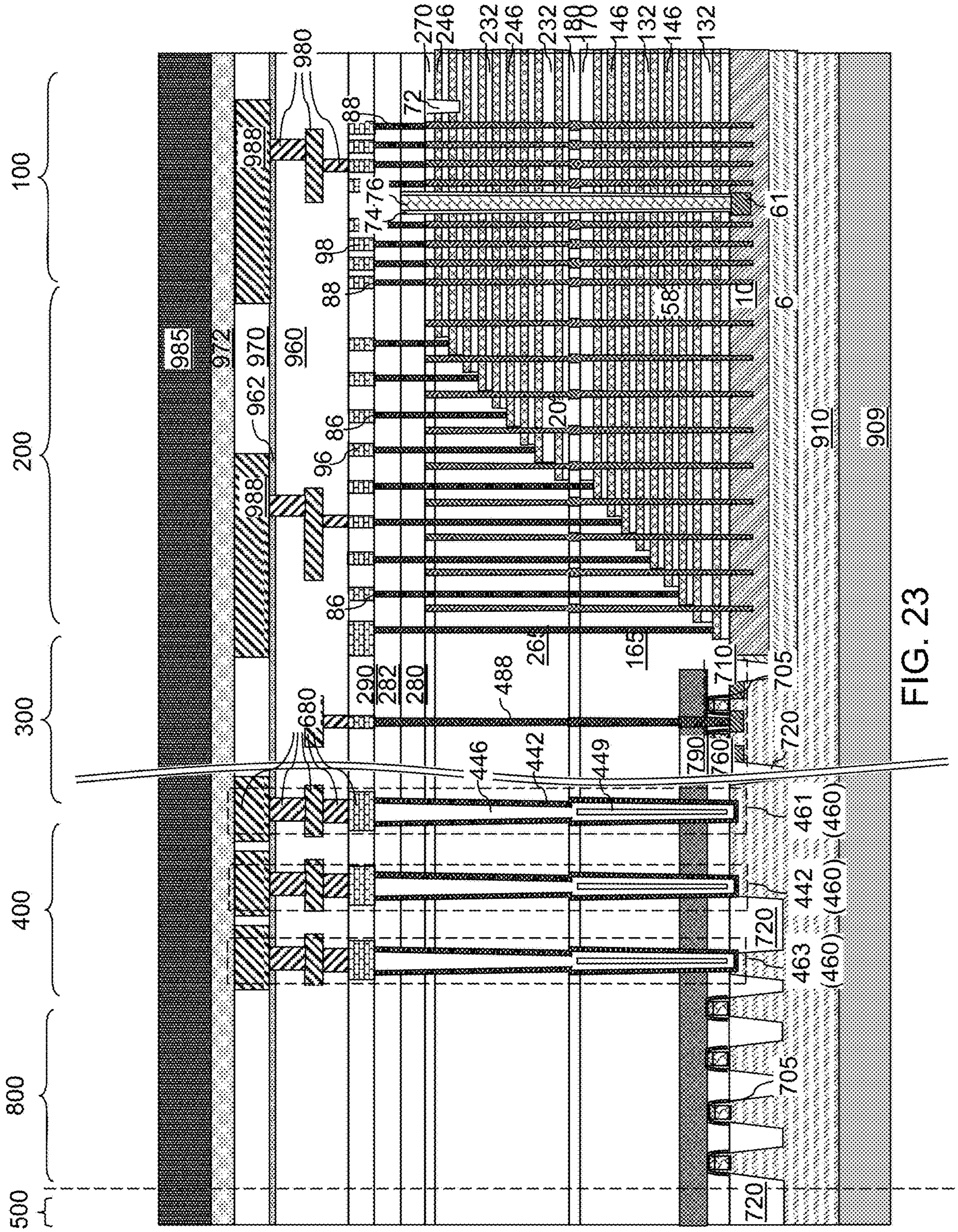
FIG. 23 is a vertical cross-sectional view of a region of the exemplary structure after formation of an optional dielectric cap layer and a hard cover film according to a second embodiment of the present disclosure.

Referring to FIG. 23, a silicon nitride passivation layer 972 and a hard cover film (i.e., hard mask) 985 can be deposited over the pad-level dielectric layer 970 of the exemplary structure of FIG. 22. The silicon nitride passivation layer 972 can include a dielectric diffusion blocking material that either consists of silicon nitride (e.g., $Si_3N_4$) or includes doped silicon nitride, such as silicon carbide nitride (i.e., carbon containing silicon nitride). The thickness of the silicon nitride passivation layer 972 can be in a range from 50 nm to 500 nm, although lesser and greater thicknesses can also be employed. The hard cover film 985 includes a material that can enhance pattern definition during a subsequent anisotropic etch process. For example, the hard cover film 985 can include Advanced Patterning Film™ that includes amorphous carbon and commercially available from Applied Materials, Inc®. Alternatively, the hard cover film 985 can include a stacked-mask process (SMAP) layer stack, which can include, from bottom to top, a spin-on carbon layer having high carbon content and low oxygen content, a spin-on glass (SOG) layer, and a thin resist layer. The silicon nitride passivation layer 972 and the hard cover film 985 can cover the entire area of the exemplary structure including the areas of the memory array region 100, the staircase region 200, the peripheral device region 300, the edge seal ring region 400, the kerf region 500, and a slit ring region 800 that is provided between the outer periphery of the edge seal ring region 400 and the inner periphery of the kerf region 500.

Figure 24A:
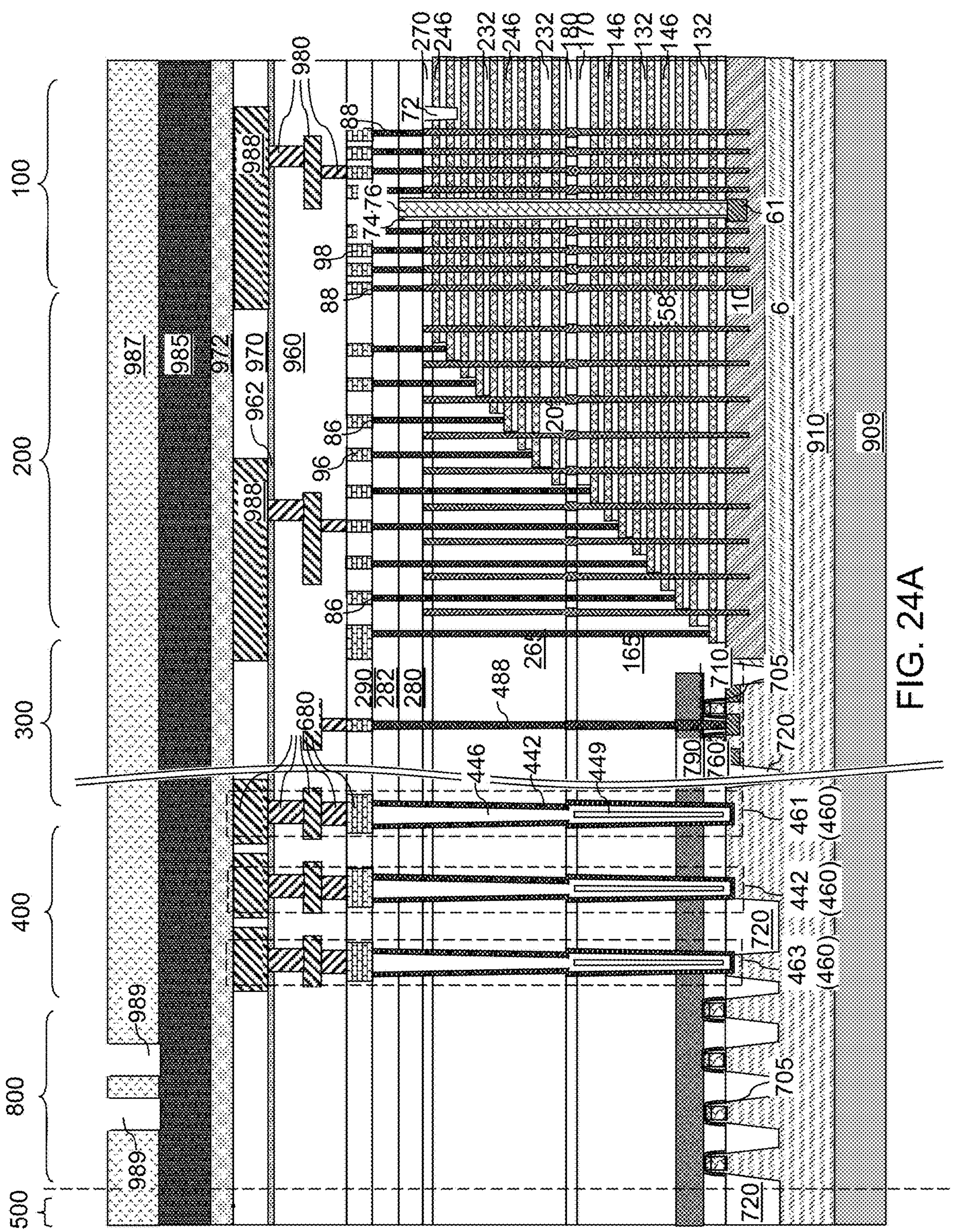
FIG. 24A is a vertical cross-sectional view of a region of the exemplary structure after application and lithographic patterning of a photoresist layer according to a second embodiment of the present disclosure.
Figure 24B:
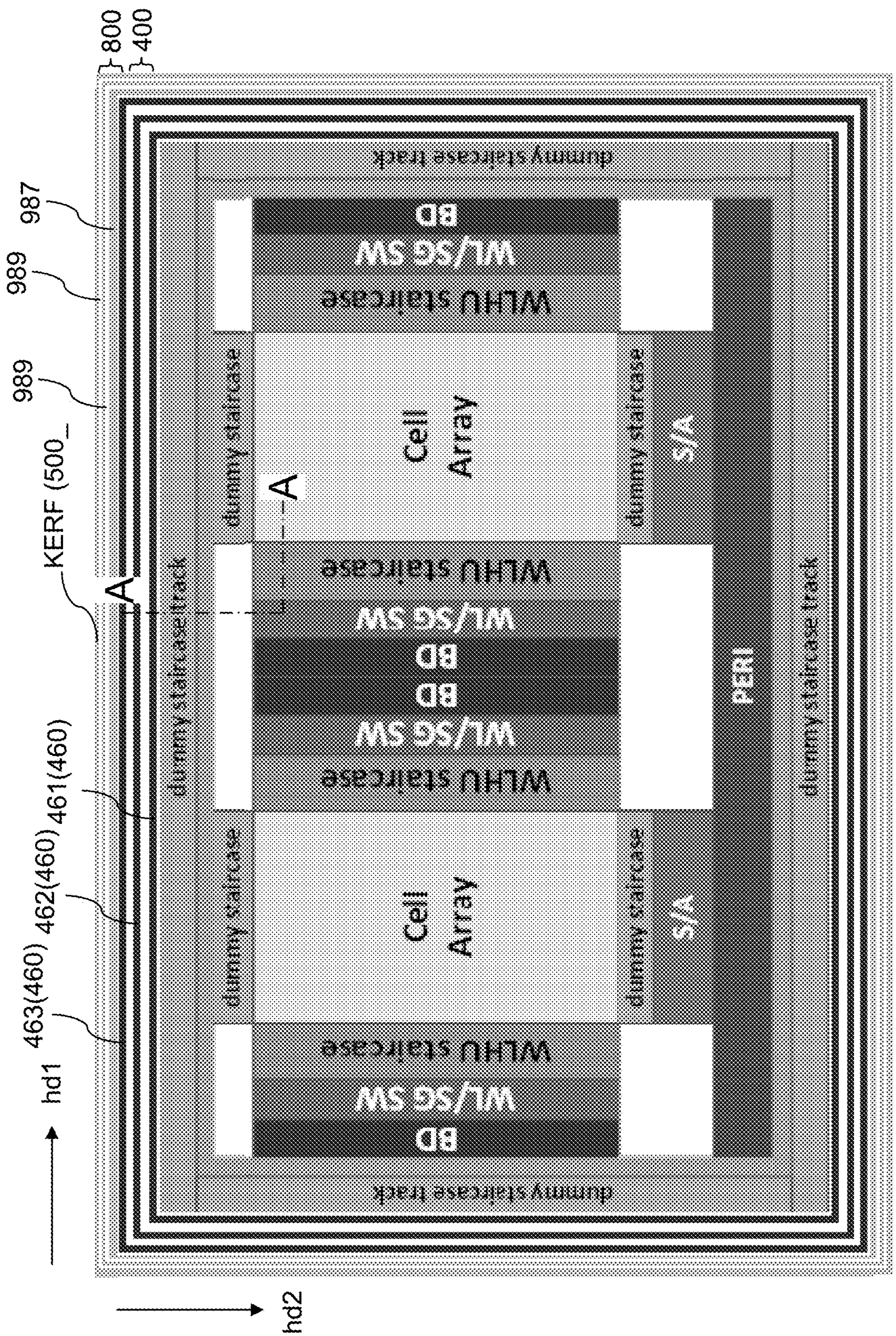
FIG. 24B is a top-down view of a unit die area of the exemplary structure of FIG. 24A.

Referring to FIGS. 24A and 24B, a photoresist layer 987 can be applied over the hard cover film 985, and can be lithographically patterned to form at least one annular opening 989 through the photoresist layer within the slit ring region 800. Each annular opening 989 can be confined within the area of the slit ring region 800. A plurality of annular openings 989 can be formed. In one embodiment, each annular opening 989 may have a uniform width between an inner periphery and an outer periphery.

Figure 25:
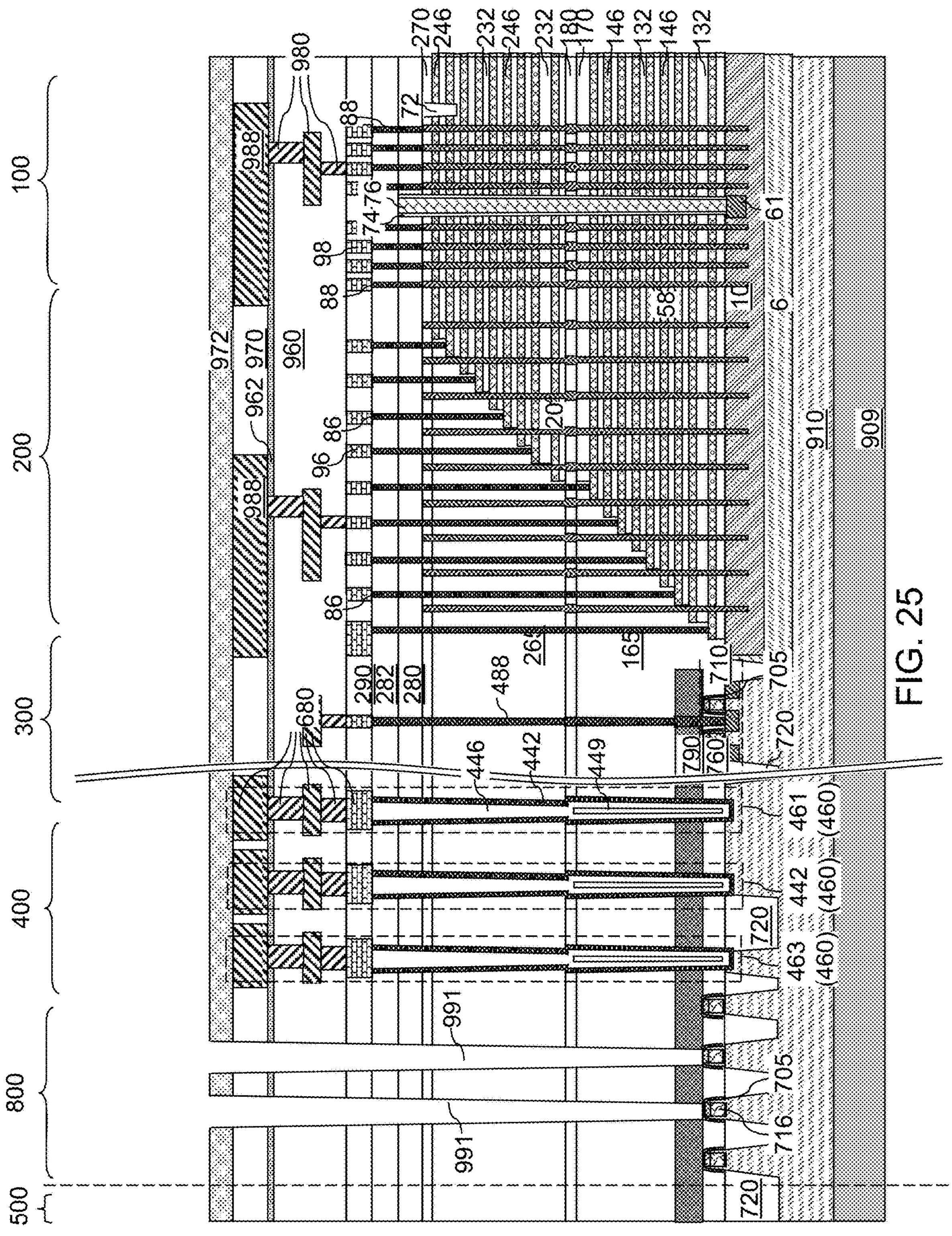
FIG. 25 is a vertical cross-sectional view of a region of the exemplary structure after formation of slit ring trenches according to a second embodiment of the present disclosure.

Referring to FIG. 25, an anisotropic etch process can be performed to etch through portions of the exemplary structure that are not masked by the patterned photoresist layer 987. The patterned photoresist layer 987 overlying the silicon nitride passivation layer 972 can be employed as an etch mask layer for the anisotropic etch process. A slit ring trench 991 can be formed within each annular opening 989 in the patterned photoresist layer 987. Each slit ring trench 991 can be formed as a moat trench that laterally encloses each of the edge seal ring structures 460. Each slit ring trench 991 vertically extends through the hard cover film 985, the silicon nitride passivation layer 972, the pad-level dielectric layer 970, the diffusion barrier dielectric material layer 962, the interconnect-level dielectric material layers 960, the bit-line-level dielectric layer 290, the at least one contact-level dielectric layer 280, the second retro-stepped dielectric material portion 265, and the first retro-stepped dielectric material portion 165.

In one embodiment shown in FIG. 25, the at least one slit ring trench 991 can extend through the silicon nitride diffusion barrier layer 790 to a top surface of a dummy gate stack 716 structure, which may include an annular gate stack structure that continuously extends around the entire periphery of the semiconductor die. In another embodiment, each slit ring trench 991 can extend at least to the silicon nitride diffusion barrier layer 790, as shown in FIG. 29B. In yet another embodiment, the bottom of each slit ring trench 991 is located in the first retro-stepped dielectric material portion 165 above the silicon nitride diffusion barrier layer 790, as shown in FIG. 29C.

In one embodiment, all sidewalls of the at least one slit ring trench 991 can be straight sidewalls that vertically extend from a top surface of the silicon nitride passivation layer 972 to a bottom surface of a respective one of the at least one slit ring trench 991. In one embodiment, each of the at least one slit ring trench 991 has a height that is in a range from 85% to 100% of a vertical distance between the semiconductor substrate 908 and a top surface of the silicon nitride passivation layer 972. The photoresist layer 987 and the hard cover film 985 can be subsequently removed selective to the silicon nitride passivation layer 972, for example, by ashing.

Figure 26:
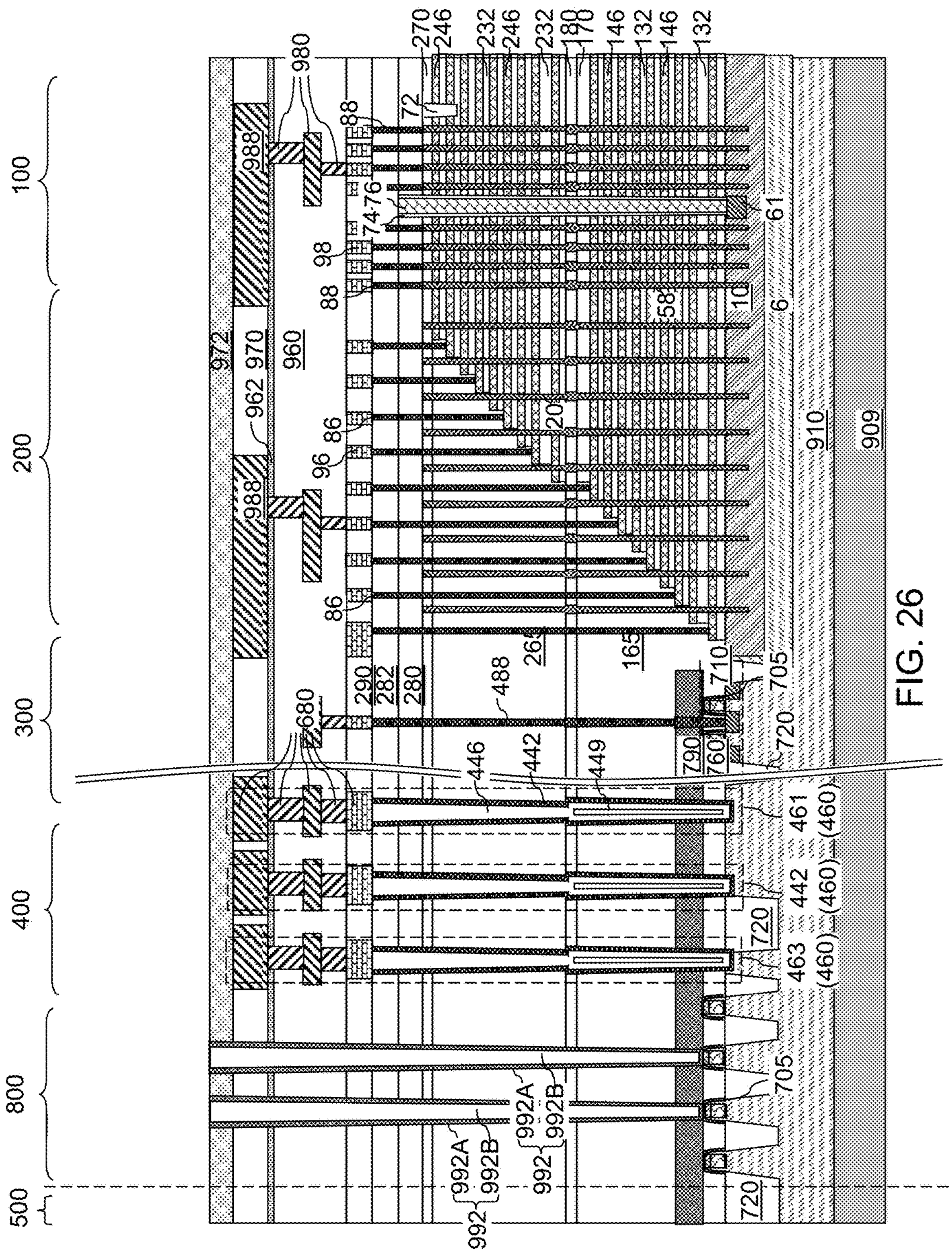
FIG. 26 is a vertical cross-sectional view of a region of the exemplary structure after formation of slit ring structures according to a second embodiment of the present disclosure.

Referring to FIG. 26, at least one dielectric material can be deposited in each slit ring trench 991. The at least one dielectric material can include, and/or can consist essentially of, at least dielectric material such as silicon oxide, silicon nitride, silicon carbide nitride, or silicon oxynitride. In one embodiment, the at least one dielectric material may include a plurality of dielectric materials. For example, the at least one dielectric material can include at least two of as silicon oxide, silicon nitride, silicon carbide nitride, and silicon oxynitride. In another embodiment, the at least one dielectric material may including a single dielectric material. For example, the at least one dielectric material can consists essentially of silicon oxide, silicon nitride, silicon carbide nitride, or silicon oxynitride. In one embodiment, the at least one dielectric material can include a silicon oxide material that is deposited on sidewalls of the slit ring trenches 991.

Excess portions of the at least one dielectric material can be removed from above the horizontal plane including the silicon nitride passivation layer 972 by a planarization process, which can include a chemical mechanical planarization (CMP) process and/or a recess etch process. Each remaining portion of the at least one dielectric material that fills a slit ring trench 991 constitutes a slit ring structure 992. In one embodiment, each slit ring structure 992 can include a silicon oxide liner 992A and a slit ring dielectric fill material portion 992B including a dielectric fill material such as silicon nitride, silicon carbide nitride, or silicon oxynitride. Alternatively, each slit ring structure 992 can consist essentially of a single dielectric material such as silicon oxide, silicon nitride, silicon carbide nitride, or silicon oxynitride. Each of the at least one slit ring structure 992 continuously extends from a top surface of the silicon nitride passivation layer 972 through each of the interconnect-level dielectric material layers 960 and into the at least one dielectric material portion (i.e., the first retro-stepped dielectric material portion 165 and the second retro-stepped dielectric material portion).

In one embodiment, the interconnect-level dielectric material layers 960 comprise a plurality of dielectric material layers having different material compositions. Each of the at least one slit ring structure 992 extends through, and contacts sidewalls of, each dielectric material layer among the plurality of dielectric material layers of the interconnect-level dielectric material layers 960. In one embodiment, at least one of the plurality of dielectric material layers of the interconnect-level dielectric material layers 960, such as the diffusion barrier dielectric material layer 962, consists essentially silicon carbide nitride. The dielectric material layers within the interconnect-level dielectric material layers 960 provide different levels of adhesion to neighboring dielectric material layer depending on the composition of the respective dielectric material layer. For example, silicon carbide nitride may provide inferior adhesion to silicon oxide than silicon nitride, and may allow moisture to diffuse along its surface to the interior of the semiconductor die. The at least one slit ring structure 992 which extends in the vertical direction either lengthens the path that the moisture must take to reach the interior of the semiconductor die or decouples the straight horizontal moisture path along the silicon carbide nitride layer 962. Thus, the at least one slit ring structure 992 reduces or prevents moisture diffusion and reduces layer delamination and device failure.

According to an aspect of the present disclosure, the slit ring structure 992 can include silicon oxide as the outermost material, and can provide enhanced adhesion between different dielectric material layers and dielectric material portions within the exemplary structure. For example, the silicon oxide liner 992A can adhere to the silicon nitride passivation layer 972, the pad-level dielectric layer 970, the diffusion barrier dielectric material layer 962, each layer within the interconnect-level dielectric material layers 960, the bit-line-level dielectric layer 290, the at least one contact-level dielectric layer 280, the second retro-stepped dielectric material portion 265, and the first retro-stepped dielectric material portion 165, and prevent delamination of among the various layers within the exemplary structure.

Generally, the at least one dielectric material of the at least one slit ring structure 992 can comprise, and/or can consist essentially of, at least one of silicon oxide, silicon nitride, silicon carbide nitride, or silicon oxynitride. In one embodiment, each of the at least one slit ring structure 992 can comprise, and/or can consist essentially of, a silicon oxide liner 992A and a slit ring dielectric fill material portion 992B located within the silicon oxide liner. In one embodiment, all sidewalls of the at least one slit ring structure 992 can be straight sidewalls that vertically extend from a top surface of a respective one of the at least one slit ring structure 992 to a bottom surface of the respective one of the at least one slit ring structure 992.

Referring to FIG. 27, an optional silicon nitride cap layer 974 and a polyimide layer 976 can be formed over the silicon nitride passivation layer 972. The silicon nitride cap layer 974, if present, can provide an additional dielectric diffusion barrier structure that prevents diffusion of moisture and impurities therethrough. The thickness of the silicon nitride cap layer 974 can be in a range from 10 nm to 200 nm, although lesser and greater thicknesses can also be employed. The polyimide layer 976 can have a thickness in a range from 300 nm to 3,000 nm, although lesser and greater thicknesses can also be employed.

Referring to FIG. 28, the polyimide layer 976 can be lithographically patterned to form openings in areas that overlie the bonding pads 988. An anisotropic etch process can be performed to transfer the pattern of the openings in the polyimide layer 976 through the silicon nitride cap layer 974 (if present) and the silicon nitride passivation layer 972. Top surfaces of the bonding pads 988 can be physically exposed at the bottom of each opening through the polyimide layer 976, the silicon nitride cap layer 974, and the silicon nitride passivation layer 972. Subsequently, C4 solder balls or wire bonding solder balls can be attached to the bonding pads 988. Subsequently, the semiconductor dies can be diced along dicing channels, and the kerf regions 500 can be removed during the dicing process. The bottom surfaces of the slit ring structures 992 contact a top surface of the dummy gate stack 716.

FIGS. 29A-29E illustrate various alternative configurations of the exemplary structure illustrated in FIG. 28.

Referring to FIG. 29A, a first configuration of the semiconductor die after dicing is illustrated, which can be derived from the semiconductor die illustrated in FIG. 28 by forming the slit ring structures 992 such that the bottom surfaces of the slit ring structures 992 contact a top surface of the silicon nitride diffusion barrier layer 790.

Referring to FIG. 29B, a second configuration of the semiconductor die after dicing is illustrated, which can be derived from the semiconductor die illustrated in FIG. 28 by forming the slit ring structures 992 such that the bottom surfaces of the slit ring structures 992 contact annular surfaces of the first retro-stepped dielectric material portion 165.

Referring to FIG. 29C, a third configuration of the semiconductor die after dicing is illustrated, which can be derived from the semiconductor die illustrated in FIG. 28 by forming the slit ring structures 992 such that the bottom surfaces of the slit ring structures 992 contact a top surface of the semiconductor substrate 908. The bottom surfaces of the slit ring structures 992 may contact a surface of the semiconductor material layer 910, or may contact a surface of the shallow trench isolation structures 720.

Referring to FIG. 29D, a fourth configuration of the semiconductor die after dicing is illustrated, which can be derived from the semiconductor die illustrated in FIG. 28 by employing a single dielectric fill material, such as silicon oxide, to form the slit ring structures 992.

Referring to FIG. 29E, a fifth configuration of the semiconductor die after dicing is illustrated, which can be derived from the semiconductor die illustrated in FIG. 28 by employing only metallic materials to fill the edge seal trenches 459. In this case, the width of the edge seal trenches 459 may be reduced to enable filling of the edge seal trenches with the continuous metallic material layer 442L. In this case, each edge seal via structure 450 can consist of a metallic material layer 442 and a ring-shaped void 449.

Referring to FIG. 29F, a sixth configuration of the semiconductor die according to the first embodiment after dicing is illustrated, which can be derived from the semiconductor die illustrated in FIG. 28 by omitting formation of the slit ring structures 992 of the second embodiment.

Referring to FIGS. 1-29E and according to various embodiments of the present disclosure, a semiconductor die is provided, which comprises: semiconductor devices located over a substrate 908; at least one dielectric material portion (165, 265) that laterally surrounds the semiconductor devices; interconnect-level dielectric material layers 960 that overlie the semiconductor devices and the at least one dielectric material portion (165, 265) and embedding metal interconnect structures 980; a silicon nitride passivation layer 972 overlying the metal interconnect structures 980; and at least one slit ring structure 992 that laterally surrounds the semiconductor devices and the metal interconnect structures 980, wherein the at least one slit ring structure 992 comprises at least one dielectric material and continuously extends from a top surface of the silicon nitride passivation layer 972 through each of the interconnect-level dielectric material layers 960 and into the at least one dielectric material portion (165, 265).

In one embodiment, the at least one dielectric material of the at least one slit ring structure 992 comprises, and/or consists essentially of, at least one of silicon oxide, silicon nitride, silicon carbide nitride, or silicon oxynitride.

In one embodiment, each of the at least one slit ring structure 992 comprises a silicon oxide liner 992A and a slit ring dielectric fill material portion 992B located within the silicon oxide liner 992A.

In one embodiment, each of the at least one slit ring structure 992 has a height that is in a range from 85% to 100% of a vertical distance between the substrate 908 and a top surface of the silicon nitride passivation layer 972.

In one embodiment, all sidewalls of the at least one slit ring structure 992 are straight sidewalls that vertically extend from a top surface of a respective one of the at least one slit ring structure 992 to a bottom surface of the respective one of the at least one slit ring structure 992.

In one embodiment, the semiconductor die comprises: a polyimide layer 976 overlying the silicon nitride passivation layer 972; and openings that extend through the polyimide layer 976 and the silicon nitride passivation layer 972, wherein top surfaces of bonding pads 988 are located underneath the openings.

In one embodiment, a silicon nitride diffusion barrier structure (790, 705) can be provided. The silicon nitride diffusion barrier structure (790, 705) comprises: a silicon nitride diffusion barrier layer 790 underlying the at least one dielectric material portion (165, 265) and overlying the substrate 908 and continuously extending around a periphery of the semiconductor die; and at least one silicon nitride spacer 705 vertically extending from the substrate 908 to the silicon nitride diffusion barrier layer 790, wherein the at least one slit ring structure 992 contacts the silicon nitride diffusion barrier structure (790, 705).

In one embodiment, the at least one slit ring structure 992 comprises multiple nested slit ring structures 992 in which each slit ring structure 992 laterally surrounds, or is laterally surrounded by, any other of the multiple nested slit ring structures 992.

In one embodiment, the interconnect-level dielectric material layers 960 comprise a plurality of dielectric material layers having different material compositions; and each of the at least one slit ring structure 992 extends through, and contacts sidewalls of, each dielectric material layer among the plurality of dielectric material layers. In one embodiment, at least one of the plurality of dielectric material layers consists essentially of silicon carbide nitride. Generally, the at least one slit ring structure 992 can provide adhesion among the various dielectric material layers by providing adhesion to each of the various dielectric material layers.

In one embodiment, the at least one slit ring structure 992 is vertically spaced from, and is located above, a horizontal plane including a top surface of the substrate 908; and each of the at least one slit ring structure 992 has a respective annular bottom surface in contact with a dielectric material of the at least one dielectric material portion (165, 265).

In one embodiment, each of the at least one slit ring structure 992 contacts the substrate 908 or a respective shallow trench isolation structure 720 that is embedded within the substrate 908.

In one embodiment, at least one edge seal ring structure 460 can be laterally surrounded by the at least one slit ring trench 991. Each of the at least one edge seal ring structure 460 can comprise: a composite edge seal via structure 450 including a metallic material layer 442 and a dielectric fill material portion (444, 446), wherein the metallic material layer 442 includes an inner vertical sidewall segment that laterally surrounds, and laterally encloses, the semiconductor devices, an outer vertical sidewall segment that laterally surrounds, and laterally encloses, the dielectric fill material portion (444, 446), and a planar bottom segment that connects bottom portions of the inner vertical sidewall segment of the metallic material layer and the outer vertical sidewall segment of the metallic material layer 442.

The various embodiments of the present disclosure may be implemented alone, or in combination with any other compatible embodiment. The various embodiments of the present disclosure can be employed to provide an edge seal and/or slit ring structures that provide effective protection against ingress of moisture or contaminants and decrease the likelihood of layer delamination.

Figure 30A:
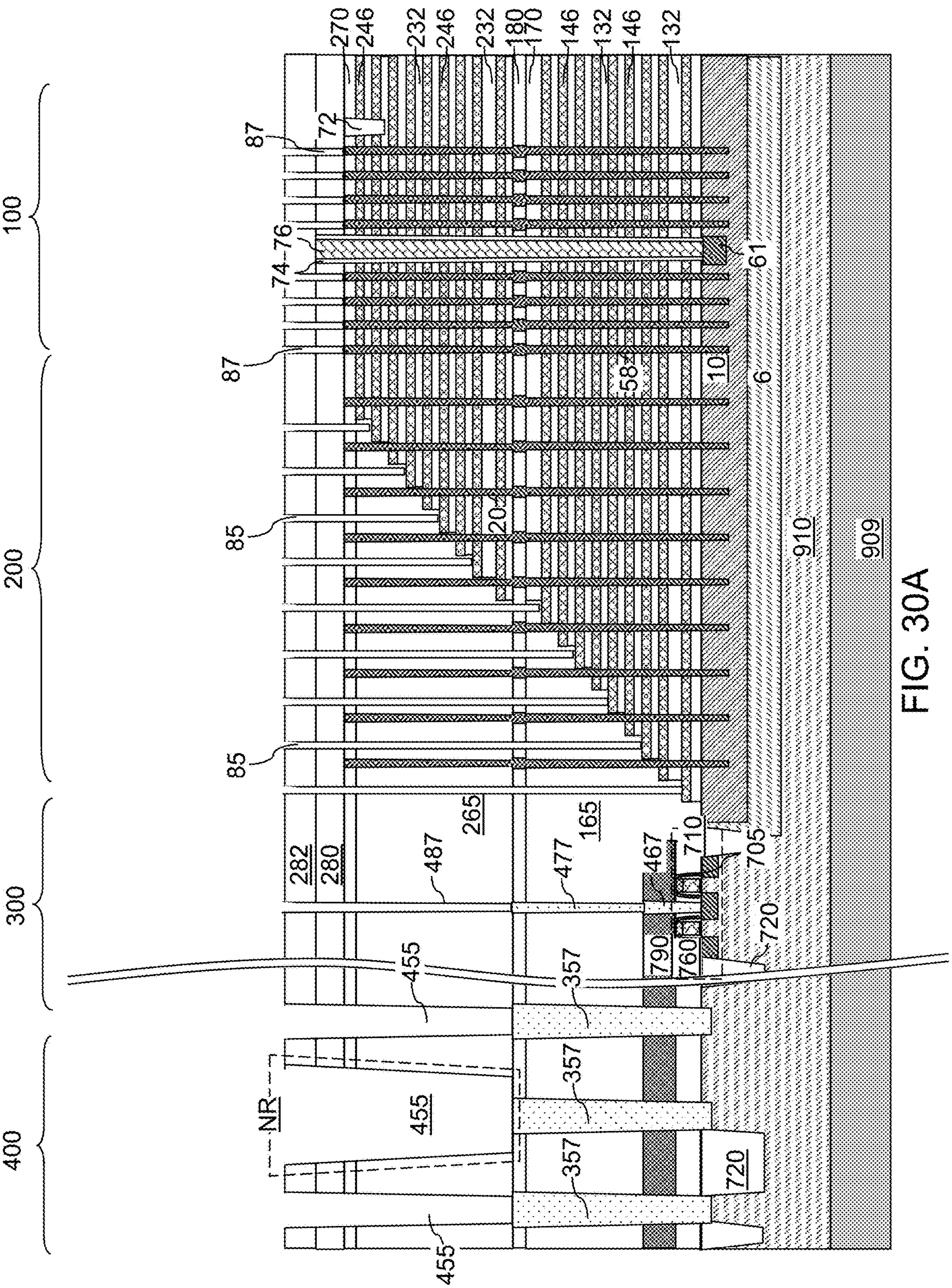
FIG. 30A is a vertical cross-sectional view of a region of a seventh configuration of a semiconductor die after formation of a second contact-level dielectric layer, contact via cavities, and second-tier via cavities according to a third embodiment of the present disclosure.
Figure 30B:
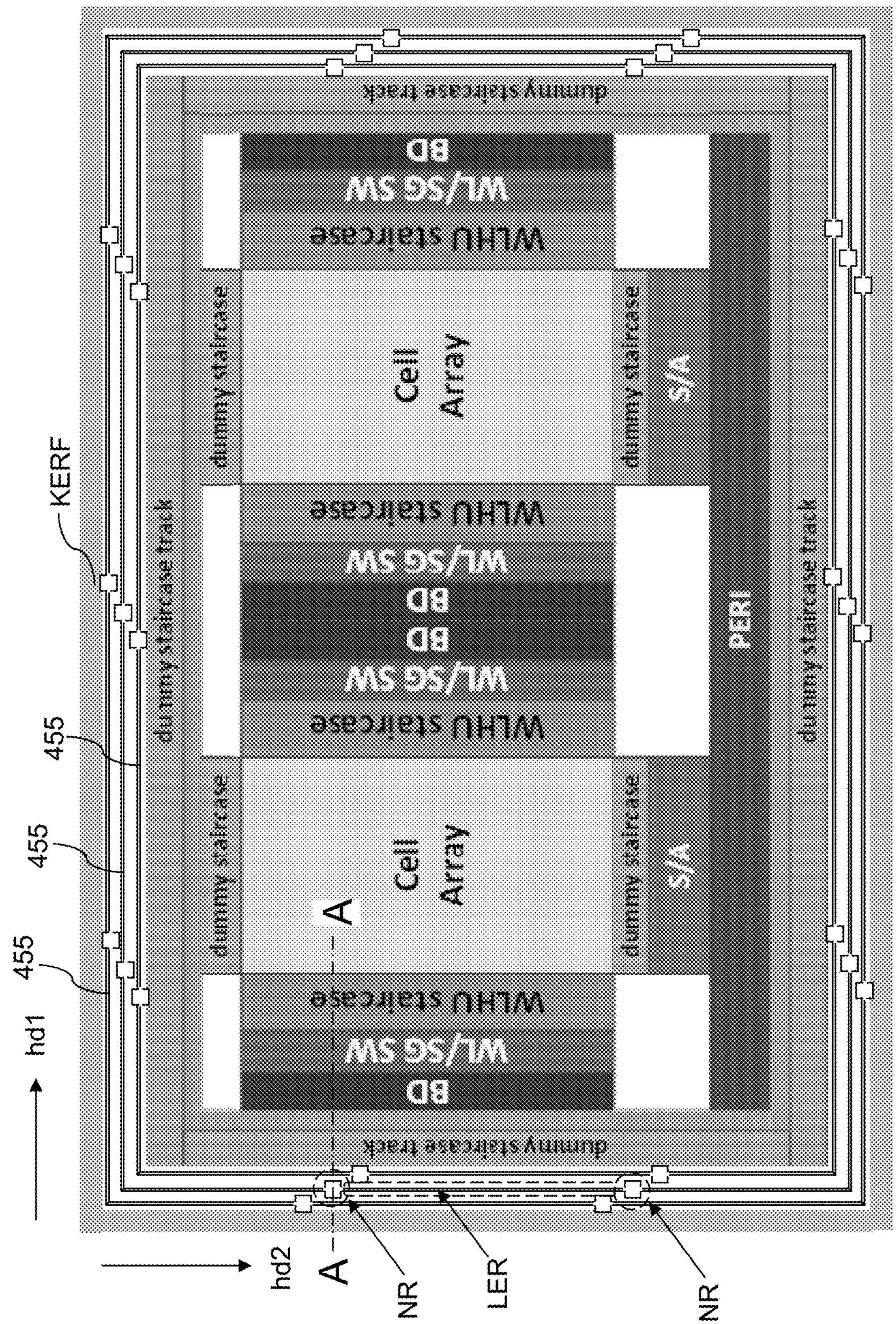
FIG. 30B is a top-down view of a unit die area of the exemplary structure of FIG. 30A. The vertical cross-sectional plane A-A' corresponds to the plane of the vertical cross-sectional view of FIG. 30A.
Figure 30C:
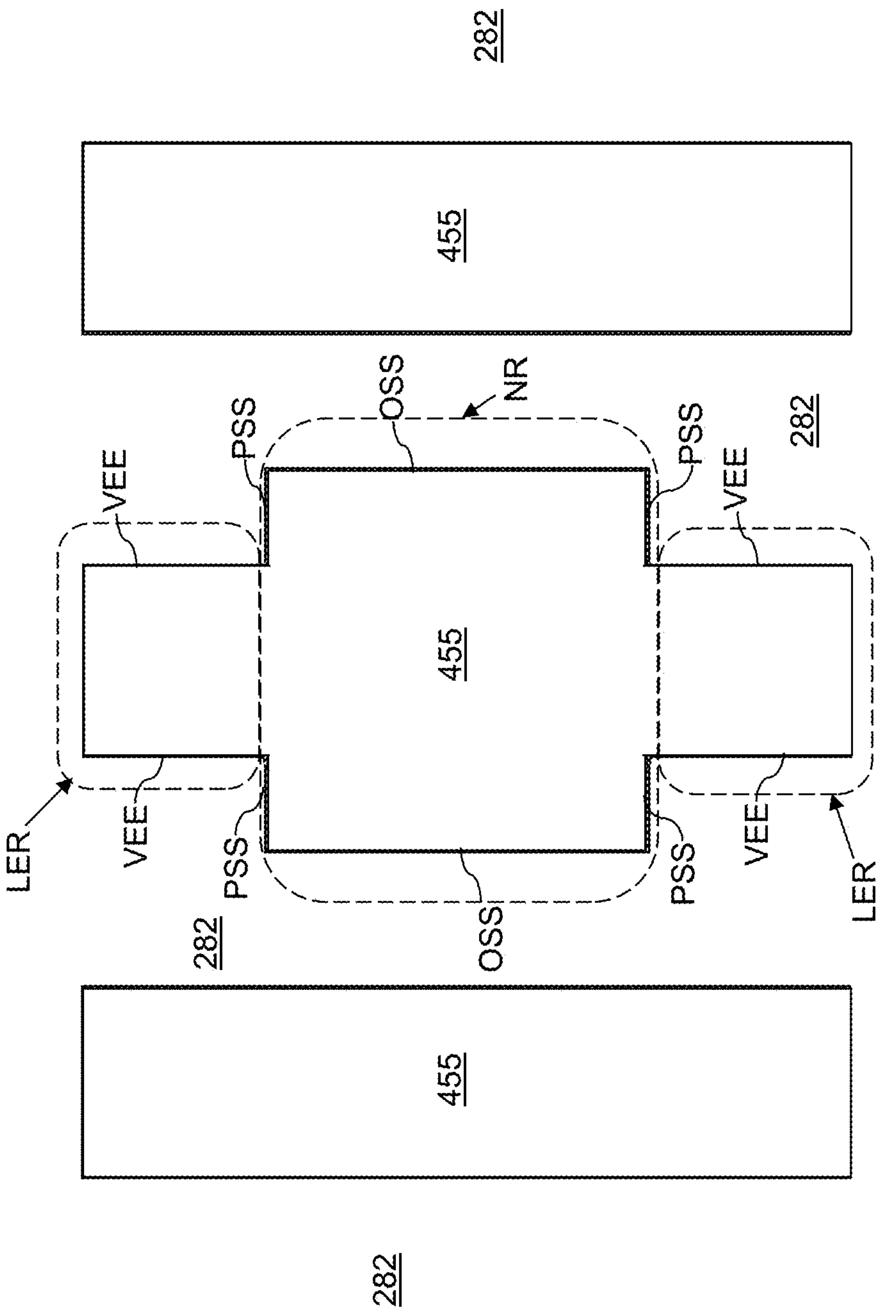
FIG. 30C is top down view of a region of the seventh configuration of the exemplary structure shown in FIG. 30B.

Referring to FIGS. 30A to 30C, a seventh configuration of a semiconductor die is illustrated after formation of a second contact-level dielectric layer 282, contact via cavities (85, 87), and second-tier via cavities 455 according to a third embodiment of the present disclosure. The seventh configuration of the semiconductor die can be derived from the exemplary structure illustrated in FIGS. 14-14C by performing the processing steps of FIGS. 15A and 15B with a modification to the pattern in the second-tier edge seal trenches 455. The depth of each second-tier edge seal trench 455 can be selected such that a top surface of a sacrificial edge-seal-trench fill structure 357 is physically exposed underneath the second-tier edge seal trench 455.

Each second-tier edge seal trench 455 can have a configuration of a moat trench including respective laterally-extending regions LER and respective notch regions NR. Each notch region NR can be a region in which the width of the moat trench is locally increased to provide an outward-lateral protrusion. Generally, the notch regions NR can laterally protrude outward from the laterally-extending regions LER of a respective edge seal ring structure. At least one, and/or each, of the at least one second-tier edge seal trench 455 can have a horizontal cross-sectional profile that comprises laterally-extending regions LER that extend laterally with a uniform width between an inner sidewall and an outer sidewall, and notch regions NR connecting neighboring pairs of the laterally-extending regions LER and having a greater width than the uniform width.

In one embodiment shown in FIG. 30C, each notch region NR can include at least one pair of protrusion sidewall segments PSS that adjoin a respective vertically-extending edge VEE of a pair of laterally-extending regions LER of the laterally-extending regions LER, and a respective offset sidewall segment OSS adjoined to edges of the respective pair of protrusion sidewall segments PSS and laterally offset from the pair of laterally-extending regions LER. For example, each notch region NR can include a first pair of protrusion sidewall segments PSS (e.g., on the left side of the notch region NR) that laterally protrude outward, and a first (e.g., left) offset sidewall segment OSS that connects the first pair of protrusion sidewall segments PSS. Further, each notch region NR can include a second pair of protrusion sidewall segments (e.g., on the right side of the notch region NR) that laterally protrude outward, and a second (e.g., right) offset sidewall segment OSS that connects the second pair of protrusion sidewall segments PSS. The laterally-extending regions LER of each second-tier edge seal trench 455 can locally extend along the local lengthwise direction of the second-tier edge seal trench 455. Each pair of protrusion sidewall segments PSS adjoins a respective vertically-extending edge VEE of a pair of laterally-extending regions LER of the laterally-extending regions LER. Each offset sidewall segment OSS is adjoined to edges of a respective pair of protrusion sidewall segments PSS, and is laterally offset from the pair of laterally-extending regions LER.

The second-tier edge seal trenches 455 can laterally extend along the periphery of a respective semiconductor die to laterally surround, and enclose, the entirety of semiconductor devices located within the respective semiconductor die. The bottom surfaces of the second-tier edge seal trenches 455 can be formed directly on a respective one of the sacrificial edge-seal-trench fill structures 357. A bottom lateral dimension (such as the width) of each second-tier edge seal trench 455 can be less than a top lateral dimension (such as the width) of an underlying sacrificial edge-seal-trench fill structure 357. A plurality of second-tier edges seal trenches 455 can be formed as a set of nested second-tier edge seal trenches 455. In one embodiment, each second-tier edge seal trench 455 can be laterally surrounded by, or can laterally surround, each other second-tier edge seal trench 455.

The width of the laterally-extending regions LER of the second-tier edge seal trenches 455 can be selected to be greater than twice the thickness of a metallic fill material to be subsequently deposited to form metallic edge seal fill material portions. For example, the width of the laterally-extending regions LER of each second-tier edge seal trench 455 can be in a range from 300 nm to 6,000 nm, such as from 600 nm to 3,000 nm, although lesser and greater widths may also be employed for each of the second-tier edge seal trenches 455. Sidewalls of the second-tier edge seal trenches 455 can have a taper angle in a range from 0.1 degree to 6 degrees, such as from 0.3 degrees to 3 degrees. In one embodiment, a bottom lateral dimension (i.e., the width of a bottom surface) of the laterally-extending regions LER of the second-tier edge seal trench 455 can be less than a top lateral dimension (i.e., the width of a top surface) of the sacrificial edge-seal-trench fill structure 357.

The width of the notch regions NR of the second-tier edge seal trenches 455 (as measured along a horizontal direction that is perpendicular to the lengthwise direction of an adjoining laterally-extending region LER) can be greater than the uniform width of the adjoining laterally-extending region LER at any height, i.e., in any horizontal cross-sectional profile. For example, the width of the notch regions NR of the second-tier edge seal trenches can be in a range from 110% to 500%, such as from 120% to 300%, of the uniform width of the adjoining laterally-extending region LER at any height. For example, the width of the laterally-extending regions LER of each second-tier edge seal trench 455 can be in a range from 300 nm to 6,000 nm, such as from 600 nm to 3,000 nm, and the width of the notch regions NR of each second-tier edge seal trench 455 can be in a range from 330 nm to 30,000 nm, such as from 800 nm to 10,000 nm, although lesser and greater widths may also be employed for each of the second-tier edge seal trenches 455.

The distance between neighboring notch regions NR as measured along the laterally-extending regions LER (which may include a bend at die corners) may be in a range from 20 microns to 1 mm, such as from 50 microns to 500 microns, although lesser and greater distances can also be employed. In case a laterally-extending region LER is straight, the length of the laterally-extending region LER may be in a range from 20 microns to 1 mm, such as from 50 microns to 500 microns, although lesser and greater lengths can also be employed. The length of the notch regions NR of the second-tier edge seal trenches 455 (as measured along the local lengthwise direction of an adjoining laterally-extending region LER) can be greater than the uniform width of the adjoining laterally-extending region LER at any height, i.e., in any horizontal cross-sectional profile. For example, the length of the notch regions NR of the second-tier edge seal trenches can be in a range from 110% to 500%, such as from 120% to 300%, of the uniform width of the adjoining laterally-extending region LER at any height. For example, the width of the laterally-extending regions LER of each second-tier edge seal trench 455 can be in a range from 300 nm to 6,000 nm, such as from 600 nm to 3,000 nm, and the length of the notch regions NR of each second-tier edge seal trench 455 can be in a range from 330 nm to 30,000 nm, such as from 800 nm to 10,000 nm, although lesser and greater widths may also be employed for each of the second-tier edge seal trenches 455. Generally, the maximum lateral dimensions of any notch region NR along horizontal directions can be selected such that each maximum lateral dimension along any horizontal direction of each notch region NR is greater than the width of the adjoining laterally-extending region LER at any height, i.e., within any horizontal cross-sectional profile.

Sidewalls of the second-tier edge seal trenches 455 can have a taper angle in a range from 0.1 degree to 6 degrees, such as from 0.3 degrees to 3 degrees. In one embodiment, a bottom lateral dimension (i.e., the width of a bottom surface) of the laterally-extending regions LER of the second-tier edge seal trench 455 can be less than a top lateral dimension (i.e., the width of a top surface) of the sacrificial edge-seal-trench fill structure 357.

Figure 31:
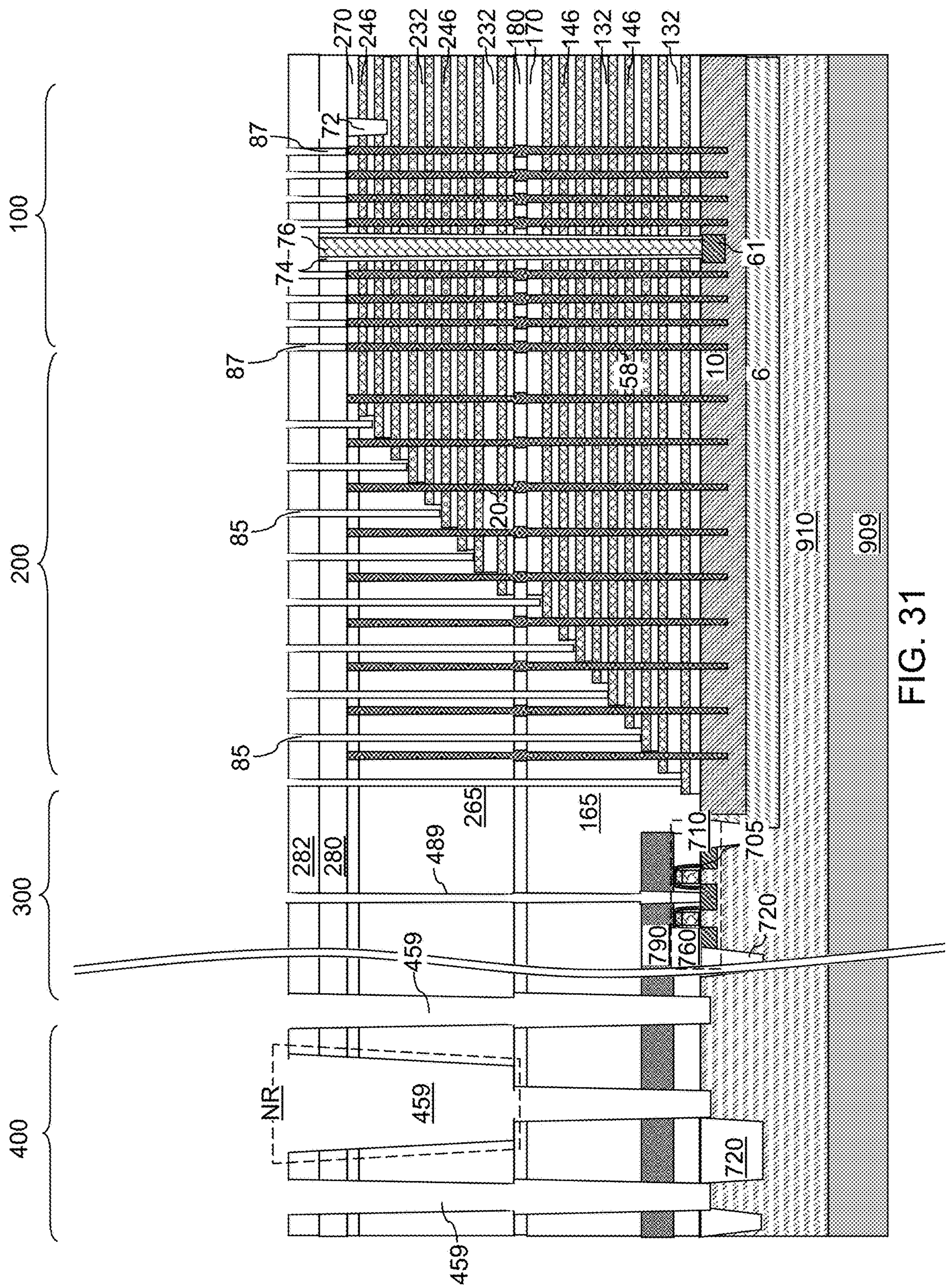
FIG. 31 is a vertical cross-sectional view of a region of the seventh configuration of the exemplary structure after formation of inter-tier via cavities including edge seal trenches according to the third embodiment of the present disclosure.

Referring to FIG. 31, the processing steps of FIG. 16 can be performed to form at least one edge seal trenches 459. Specifically, an isotropic etch process can be performed to remove the sacrificial material of the first-tier peripheral via fill portion 477 and the sacrificial edge-seal-trench fill structure 357 and to remove the sacrificial material of the sacrificial via fill structures 467. A peripheral via cavity 489 (which is also referred to as inter-tier peripheral via cavity) can be formed in each contiguous set of volumes of the second-tier peripheral via cavities 487 and the voids formed by removal of the first-tier peripheral via fill portion 477 and the sacrificial material of the sacrificial via fill structures 467. Each peripheral via cavity 489 continuously extends from the topmost surface of the at least one contact-level dielectric layer (280, 282) to a top surface of a respective component of a semiconductor device in the peripheral device region 300. The peripheral via cavities 489 are contact via cavities that vertically extend through the at least one contact-level dielectric material layer (280, 282), the second retro-stepped dielectric material portion 265, the first retro-stepped dielectric material portion 165, and to the semiconductor devices in the peripheral device region 300.

An edge seal trench 459 (which is also referred to as an inter-tier edge seal trench) can be formed in each contiguous set of volumes of the second-tier edge seal trenches 455 and the voids formed by removal of the sacrificial edge-seal-trench fill structures 357. Each edge seal trench 459 can be formed by removing a sacrificial edge-seal-trench fill structure 457 from underneath a second-tier edge seal trench 455. The edge seal trenches 459 and the peripheral via cavities 489 are via cavities that vertically extend through the levels of the first-tier structure and the second-tier structure. As such, the edge seal trenches 459 and the peripheral via cavities 489 are herein referred to as inter-tier via cavities (459, 489). The edge seal trenches 459 can be formed through layers 280 and 280, the second retro-stepped dielectric material portion 265, the first retro-stepped dielectric material portion 165, the silicon nitride diffusion barrier layer 790, and the planarization dielectric layer 760, and can extend to a top surface of the semiconductor material layer 910 in the semiconductor substrate 908.

Each edges seal trench 459 can have a configuration of a moat trench. The edge seal trenches 459 can laterally extend along the periphery of a respective semiconductor die to laterally surround, and enclose, the entirety of semiconductor devices located within the respective semiconductor die. A plurality of edges seal trenches 459 can be formed as a set of nested edge seal trenches 459. Each edge seal trench 459 can be laterally surrounded by, or can laterally surround, each other edge seal trench 459. Each edges seal trench 459 can include notch regions NR and laterally-extending regions LER in an upper portion, i.e., in a portion that vertically extends through the second retro-stepped dielectric material portion 265. Generally, at least one edge seal trench 459 can be formed through at least one dielectric material portion.

Each edge seal trench 459 can comprise a first tapered sidewall segment that vertically extends through the first retro-stepped dielectric material portion 165, a second tapered sidewall segment that vertically extends through the second retro-stepped dielectric material portion 265 and the at least one contact-level dielectric layer (280, 282), and a horizontal surface segment connecting a top edge of the first tapered sidewall segment to a bottom edge of the second tapered sidewall segment. Each edge seal trench 459 can have a set of outer sidewalls that define an outer boundary of the respective edge seal trench 459, and a set of inner sidewalls that define an inner boundary of the respective edge seal trench 459. Each outer sidewall of the edge seal trenches 459 can have an upper outer sidewall segment that vertically extends through the at least one contact-level dielectric layer (280, 282) and the second retro-stepped dielectric material portion 265; a lower outer sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper outer sidewall segment and a top periphery of the lower outer sidewall segment. Each inner sidewall of the edge seal trenches 459 can have an upper inner sidewall segment that vertically extends through the at least one contact-level dielectric layer (280, 282) and the second retro-stepped dielectric material portion 265; a lower inner sidewall segment that vertically extends through the inter-tier dielectric layer 180, the first retro-stepped dielectric material portion 165, the silicon nitride diffusion barrier layer 790, and the planarization dielectric layer 760; and a horizontal connection surface segment that connects a bottom periphery of the upper inner sidewall segment and a top periphery of the lower inner sidewall segment.

Figure 32A:
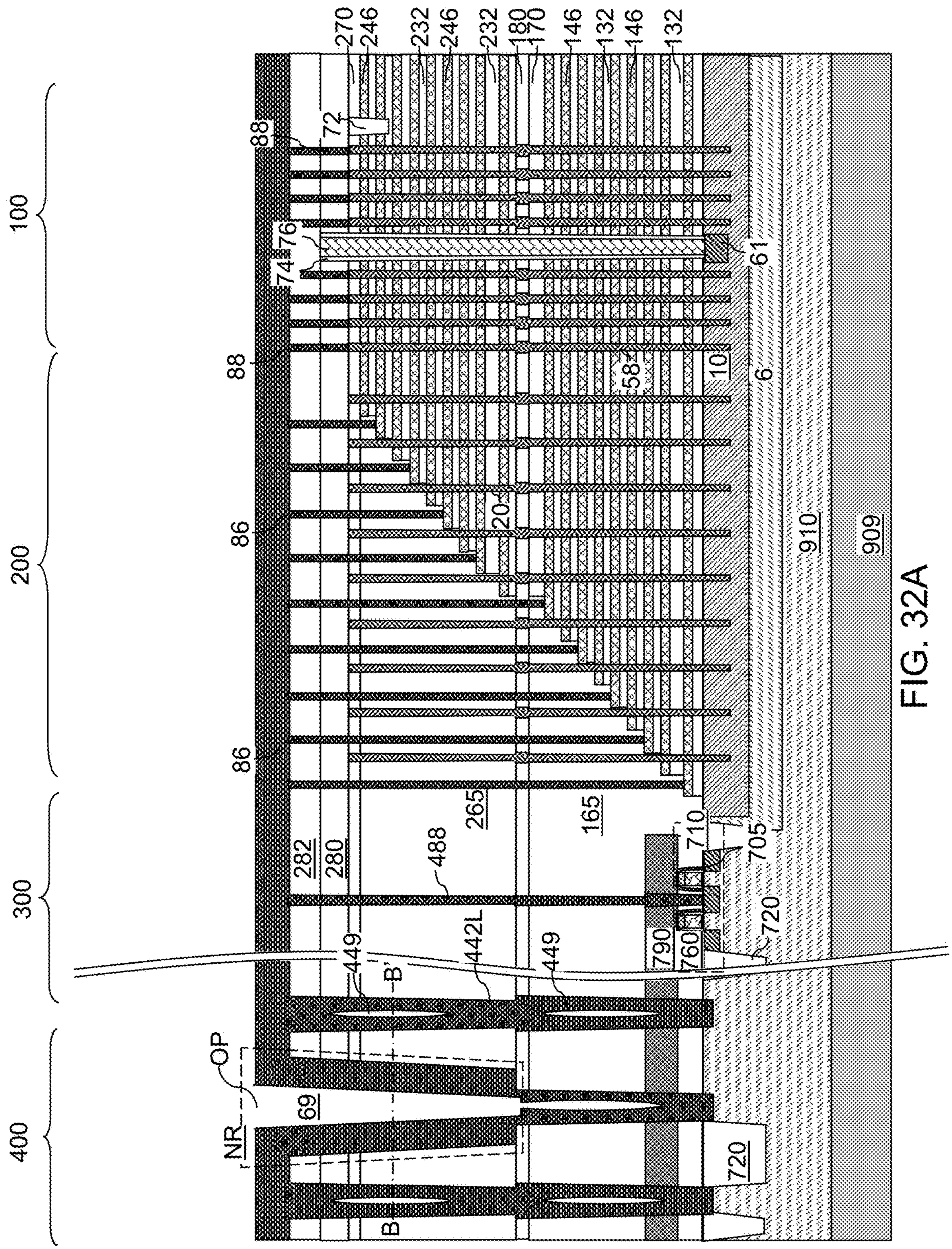
FIG. 32A is a vertical cross-sectional view of a region of the seventh configuration of the exemplary structure after formation of a metallic material layer according to the third embodiment of the present disclosure.
Figure 32B:
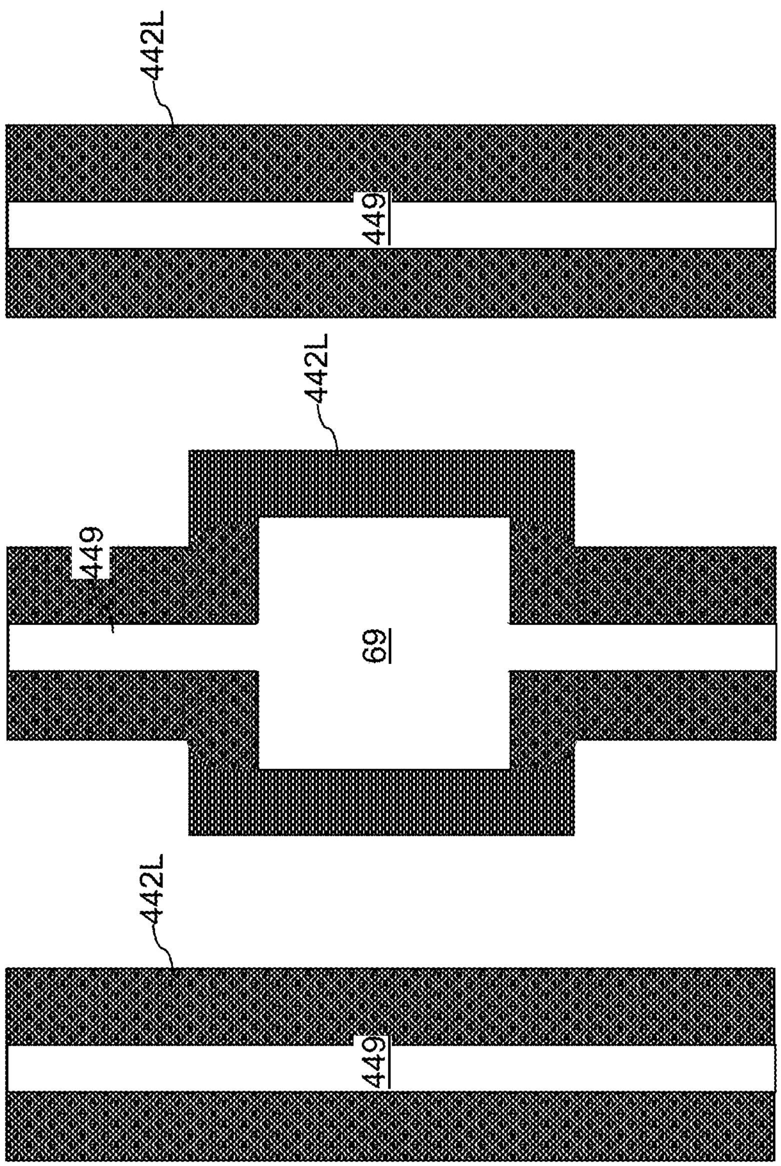
FIG. 32B is a horizontal cross-sectional view along the horizontal plane B-B' of FIG. 32A.

Referring to FIGS. 32A and 32B, a continuous metallic material layer 442L can be deposited in the various cavities in the exemplary structure. Specifically, the continuous metallic material layer 442L can be deposited in the drain contact via cavities 87, the staircase-region contact via cavities 85, the peripheral via cavities 489, and the edge seal trenches 459 employing a conformal deposition process. In one embodiment, the continuous metallic material layer 442 can include a layer stack of an optional metallic nitride barrier layer and a metallic fill material layer. The metallic nitride barrier layer can include a metallic nitride material such as TiN, TaN, and/or WN, which can be deposited by chemical mechanical vapor (CVD). The metallic nitride barrier layer can be deposited generally conformally, but may have a lesser thickness at the bottom of narrow via cavities such as at the bottom of the peripheral via cavities 489 relative to the upper portions of the various via cavities (87, 85, 489, 459). The thickness of the metallic nitride barrier layer at the horizontal bottom surface of each of the via cavities (87, 85, 489, 459) can be in a range from 5 nm to 200 nm, such as from 10 nm to 100 nm, although lesser and greater thicknesses can also be employed.

The metallic fill material layer can include at least one refractory metal selected from tungsten, molybdenum, niobium, rhenium, tantalum, chromium, hafnium, iridium, osmium, rhodium, ruthenium, titanium, vanadium and/or zirconium. The thickness of the metallic fill material layer can be selected such that each of the drain contact via cavities 87, the staircase-region contact via cavities 85, and the peripheral via cavities 489 is filled with the metallic fill material layer. In one embodiment, the thickness of the metallic fill material layer may be selected such that the each laterally-extending region LER of the edge seal trenches 459 is sealed with the metallic fill material layer at an upper end. In an illustrative example, the maximum width of each laterally-extending region LER of the edge seal trenches 459 can be in a range from 300 nm to 6,000 nm, such as from 600 nm to 3,000 nm, and the thickness of the metallic fill material layer can be in a range from 200 nm to 5,000 nm, such as from 400 nm to 2,000 nm. Generally, the thickness of the metallic fill material layer can be in a range from 55% to 300% of the maximum width of each edge seal trench 459. Each sublayer within the continuous metallic material layer 442L can be concurrently deposited in each of the via cavities in the exemplary structure (including the edge seal trenches 459 and the peripheral via cavities 489).

According to an aspect of the present disclosure, the thickness of the metallic fill material layer can be in a range from 10% to 49%, such as from 20% to 40%, of the maximum lateral dimension of each notch region NR of the edge seal trenches 459. In one embodiment, the thickness of the metallic fill material layer can be in a range from 10% to 49%, such as from 20% to 40%, of the width of each notch region NR of the edge seal trenches 459 that is perpendicular to the lengthwise direction of an adjoining laterally-extending region LER. In one embodiment, the thickness of the metallic fill material layer can be in a range from 10% to 49%, such as from 20% to 40%, of the length of each notch region NR of the edge seal trenches 459 that is parallel to the lengthwise direction of an adjoining laterally-extending region LER.

The drain contact via cavities 87, the staircase-region contact via cavities 85, and the peripheral via cavities 489 can be completely filled by the continuous metallic material layer 442L. Each portion of the continuous metallic material layer 442L that fills drain contact via cavities 87 constitutes a drain contact via structure 88. Each drain contact via structure 88 can be formed on a top surface of a respective one of the drain regions 63. Each portion of the continuous metallic material layer 442L that fills the staircase-region contact via cavities 85 constitutes a staircase-region contact via structure 86. Each staircase-region contact via structures 86 can be formed on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. Each portion of the continuous metallic material layer 442L that fills the peripheral via cavities 489 constitutes a peripheral contact via structure 488, which contacts a component of a respective one of the semiconductor devices 710 in the peripheral device region 300.

Upper portions of the laterally-extending regions LER of the edge seal trenches 459 are sealed with the continuous metallic material layer 442L. The continuous metallic material layer 442L is deposited in peripheral portions of each edge seal trench 459 and over the dielectric material portions (i.e., over the physically exposed sidewall surfaces) of the first retro-stepped dielectric material portion 165 and the second retro-stepped dielectric material portion 265. In one embodiment, an optional ring-shaped void (i.e., air gap) 449 can be present at the level of the first retro-stepped dielectric material portion 165 in one or more of the edge seal trenches 459 in the laterally-extending regions LER. Further, another ring-shaped void 449 can be present at the level of the second retro-stepped dielectric material portion 265 in one or more of the edge seal trenches 459 in the laterally-extending regions LER. In one embodiment, each ring-shaped void 449 can continuously surround all of the semiconductor devices on a semiconductor die.

However, the continuous metallic material layer 442L does not completely fill or seal off the top of the notch region NR. A top portion of each notch region NR contains an opening OP in the continuous metallic material layer 442. Thus, any ring-shaped void 449 in any level of the edge seal trenches 459 is fluidly connected to the opening OP. This allows any air or other gas to escape from the ring-shaped voids 449 through the opening OP in the notch region NR. Therefore, the likelihood of delamination of the continuous metallic material layer 442 due to trapped gas (e.g., air) in the ring-shaped void 449 is reduced due to the presence of the notch region NR. In other words, there is no trapped gas in the ring-shaped void 449 which can expand during subsequent high temperature process step and cause delamination of the metallic material layer filling the edge seal trenches 459.

Generally, the continuous metallic material layer 442L can be deposited in peripheral portions of the at least one edge seal trench 459 and over the at least one dielectric material portion (165, 265). A top portion of each of the laterally-extending regions LER is filled with the continuous metallic material layer 442L. A cavity (which includes a respective ring-shaped void 449) that is not filled with the continuous metallic material layer 442L may laterally extend through the laterally-extending regions LER and through the notch regions NR as a continuous volume. In one embodiment, the cavity continuously extends vertically through each of the notch regions NR and is connected through the opening OP to an ambient located above a horizontal plane including the topmost surface of the at least one dielectric material portion (165, 265). The portions of a cavity that continuously extends vertically through a notch region NR and terminate in the opening OP is herein referred to as a gap 69, which is employed as an outgassing conduit during a subsequent outgassing process.

According to an aspect of the present disclosure, an outgassing process can be performed to remove any gas from the ring-shaped void 449 in the continuous metallic material layer 442L. The outgassing process may comprise an anneal process at an elevated temperature and under vacuum. The elevated temperature of the outgassing process may be in a range from 100 degrees Celsius to 400 degrees Celsius. For example, if the continuous metallic material layer 442L is deposited by decomposition of tungsten hexafluoride, the continuous metallic material layer 442L may include residual fluorine atoms, which can function as a source of fluorine-containing compounds such as hydrogen fluoride. Fluorine-containing compounds can damage devices and affect performance the semiconductor devices in the semiconductor die adversely. The gaps 69 located within each notch region NR functions as an escape conduit for such gas during the anneal process. The ring-shaped voids 449 can function as lateral conduits for the gas during the anneal process, and the gaps 69 can function as vertical conduits for the gas. Generally, voids (which include the ring-shaped voids 449) can laterally extend through the at least one edge seal ring structure such that they are connected to the gaps 69.

Figure 33:
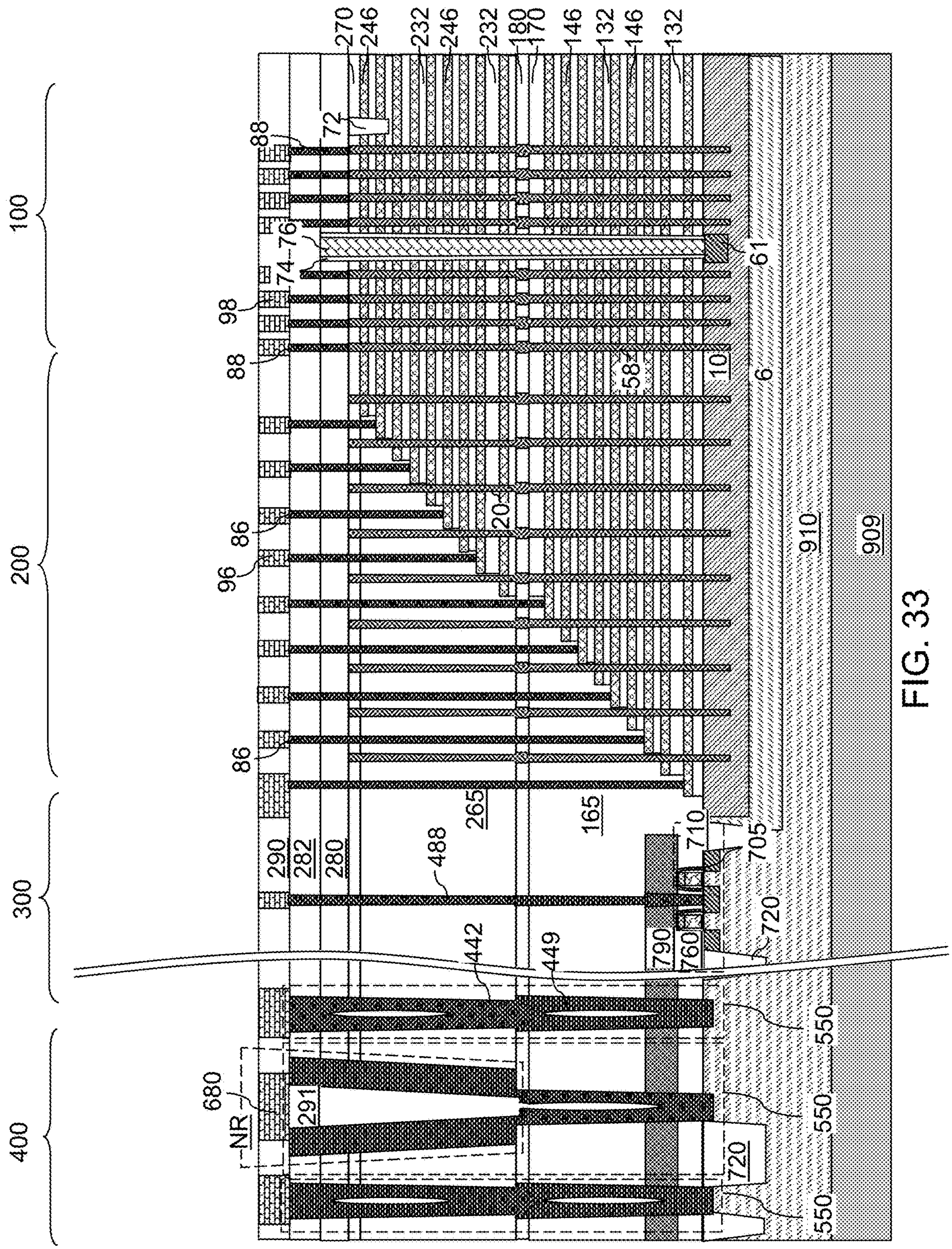
FIG. 33 is a vertical cross-sectional view of a region of the seventh configuration of the exemplary structure after formation of a first line-level dielectric layer and first metal lines according to the third embodiment of the present disclosure.

Referring to FIG. 33, portions of the continuous metallic material layer 442L located above the edge seal trenches 459 can be removed by a planarization process. A chemical mechanical planarization process or a recess etch process may be employed. In case a chemical mechanical planarization process is employed, a dielectric material may be deposited in the gaps 69 prior to the planarization process to form dielectric via fill structures 291 to prevent filling of the gaps 69 with slurry during the chemical mechanical planarization process.

Each drain contact via cavity 87 is filled with a drain contact via structure 88. Each staircase-region contact via cavity 85 is filled with a staircase-region contact via structures 86. Each peripheral via cavities 489 is filled with a peripheral contact via structure 488. Generally, remaining portions of the continuous metallic material layer 442L in the various contact via cavities (87, 85, 489) after the planarization process comprise contact via structures (88, 86, 488).

Each edge seal trench 459 is filled with a combination of a remaining portion of the continuous metallic material layer 442L, an optional dielectric via fill structure 291 (if present), and a ring-shaped void 449, if present. Each remaining portion of the continuous metallic material layer 442L comprises a metallic material layer 442. Each contiguous combination of metallic material layer 442, the dielectric via fill structures 291, if present, and a ring-shaped void 449, if present, constitutes a composite edge seal via structure 550. A plurality of composite edge seal structures 50 may be formed. For example, the composite edge seal structures 550 may include an inner composite edge seal structure, an intermediate composite edge seal structure that laterally surrounds the inner composite edge seal structure, and an outer composite edge seal structure that laterally surrounds the intermediate composite edge seal structure.

A bit-line-level dielectric layer 290 can be formed over the contact-level dielectric layers (280, 282). Bit-line-level metal interconnect structures (98, 96) can be formed in the bit-line-level dielectric layer 290. The bit-line-level metal interconnect structures (98. 96) may include bit lines 98 contacting a respective one of the drain contact via structures 88, and interconnection line structures 96 contacting, and/or electrically connected to, at least one of the staircase-region contact via structures 86 and/or the peripheral contact via structures 488. Metal barrier structures 680 can be formed on a top surface of a respective one of the composite edge seal via structures 450.

Figure 34A:
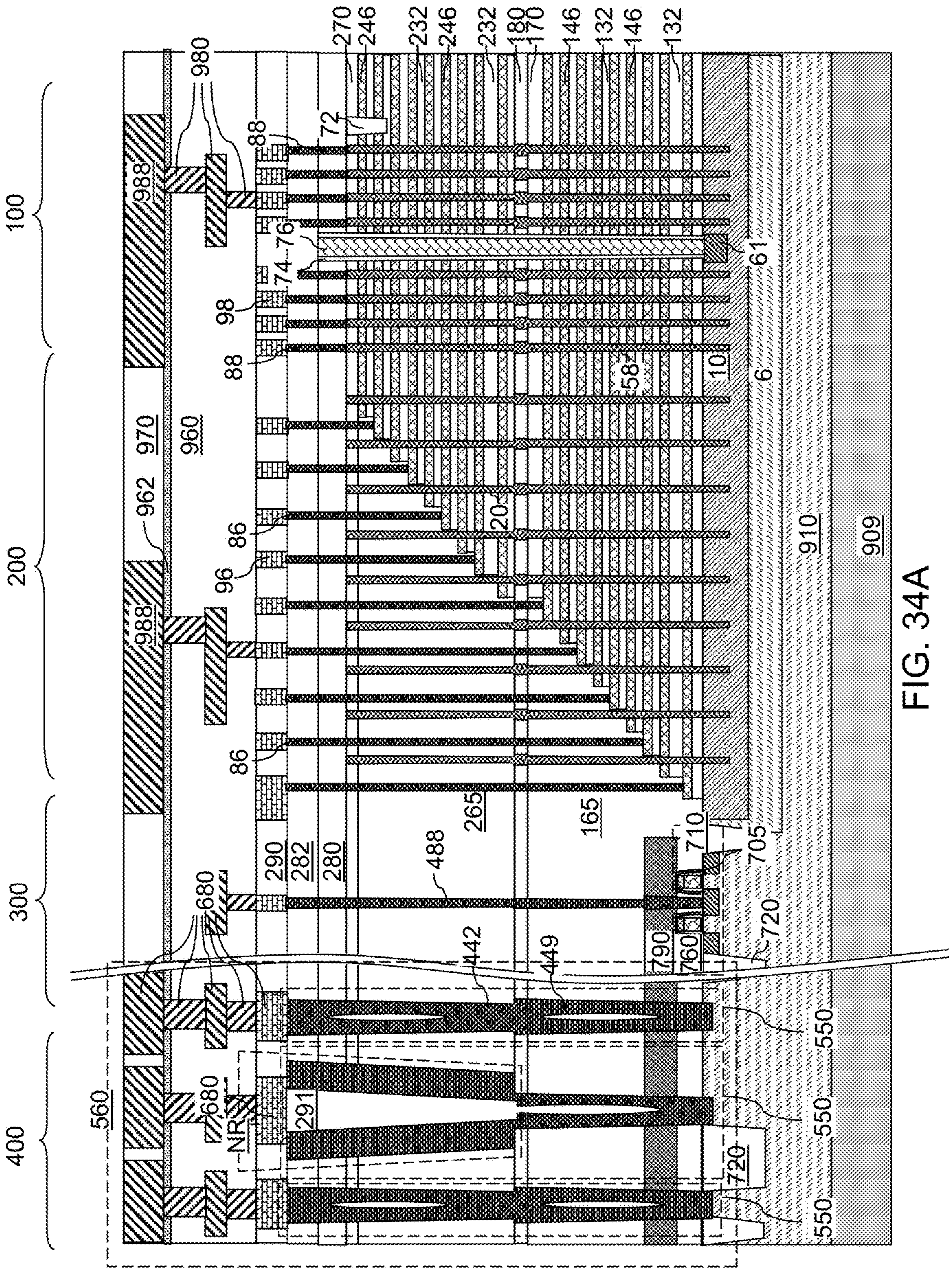
FIG. 34A is a vertical cross-sectional view of a region of the seventh configuration of the exemplary structure after formation of additional metal interconnect structures embedded in additional interconnect-level dielectric material layers according to the third embodiment of the present disclosure.
Figure 34B:
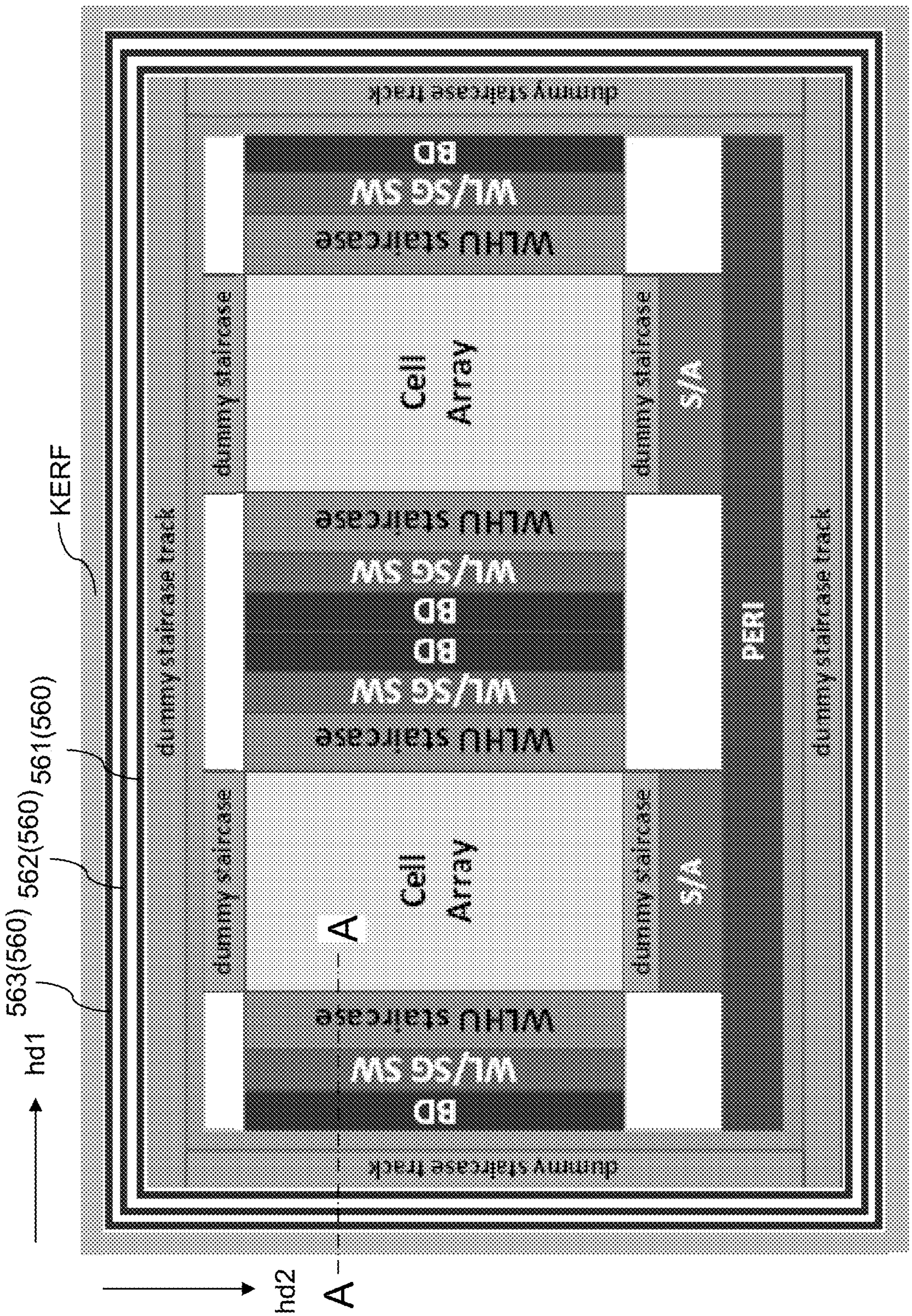
FIG. 34B is a top-down view of a unit die area of the exemplary structure of FIG. 34A.

Referring to FIGS. 34A and 34B, interconnect-level dielectric material layers 960 can be formed above the bit-line-level dielectric layer 290. Each of the interconnect-level dielectric material layers 960 can include an interconnect-level dielectric material such as undoped silicate glass, a doped silicate glass, or porous or nonporous organosilicate glass. A diffusion barrier dielectric material layer 962 can be optionally formed above the interconnect-level dielectric material layer 960. For example, the diffusion barrier dielectric material layer 962 can include a dielectric diffusion barrier material such as silicon nitride or silicon carbide nitride. A pad-level dielectric layer 970 can be formed over the diffusion barrier dielectric material layer 962. The pad-level dielectric layer 970 can include silicon oxide, and can have a thickness in a range from 500 nm to 5,000 nm, although lesser and greater thicknesses can also be employed.

The interconnect-level dielectric material layers 960 can embed metal interconnect structures 980 that are electrically connected to the bit-line-level metal interconnect structures (98, 96). The pad-level dielectric layer 970 can embed bonding pads 988, which can be metallic bonding pads that can be subsequently employed for C4 bonding, wire bonding, or metal-to-metal bonding. The interconnect-level dielectric material layers 960 and the pad-level dielectric layer 970 can embed metal barrier structures 680. Each of the metal barrier structures 680 can be a line-level structure or a via-level structure having an annular shape and contacting an underlying composite edge seal via structure 450 or contacting an underlying metal barrier structure 680.

Each contiguous set of an edge seal via structure 550 and metal barrier structure 680 constitutes an edge seal ring structure 560. Each of the at least one edge seal ring structure 560 continuously extends from a topmost surface of interconnect-level dielectric material layers 960 to a top surface of the semiconductor substrate 908, and may continuously extend from a top surface of the pad-level dielectric layer 970 to the top surface of the semiconductor substrate 908. Each of the at least one edge seal ring structure 560 comprises a respective composite edge seal via structure 550 and a respective set of metal barrier structures 680 that is adjoined to the respective composite edge seal via structure 560. Each edge seal ring structure 560 can laterally surround the entirety of the semiconductor devices of a respective semiconductor die as a continuous wall structure without any lateral opening between the horizontal plane including the top surface of the semiconductor substrate 908 and the topmost surface of the interconnect-level dielectric material layer 960. The edge seal ring structure 560 can comprise a plurality of edge seal ring structures 560. For example, the plurality of edge seal ring structures 560 may include an inner edge seal ring structure 561, an intermediate edge seal ring structure 562 that laterally surrounds the inner edge seal ring structure 561, and an outer edge seal ring structure 563 that laterally surrounds the intermediate edge seal ring structure 562. The plurality of edge seal ring structures 560 can include multiple nested edge seal ring structures in which each edge seal ring structure 560 laterally surrounds, or is laterally surrounded by, any other of the multiple nested edge seal ring structures 560.

Figure 35A:
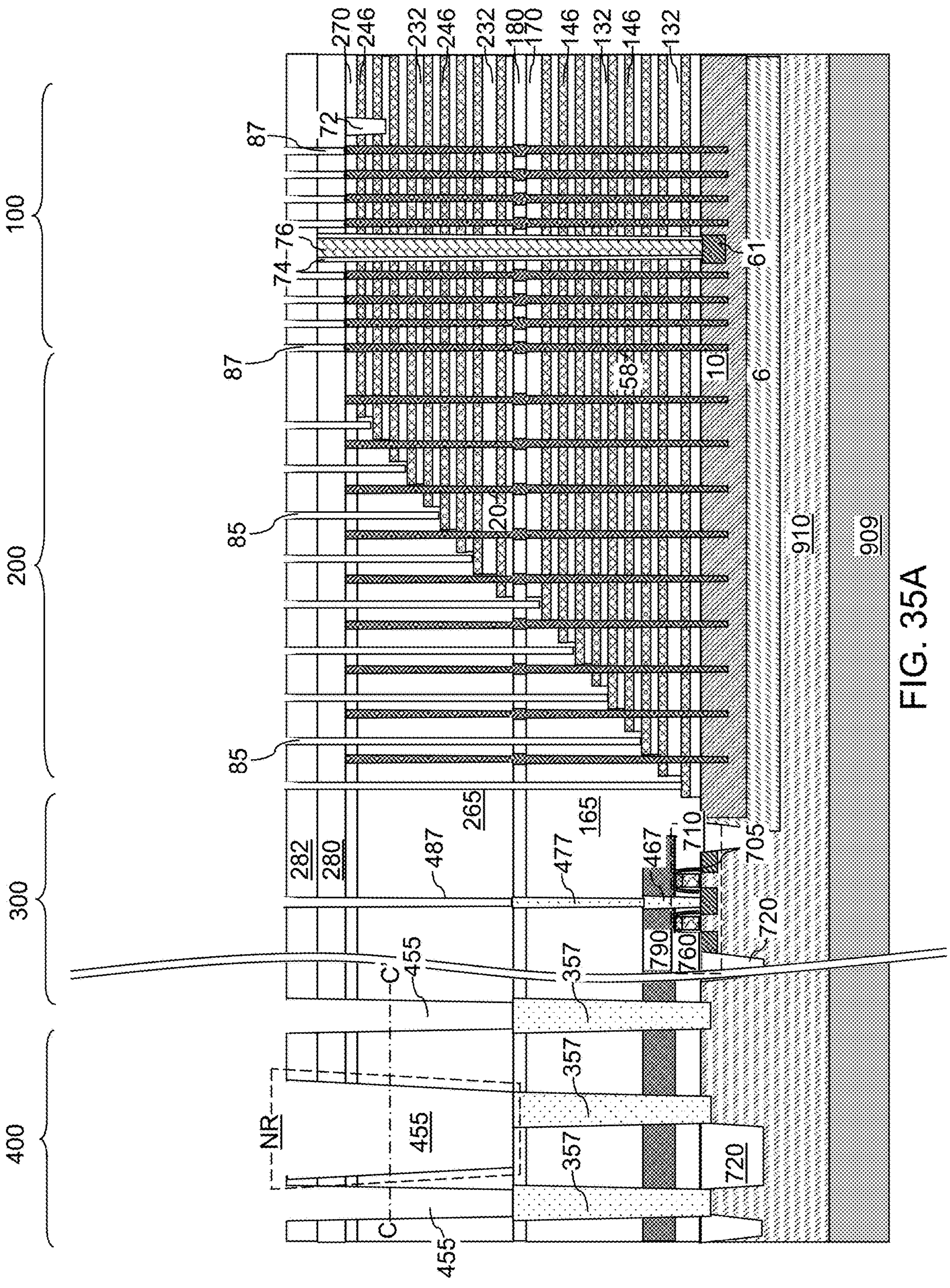
FIG. 35A is a vertical cross-sectional view of a region of an eighth configuration of a semiconductor die after formation of a second contact-level dielectric layer, contact via cavities, and second-tier via cavities according to the third embodiment of the present disclosure.
Figure 35B:
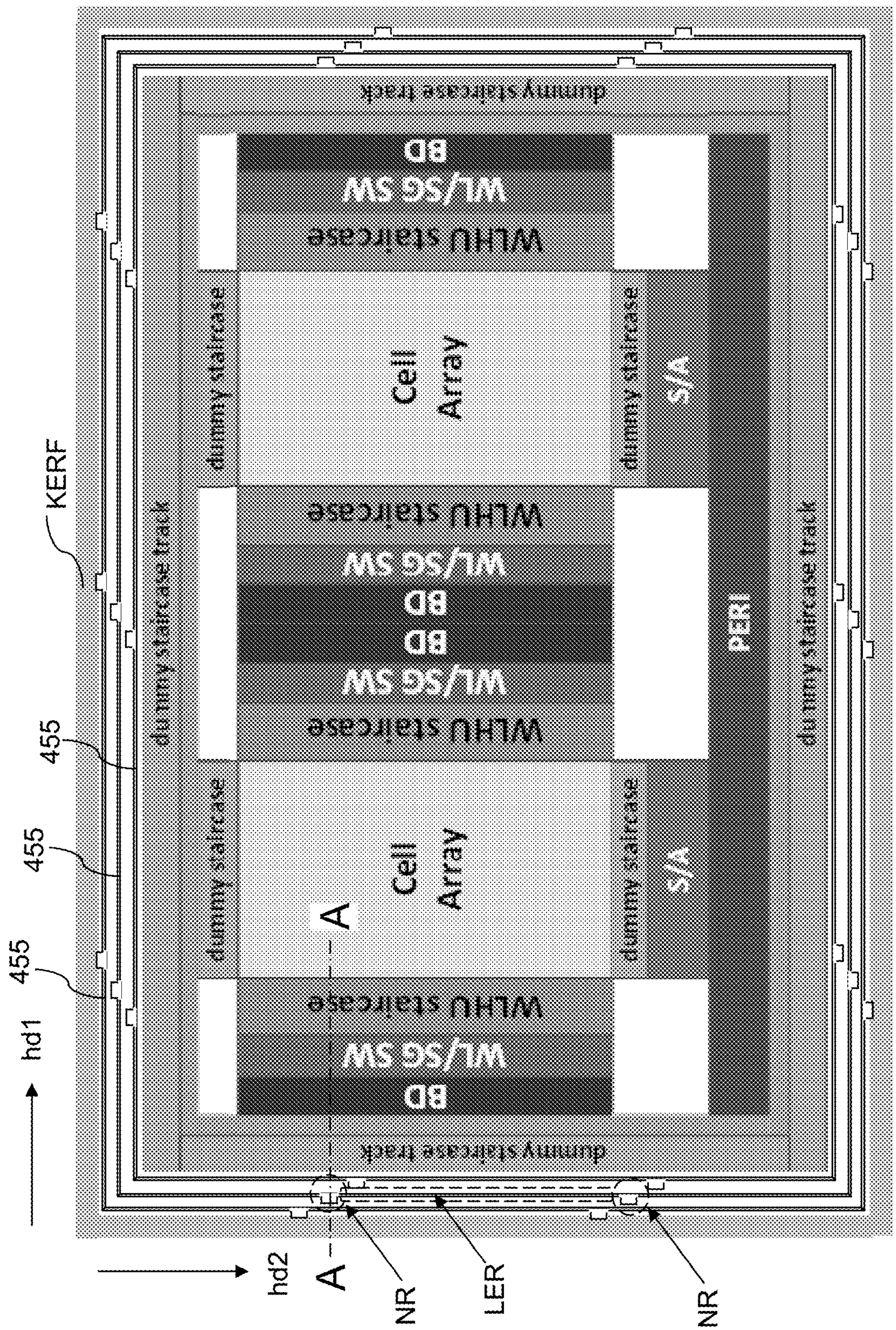
FIG. 35B is a top-down view of a unit die area of the eighth configuration of the exemplary structure of FIG. 35A. The vertical cross-sectional plane A-A' corresponds to the plane of the vertical cross-sectional view of FIG. 35A.
Figure 35C:
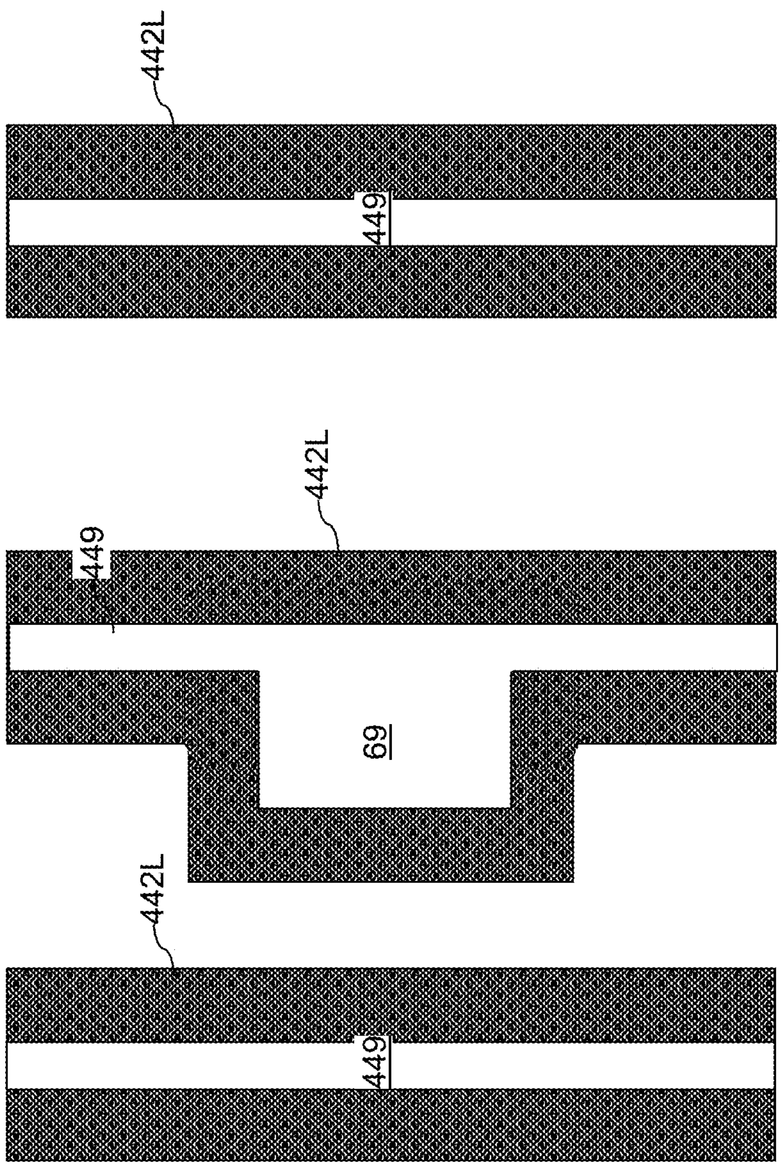
FIG. 35C is a horizontal cross-sectional view along the horizontal plane C-C' of FIG. 35A.

Referring to FIGS. 35A-35C, an eighth configuration of a semiconductor die according to the third embodiment of the present disclosure can be derived from the seventh configuration of the semiconductor die illustrated in FIGS. 30A and 30B by modifying the horizontal cross-sectional shapes of the second-tier edge seal trenches 455. Specifically, the notch regions NR of the second-tier edge seal trenches 455 can be modified such that each notch region NR laterally protrudes outward only in one direction (e.g., away from the center of the semiconductor die) from adjoined laterally-extending regions LER, and does not laterally protrude outward from the adjoined laterally-extending regions LER in the opposite direction (e.g., toward the center of the semiconductor die).

Figure 36:
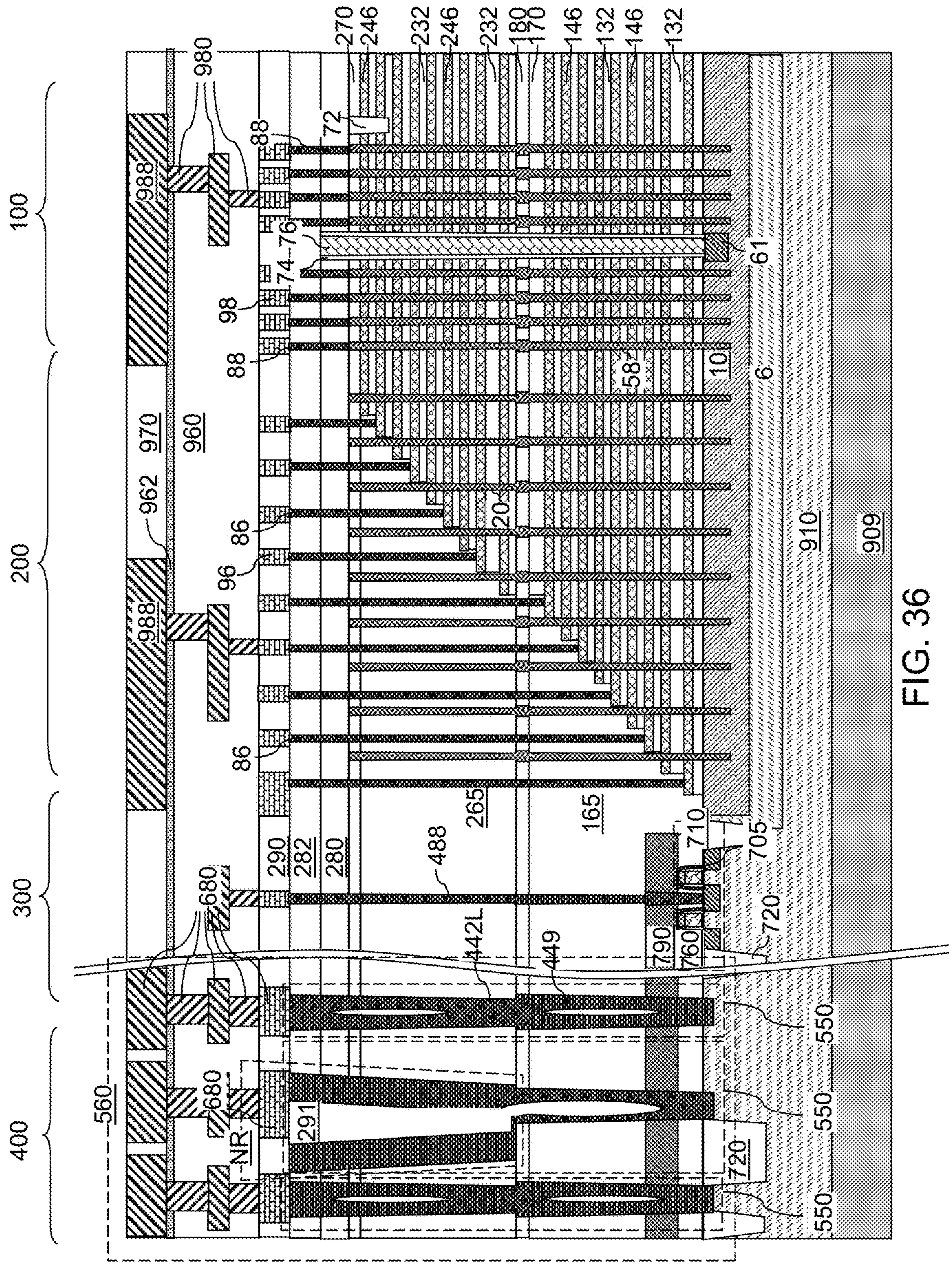
FIG. 36 is a vertical cross-sectional view of a region of the eighth configuration of the exemplary structure after formation of additional metal interconnect structures embedded in additional interconnect-level dielectric material layers according to the third embodiment of the present disclosure.

Referring to FIG. 36, the processing steps of FIGS. 31-34B can be performed to provide edge seal ring structures 560.

Figure 37A:
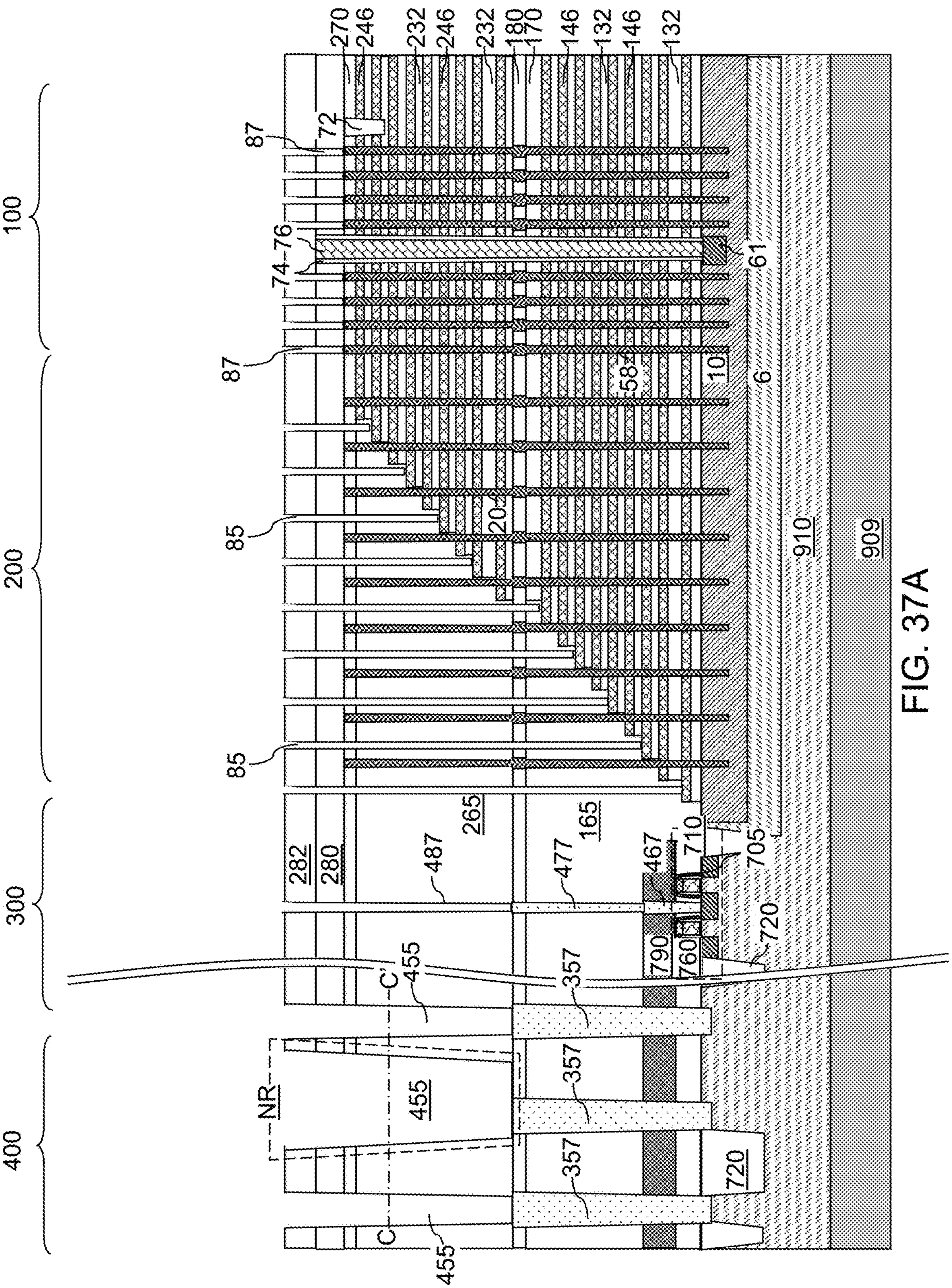
FIG. 37A is a vertical cross-sectional view of a region of a ninth configuration of a semiconductor die after formation of a second contact-level dielectric layer, contact via cavities, and second-tier via cavities according to the third embodiment of the present disclosure.
Figure 37B:
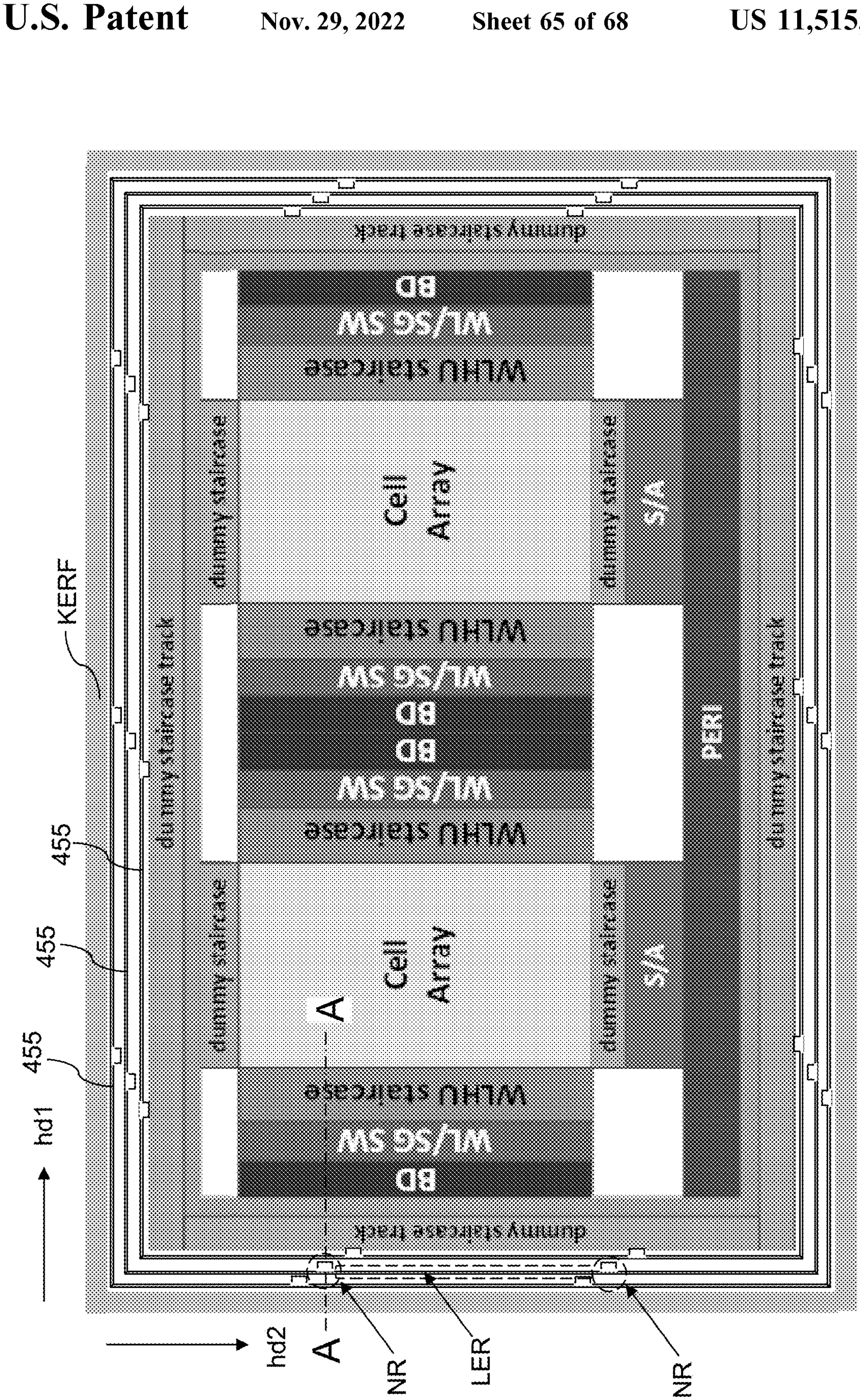
FIG. 37B is a top-down view of a unit die area of the ninth configuration of the exemplary structure of FIG. 37A. The vertical cross-sectional plane A-A' corresponds to the plane of the vertical cross-sectional view of FIG. 37A.
Figure 37C:
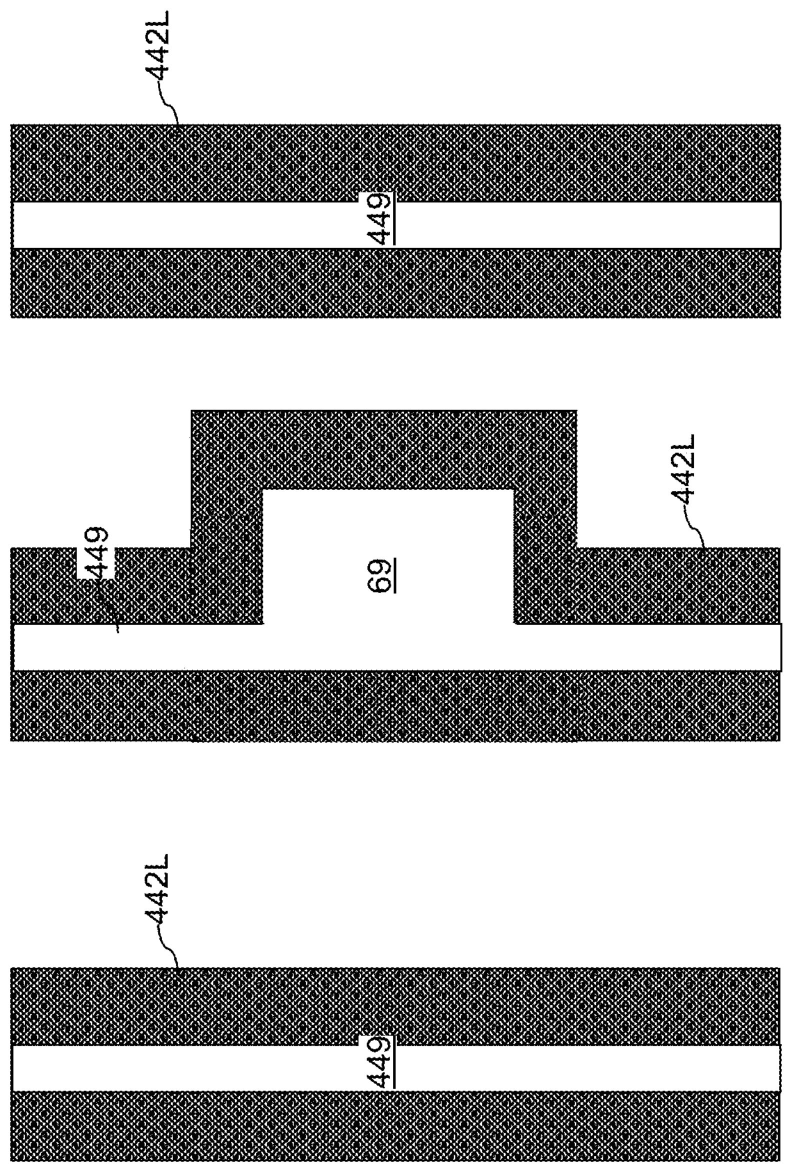
FIG. 37C is a horizontal cross-sectional view along the horizontal plane C-C' of FIG. 37A.

Referring to FIGS. 37A-37C, a ninth configuration of a semiconductor die according to the third embodiment of the present disclosure can be derived from the seventh configuration of the semiconductor die illustrated in FIGS. 30A and 30B by modifying the horizontal cross-sectional shapes of the second-tier edge seal trenches 455. Specifically, the notch regions NR of the second-tier edge seal trenches 455 can be modified such that each notch region NR laterally protrudes outward toward the center of the semiconductor die from adjoined laterally-extending regions LER, and does not laterally protrude outward way from the center of the semiconductor die from the adjoined laterally-extending regions LER.

Figure 38:
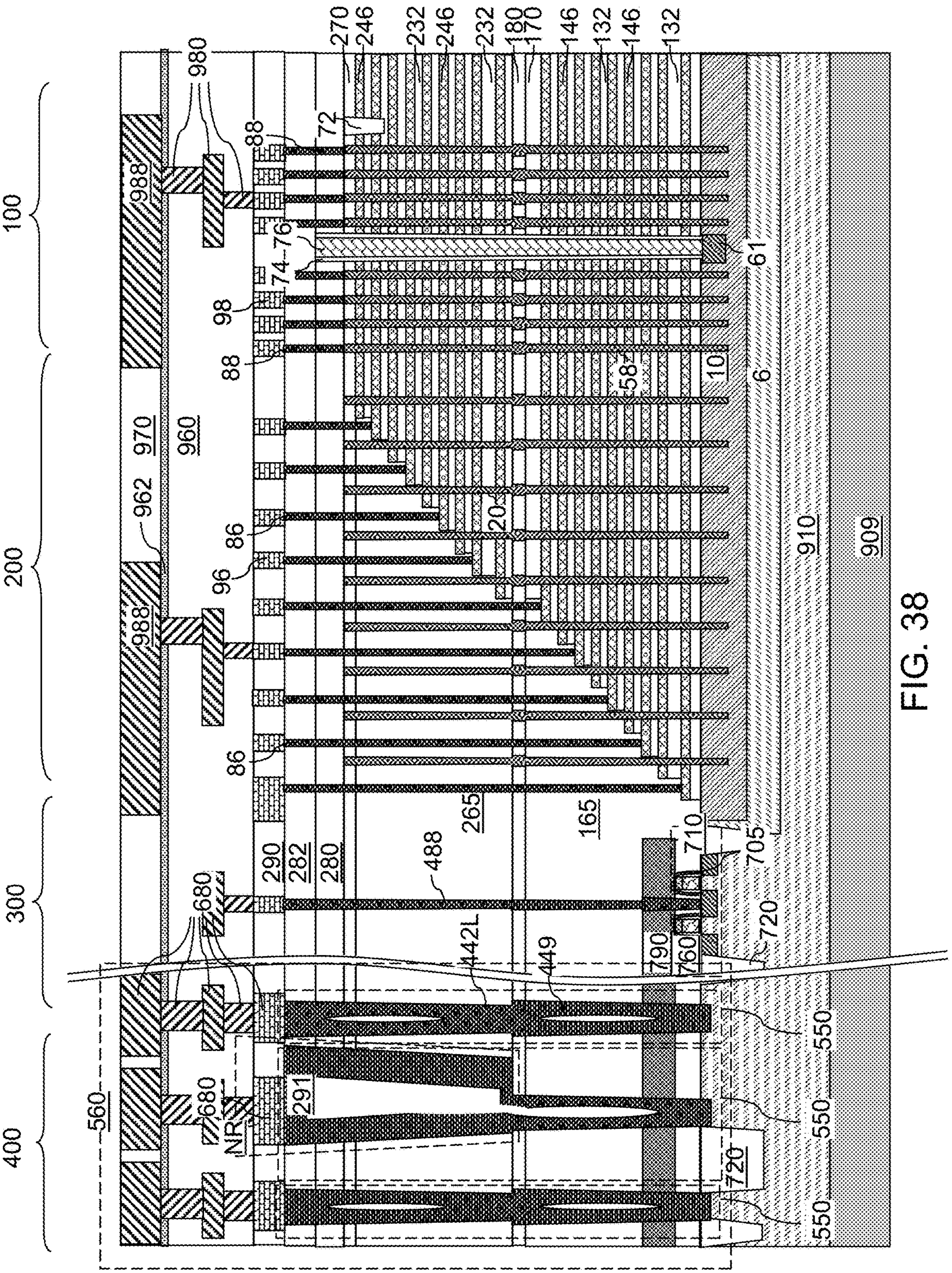
FIG. 38 is a vertical cross-sectional view of a region of the ninth configuration of the exemplary structure after formation of additional metal interconnect structures embedded in additional interconnect-level dielectric material layers according to the third embodiment of the present disclosure.

Referring to FIG. 38, the processing steps of FIGS. 31-34B can be performed to provide edge seal ring structures 560.

Figure 39:
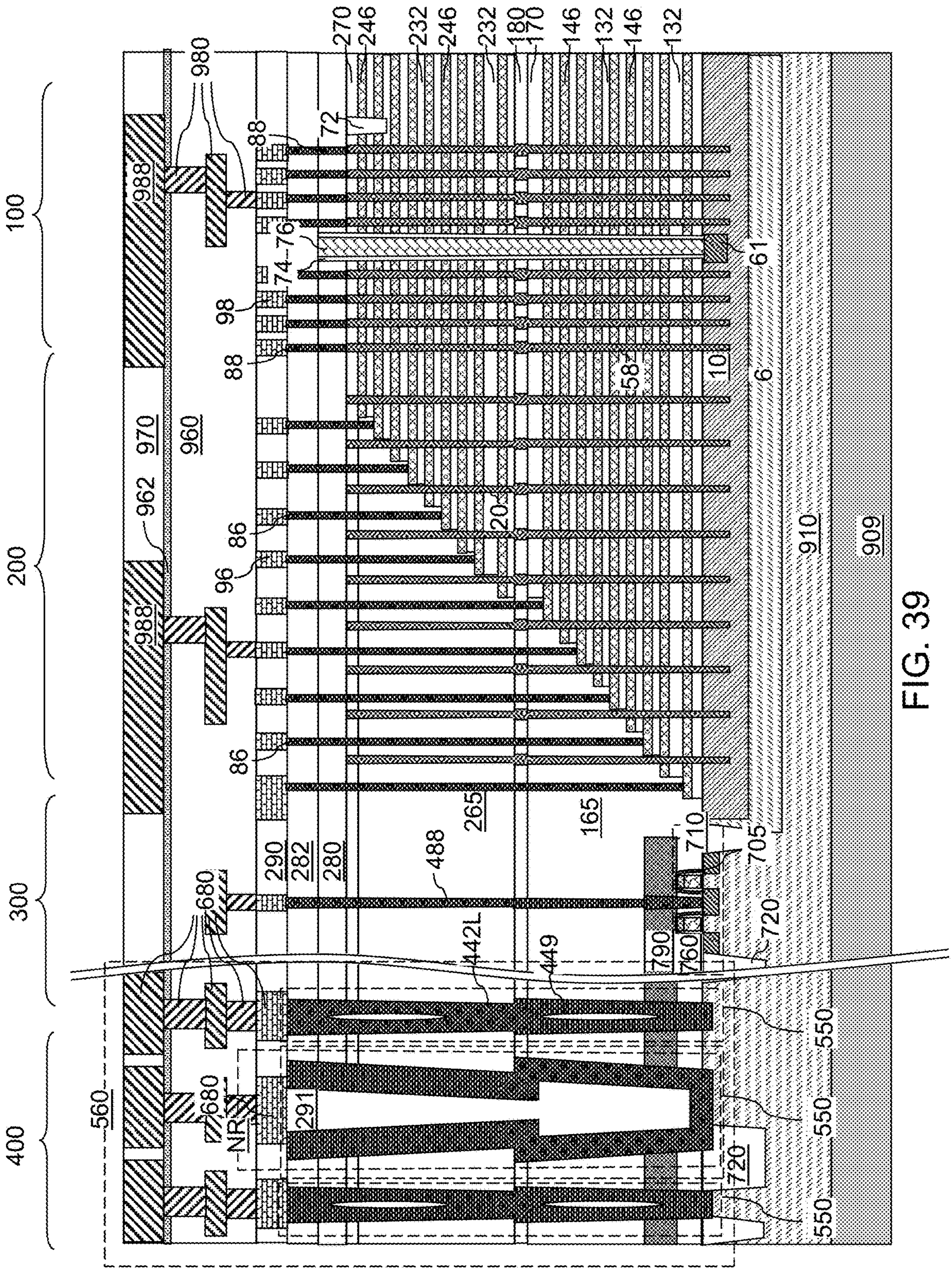
FIG. 39 is a vertical cross-sectional view of a region of a tenth configuration of the exemplary structure according to the third embodiment of the present disclosure.

Referring to FIG. 39, a tenth configuration of the exemplary structure according to the third embodiment of the present disclosure can be derived from the seventh configuration of the exemplary structure by modifying the shapes of the first-tier edge seal trenches 355 at the processing steps of FIGS. 4A-4D such that each first-tier edge seal trench 355 has the same, substantially the same, or similar horizontal cross-sectional profile as a respective second-tier edge seal trench 455 to be subsequently formed at the processing steps of FIGS. 15A and 15B.

In this case, each first-tier edge seal trench 355 can have a configuration of a moat trench including respective laterally-extending regions LER and respective notch regions NR. Each notch region NR can be a region in which the width of the moat trench is locally increased to provide an outward-lateral protrusion. Generally, the notch regions can laterally protrude outward from the laterally-extending regions of a respective edge seal ring structure in two directions (e.g., toward and away from the center of the semiconductor die) or in only one direction (e.g., toward or away from the center of the semiconductor die). The notch region NR reduces the likelihood that the void 449 would be pinched off (i.e., closed off) at the top of the first-tier edge seal trench 355. Thus, gas can escape upwards from void 449, as described above.

In the tenth configuration of the exemplary structure, the second-tier edge seal trench 455 may also have a notch region NR as described above. Alternatively, the second-tier edge seal trench 455 may lack the notch region if the second-tier edge seal trench 455 is sufficiently wide and the notch region NR is present only in the first-tier edge seal trench 355.

Subsequently, the processing steps of FIGS. 5A-14C can be performed. The processing steps of FIGS. 30A-34B can be subsequently performed to provide the structure illustrated in FIG. 39.

Referring to all drawings and according to various embodiments of the present disclosure, a semiconductor die is provided, which comprises: semiconductor devices (58, 132, 146, 232, 246) located over a substrate; at least one dielectric material portion (165, 265) that laterally surrounds the semiconductor devices; interconnect-level dielectric material layers 960 that overlie the semiconductor devices and the at least one dielectric material portion (165, 265) and embedding metal interconnect structures 980; and at least one edge seal ring structure 560 that laterally surrounds the semiconductor devices, the at least one dielectric material portion (165, 265), the interconnect-level dielectric material layers 960, and the metal interconnect structures 980 and comprising a respective metallic material layer 442. The metallic material layer 442 comprises an inner vertical sidewall segment that laterally surrounds and laterally encloses the semiconductor devices, and an outer vertical sidewall segment that laterally surrounds and laterally encloses a gap 69 located between the inner and the outer sidewall segments, wherein the gap 69 has an opening OP in its upper portion.

In one embodiment, the at least one edge seal ring structure 560 has a horizontal cross-sectional profile that comprises: laterally-extending regions LER that extend laterally with a uniform width between an inner sidewall and an outer sidewall; and notch regions NR connecting neighboring pairs of the laterally-extending regions LER and having a greater width than the uniform width.

In one embodiment, the at least one edge seal ring structure 560 comprises a metallic material layer that continuously extends laterally through each of the laterally-extending regions LER and the notch regions NR. In one embodiment, the metallic material layer laterally surrounds a void 449 which is connected to the gap 69 within each of the notch regions NR. In another embodiment, a dielectric via fill structure 291 is located in the gap 69.

In one embodiment, the semiconductor die comprises bonding pads 988 contacting a subset of the metal interconnect structures 980, wherein the at least one edge seal ring structure 560 vertically extends from a top surface of the substrate to a horizontal plane including bottom surface of the bonding pads 988.

In one embodiment, each of the notch regions NR comprises: a respective pair of protrusion sidewall segments PSS that adjoin a respective vertically-extending edge VEE of a pair of laterally-extending regions LER of the laterally-extending regions LER; and a respective offset sidewall segment OSS adjoined to edges of the respective pair of protrusion sidewall segments PSS and laterally offset from the pair of laterally-extending regions LER.

In one embodiment, the notch regions NR laterally protrude outward in two directions from the laterally-extending regions LER of the at least one edge seal ring structure 560. Additionally or alternatively, the notch regions NR laterally protrude outward in one direction from the laterally-extending regions LER of the at least one edge seal ring structure.

In one embodiment, the at least one dielectric material portion (165, 265) comprises a plurality of dielectric material portions (165, 265) that are stacked; and the metallic material layer 442 has a plurality of tapered sidewalls adjoined by at least one horizontal stepped surface and extending through different dielectric material portions (165, 265) of the plurality of dielectric material portions (165, 265).

In one embodiment, the semiconductor devices comprise: a first alternating stack of first insulating layers 132 and first electrically conductive layers 146 and laterally contacting a first one of the plurality of dielectric material portions (such as the first retro-stepped dielectric material portion 165); a second alternating stack of second insulating layers 232 and second electrically conductive layers 246 and laterally contacting a second one of the plurality of dielectric material portions (such as the second retro-stepped dielectric material portion 265); and memory stack structures 55 vertically extending through the first alternating stack (132, 146) and the second alternating stack (232, 246) and including a respective vertical semiconductor channel 60 and a memory film 50. In one embodiment, the plurality of dielectric material portions comprises: a first retro-stepped dielectric material portion 165 contacting first stepped surfaces of the first alternating stack (132, 146); and a second retro-stepped dielectric material portion 265 contacting second stepped surfaces of the second alternating stack (242, 246).

In one embodiment, a cavity (e.g., void 449) that is not filled with the continuous metallic material layer laterally extends through the laterally-extending regions LER and through the notch regions NR. The cavity continuously extends vertically through each of the notch regions NR and is connected through the gap 69 located within the notch regions NR to an opening OP in a top portion of the metallic material layer 442.

In one embodiment, the at least one edge seal ring structure 560 comprises multiple nested edge seal ring structures 560 in which each edge seal ring structure 560 laterally surrounds or is laterally surrounded by any other of the multiple nested edge seal ring structures 560.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor die, comprising:

semiconductor devices located over a substrate;

at least one dielectric material portion that laterally surrounds the semiconductor devices;

interconnect-level dielectric material layers that overlie the semiconductor devices and the at least one dielectric material portion and embedding metal interconnect structures; and at least one edge seal ring structure that laterally surrounds the semiconductor devices, the at least one dielectric material portion, the interconnect-level dielectric material layers, and the metal interconnect structures and comprises a respective metallic material layer, wherein the metallic material layer comprises an inner vertical sidewall segment that laterally surrounds and laterally encloses the semiconductor devices, and an outer vertical sidewall segment that laterally surrounds and laterally encloses a gap located between the inner and the outer sidewall segments, wherein the gap has an opening in its upper portion, wherein the at least one edge seal ring structure has a horizontal cross-sectional profile that comprises:

laterally-extending regions that extend laterally with a uniform width between an inner sidewall and an outer sidewall; and a notch region connecting a neighboring pair of the laterally-extending regions and having a greater width than the uniform width, and wherein the notch region laterally protrudes outward in one direction from the laterally-extending regions of the at least one edge seal ring structure.

2. A semiconductor die, comprising:

semiconductor devices located over a substrate;

at least one dielectric material portion that laterally surrounds the semiconductor devices;

interconnect-level dielectric material layers that overlie the semiconductor devices and the at least one dielectric material portion and embedding metal interconnect structures; and at least one edge seal ring structure that laterally surrounds the semiconductor devices, the at least one dielectric material portion, the interconnect-level dielectric material layers, and the metal interconnect structures and comprises a respective metallic material layer, wherein the metallic material layer comprises an inner vertical sidewall segment that laterally surrounds and laterally encloses the semiconductor devices, and an outer vertical sidewall segment that laterally surrounds and laterally encloses a gap located between the inner and the outer sidewall segments, wherein the gap has an opening in its upper portion, wherein the at least one edge seal ring structure has a horizontal cross-sectional profile that comprises:

laterally-extending regions that extend laterally with a uniform width between an inner sidewall and an outer sidewalk; and a notch region connecting a neighboring pair of the laterally-extending regions and having a greater width than the uniform width, and wherein:

the at least one dielectric material portion comprises a plurality of dielectric material portions that are stacked; and the metallic material layer has a plurality of tapered sidewalls adjoined by at least one horizontal stepped surface and extending through different dielectric material portions of the plurality of dielectric material portions.

3. The semiconductor die of claim 2, wherein the semiconductor devices comprise:

a first alternating stack of first insulating layers and first electrically conductive layers and laterally contacting a first one of the plurality of dielectric material portions;

a second alternating stack of second insulating layers and second electrically conductive layers and laterally contacting a second one of the plurality of dielectric material portions; and memory stack structures vertically extending through the first alternating stack and the second alternating stack and including a respective vertical semiconductor channel and a memory film.

4. The semiconductor die of claim 2, wherein the at least one edge seal ring structure comprises multiple nested edge seal ring structures in which each edge seal ring structure laterally surrounds or is laterally surrounded by any other of the multiple nested edge seal ring structures.

* * * * *